(12) United States Patent
Komatsu

(10) Patent No.: US 8,459,529 B2
(45) Date of Patent: Jun. 11, 2013

(54) PRODUCTION METHOD OF COMPOSITE SILVER NANOPARTICLE

(71) Applicant: Applied Nanoparticle Laboratory Corporation, Osaka (JP)

(72) Inventor: Teruo Komatsu, Osaka (JP)

(73) Assignee: Applied Nanoparticle Laboratory Corporation, Osaka (JP)

( * ) Notice: Subject to any disclaimer, the term of this patent is extended or adjusted under 35 U.S.C. 154(b) by 0 days.

(21) Appl. No.: 13/707,298

(22) Filed: Dec. 6, 2012

(65) Prior Publication Data

US 2013/0098205 A1 Apr. 25, 2013

Related U.S. Application Data

(62) Division of application No. 12/735,435, filed as application No. PCT/JP2008/073660 on Dec. 25, 2008, now Pat. No. 8,348,134.

(30) Foreign Application Priority Data

Jan. 17, 2008 (WO) .................. PCT/JP2008/050558
Mar. 18, 2008 (WO) .................. PCT/JP2008/054971
Jun. 30, 2008 (WO) .................. PCT/JP2008/061822
Jul. 4, 2008 (WO) .................. PCT/JP2008/062238

(51) Int. Cl.
 *B23K 35/14* (2006.01)
 *C22C 5/06* (2006.01)
(52) U.S. Cl.
 USPC .......... 228/56.3; 106/1.23; 420/501; 977/773
(58) Field of Classification Search
 None
 See application file for complete search history.

(56) References Cited

U.S. PATENT DOCUMENTS

| | | | |
|---|---|---|---|
| 5,957,828 A | 9/1999 | Hayashi | |
| 6,630,291 B1 * | 10/2003 | Maskasky et al. | 430/350 |
| 6,689,186 B1 | 2/2004 | Hampden-Smith et al. | |
| 6,713,241 B2 * | 3/2004 | Vaeth et al. | 430/350 |
| 6,730,400 B1 | 5/2004 | Komatsu et al. | |
| 6,878,184 B1 | 4/2005 | Rockenberger et al. | |
| 7,125,656 B2 * | 10/2006 | Ito | 430/449 |
| 7,135,055 B2 | 11/2006 | Mirkin et al. | |
| 7,524,351 B2 | 4/2009 | Hua et al. | |
| 2002/0018896 A1 | 2/2002 | Fukunaga et al. | |
| 2003/0124259 A1 * | 7/2003 | Kodas et al. | 427/376.6 |

(Continued)

FOREIGN PATENT DOCUMENTS

| | | |
|---|---|---|
| JP | 3205793 B | 9/2001 |
| JP | 2002-299833 A | 10/2002 |

(Continued)

*Primary Examiner* — Kiley Stoner
(74) *Attorney, Agent, or Firm* — DLA Piper LLP (US)

(57) ABSTRACT

A production method of composite silver nanoparticle including the steps of: arranging at least an alcohol solvent selected from alcohols with a carbon number of 1 to 12 composed of methanol, ethanol, propanol, buthanol, pentanol, hexanol, heptanol, octhanol, nonanol, decanol, undecanol and dodecanol; preparing an alcohol solution by mixing a silver salt into the alcohol solvent added more excessively than the mol number of the silver salt so as to become an excess alcohol solution; heating the excess alcohol solution in a reaction chamber at a generation temperature PT generating an aldehyde for a generation time; forming a silver core through reducing of the silver salt by the alcohol solvent and/or the aldehyde; and forming a composite silver nanoparticle having an organic coating layer originated from the alcohol solvent around the silver core.

7 Claims, 47 Drawing Sheets

U.S. PATENT DOCUMENTS

| | | |
|---|---|---|
| 2003/0161959 A1* | 8/2003 | Kodas et al. ............... 427/376.2 |
| 2004/0245648 A1 | 12/2004 | Nagasawa et al. |
| 2008/0008822 A1 | 1/2008 | Kowalski et al. |
| 2008/0050683 A1* | 2/2008 | Fushimi ........................ 430/619 |
| 2008/0152534 A1 | 6/2008 | Zhang et al. |
| 2009/0189264 A1 | 7/2009 | Yato et al. |
| 2009/0214764 A1 | 8/2009 | Li et al. |
| 2009/0242231 A1 | 10/2009 | Miyagisima et al. |
| 2010/0034693 A1 | 2/2010 | Li |
| 2010/0084599 A1 | 4/2010 | Lewis et al. |
| 2011/0114708 A1 | 5/2011 | Maeda et al. |
| 2011/0204125 A1 | 8/2011 | Yasuda et al. |

FOREIGN PATENT DOCUMENTS

| | | |
|---|---|---|
| JP | 2003-342605 A | 12/2003 |
| JP | 2004-107728 A | 4/2004 |
| JP | 2005-157190 A * | 6/2005 |
| JP | 2005-165006 * | 6/2005 |
| JP | 2007-95510 A | 4/2007 |
| JP | 2007-191789 A | 8/2007 |
| JP | 2007-254841 A | 10/2007 |
| WO | WO 00/76699 A | 12/2000 |
| WO | WO 01/70435 A | 9/2001 |
| WO | WO 2005/075132 A | 8/2005 |

* cited by examiner

FIG. 1

Chemical reaction in formation of composite silver nanoparticles at low temperature Raw materials: Silver compound : Silver salt (1)
Alcohol : $C_nH_{2n+1}OH$ $(1 \leq n \leq 12)$
$= R_nOH$ (2)
$R_n = C_nH_{2n+1}$ (3)

[1] First step :

Adsorption of alcohol on the surface of silver salt microparticles
(Many silver salts have alcohol indissolubility)
Alcohol molecule $R_nOH$ acts as surface active agent.
$R_n$ : Hydrophobic group     OH : Hydrophilic group
The hydrophilic group is adsorbed to the hydrophilic surface of silver salt microparticle and the hydrophobic group is directed to alcohol side.

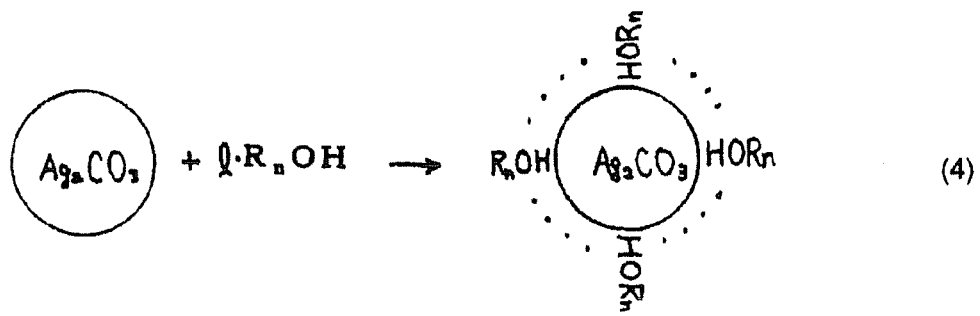

Chemical reaction in formation of composite silver nanoparticles at low temperature.

[2] Second step :
  Thermal decomposition reducing reaction on the surface of silver salt microparticles in alcohol.
  (In the case that silver salt microparticle is silver carbonate)

<Thermal decomposition process>

$$Ag_2CO_3 + R_nOH \rightarrow 2Ag + R_{n-1}CHO + CO_2 + H_2O \tag{5}$$

$$Ag_2CO_3 + 2R_nOH \rightarrow 2AgOR_n + CO_2 + H_2O \tag{6}$$

<Reducing process by aldehyde>

$$Ag_2CO_3 + R_{n-1}CHO \rightarrow 2Ag + R_{n-1}COOH + CO_2 \tag{7}$$

<Collision aggregation process (Formation of composite silver nanoparticle)>

$$kAg + mAgOR_n \rightarrow Ag_{k+m}(OR_n)_m \tag{8}$$

$$kAg + mAgOR_n + R_{n-1}COOH \rightarrow Ag_{k+m}(OR_n)_m R_{n-1}COOH \tag{9}$$

(10)

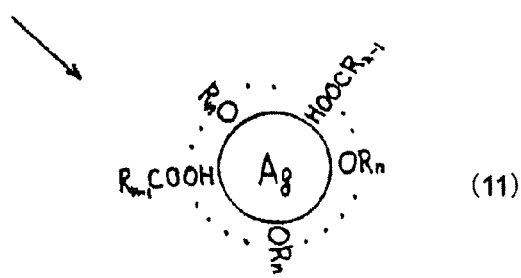

(11)

Mass of Each Material in Low Temperature Generation of C6AgAL(%)

Thermal Analysis of C2AgAL at Generation Temperature PT=65°C

Thermal Analysis of C1AgAL at Generation Temperature PT=80°C

Range of TG Decrease Start Temperature T1 of Composite Silver Nanoparticle $T2-60 \leq T1 \leq T2$ Relation between Characteristic Temperature and C-number of Composite Silver Nanoparticle
Temperature Up Rate 1°C/min Relation 2 between Characteristic Temperature and C-number of Composite Silver Nanoparticle

FIG. 52

Magnitude Relation of Characteristic Temperature of Power and Paste

Powder : C1AgAL ~ C12AgAL

Paste : PC1AgAL ~ PC12AgAL $1 \leqq VT(°C/min) \leqq 20$ $T_1(VT) \leqq Tp_1(VT) \leqq T_1(VT) + 100$ (P1)

$T_2(VT) \leqq Tp_2(VT) \leqq T_2(VT) + 70$ (P2)

$T_3(VT) \leqq Tp_3(VT) \leqq T_3(VT) + 50$ (P3)

PRODUCTION METHOD OF COMPOSITE SILVER NANOPARTICLE

CROSS-REFERENCE TO RELATED APPLICATIONS

This application is a divisional of application Ser. No. 12/735,435, now U.S. Pat. No. 8,348,134.

FIELD OF THE INVENTION

The present invention relates to a composite silver nanoparticle consisting of a silver core made up of aggregated silver atoms and an organic coating layer formed around said silver core, and particularly to a composite silver nanoparticle metalizing, namely silverizing by gasification of said organic coating layer through heating at a predetermined temperature, a composite silver nanopaste, their production methods, a production apparatus, a bonding method and a patterning method.

BACKGROUND ART

Generally, in the semiconductor, electronic circuit and electronic instrument, various electronic components are fixed on a substrate with fusion of solder, and the electronic continuity is secured. However, the conventional solder is an alloy of Sn and Pb, and the applications of Pb are being prohibited as a recent environment safeguard measure, so that Pb-free solder is being developed instead of said conventional solder. The melting point of eutectic solder of Sn and Pb is 183° C. and the melting point of Sn.Ag.Cu solder being conventional substitute solder is 217° C. In a case that the soldering is done to a resin substrate, resinous heat resistance is low, and since the melting point of conventional substitute solder is too high, the resin substrate is often damaged, so that solder for low-temperature was requested. Considering from the melting point of said conventional substitute solder, the substitute solder which can connect in a region equal to or less than 200° C. is desired.

As the characteristics of substitute solder, it is natural that Pb is not contained and the metalization temperature is low, and besides it is required that safety is high, there is no corrosion property, and the electrical conductivity and the heat conductivity are good. This situation is requested. Silver attracts attention as a material meeting this expectation. Besides, in order to decrease the melting point, the composite silver nanoparticle being ultrafine particle has been developed.

The patent bulletin of JP3205793 (Japanese Patent Laid-Open No. H10-183207) is published as patent document 1. A silver organic compound (a silver organic complex in particular) is chosen as a starting material. Under the inert gas ambient atmosphere that intercepted air, said silver organic compound is heated in a temperature range higher than the decomposition start temperature and less than the completeness decomposition temperature, so that there is produced composite silver nanoparticles which has a coating layer composed of organic material originated from said silver organic compound around a silver core formed by decomposition reduction. This production method is a solid-gas reaction. The particle diameter of said silver core is 1-100 nm, and therefore it is referred to composite silver nanoparticle as a popular name. For concreteness, when solid stearin acid silver 100 g is heated at 250□ for four hours in a flask under nitrogen flow, it is generated composite silver nanoparticles having the organic coating layer of stearin acid group around the silver core of particle diameter of 5 nm.

As a solid material of stearin acid silver is heated without a solvent in said production method, the generated composite silver nanoparticles are hard to disperse, and there is the defect that many composite silver nanoparticles become the big second particles because of their coupling in a dumpling state. Besides, it is found that the generation temperature is high with 250° C. and the metalization temperature of composite silver nanoparticles is extremely high with 220° C. The silver nanoparticles whose generation temperature is high comes to have the high silverizing temperature. Considering that the melting point of general Sn—Pb solder is 183° C. and the desired connection temperature is equal to or less than 200° C., the metalization temperature (silverizing temperature) is too high at 220° C., and it was difficult to employ as the substitute solder for low temperature. It can be thought that the reason why the metalization temperature is high is the huge particles with a dumpling state and the high decomposition temperature of stearin acid group. Besides, it is ensured from the inventor that the silver core is a simple atom ensemble or a polycrystal rather than a single crystal. In a case that said silver core is polycrystal or disorder ensemble, the electron scattering and thermal scattering occur on many grain boundary surfaces, and as a result, the electric conductivity and thermal conductivity are falling.

Next, Japanese Patent Laid-Open No. 2003-342605 bulletin is shown as patent document 2. Said patent document 2 is the invention that the present inventor also participated as one of the inventors. By dissolving or dispersing the metal organic compound in the organic solvent or water, it was successful to produce the composite silver nanoparticles coated by the organic material originated from the metal organic compound. This production method is a solid-liquid reaction. Besides, when these composite silver nanoparticles are observed in high resolution transmission electron microscope, the lattice image is confirmed in the silver core, so that it is found that the silver core is single crystal. This situation is confirmed. Based on the solid-liquid reaction method, it can be considered that the metal organic compound dissolves within the solvent as molecules, silver atoms are precipitated by reducing of said molecules and a single crystal appears by recombination between silver atoms. That is to say, it is thought that the single crystalline originates from intermolecular reaction. Because the silver core is a single crystal, there is an advantage that the electric conductivity and thermal conductivity are high. However, about the silverization temperature, it is written in [0076] that the composite silver nanoparticles of stearin acid group coating was heated at 250° C. for 10 minutes. In other words, it is considerably high temperature that the silverization temperature becomes 250° C.

This situation is a weak point of patent document 2. The reason why the silverization temperature is high is that the decomposition temperature of the organic acid group composing the coating layer is high because the reaction starts from the silver organic compound such as acetic acid silver, hexanoic acid silver and octane acid silver. It is necessary to improve the metalization temperature less than 200° C.

In there, WO00/076699 bulletin is shown as patent document 3. The present inventor is one of the inventors of this international publication bulletin. Plural inventions are disclosed in this publication bulletin, and especially in that, a production method treating a metal inorganic compound by means of surface active agent is shown for the first time, so that the way using a metal inorganic compound as the starting material was opened. That is to say, the above production method comprises the first step of forming the ultrafine particle precursor by colloidizing the metal inorganic compound in nonaqueous solvent by using of the surface active agent, and the second step of generating the composite metal nanoparticles having the surface active agent shell as the coating layer around the metal core by adding the reduction agent into said colloid solution and reducing said ultrafine particle precursor.

Because said method makes the nonaqueous solvent dissolve the metal inorganic compound, the generated composite metal nanoparticles have a feature hard to become the dumpling state since they disperse in the nonaqueous solvent. However, examples are composed of oleic acid copper, abietic acid silver, acetic acid silver, oleic acid nickel, diethyl hexane indium, copper acetate and stearin acid silver, and only organic metal compound is carried out. Besides, it was found that the metalization temperature of composite silver nanoparticles generated by stearin acid silver is high with 220° C. The further improvement making the metalization temperature less than 200° C. is necessary. In order to pursue the higher characteristic than Sn—Pb solder, more effort to make the metalization temperature less than 150° C. is required. Besides, since the judgement of single crystalline of polycrystalline of silver core is not done in the patent document 3, it is impossible to judge the good or bad of the electrical conductivity and thermal conductivity of composite metal nanoparticles.

Under the above-mentioned situation, WO01/070435 bulletin is shown as patent document 4. In this international publication bulletin, it is disclosed the composite metal nanoparticle obtained from metal salt comprising the metal core with particle diameter of 1 to 100 nm and the coating layer composed of organic compound including alcohol-related hydroxyl group larger than the carbon number 4 formed around said core. Moreover, the higher alcohol larger than the carbon number 6 is described as the organic compound including a functional group having the adsorption characteristic.

Furthermore, WO2005/075132 bulletin is shown as patent document 5. In this bulletin, it is disclosed the composite metal nanoparticle comprising the metal core at the center portion and the coating layer composed of organic material with the thermodesorption start temperature of the range of 140° C. to 190° C. around said core. As a production method, it is described the manufacturing of composite metal nanoparticle comprising the steps of coexisting the inorganic metal salt with the organic substance, forming the metal core by decomposition of the inorganic metal salt and forming the coating layer of organic material around it. In addition, it is also disclosed the composite metal nanoparticle formed the coating layer of organic material around the inorganic metal salt or the decomposed inorganic metal compound.

Japanese Patent Laid-Open No. 2007-95510 bulletin is shown as patent document 6. In claim 1 of patent document 6, it is also disclosed the electroconductivity paste comprising the organic solvent and the composite metal nanoparticles, which are composed of the metal cores formed by the metal component originated from the metal salt expressed with the chemical formula of (R-A)n-M and the organic coating layers originated from said metal salt. The R is hydrocarbon group with the carbon number of 4 to 9, A is COO, OSO3, SO3 or OPO3, and M is silver, gold or platinum. Therefore, the composite silver nanoparticles are included.

Japanese Patent Laid-Open No. 2004-107728 bulletin is disclosed as patent document 7. In claim 1 of patent document 7, it is described the composite metal nanoparticle having the organic coating layer composed of C, H and/or O as main component around the metal core with average particle diameter less than, and this organic coating layer is generated from the organic acid metal salt. This situation is described.

[Patent Document 1] U.S. Pat. No. 3,205,793 (Japanese Patent Laid-Open No. H10-183207)
[Patent Document 2] Japanese Patent Laid-Open No. 2003-342605
[Patent Document 3] WO00/076699
[Patent Document 4] WO01/070435
[Patent Document 5] WO2005/075132
[Patent Document 6] Japanese Patent Laid-Open No. 2007-95510
[Patent Document 7] Japanese Patent Laid-Open No. 2004-107728

DISCLOSURE OF THE INVENTION

Problems to be Solved by the Invention

In patent document 4, as for the composite silver nanoparticles with the particle diameter of 5 to 10 nm, it is described that the silver film formation temperature becomes 80° C. when the decomposition temperature of organic compound is less than 80□, and it is also described that the silver film can be formed by heating to the decomposition temperature when the decomposition temperature is greater than 80° C. However, above-mentioned contents are simple wishful thinkings, and such an example is not mentioned in examples at all. In the following, it will try to be spoken concretely.

In example 1, it is described that the color of solution changes from the neighborhood of 185° C. and the composite silver nanoparticles are generated when formic acid copper and 1-decanol are reacted, and the silverization firing temperature is 200-350° C., but 250-300° C. is preferable. In example 2, it is described that the composite silver nanoparticles can be generated from carbonic acid silver and myristic acid (C number of 14) by judgement of solution discoloration at 230° C., and the silver coating film is formed at 250° C. in firing under air. In example 3, it is described that the generation of composite silver nanoparticles is confirmed from carbonic acid silver and stearyl alcohol (C number of 18) by solution discoloration after heating at 230° C. for 1 hour, and the silverization temperature under nitrogen atmosphere is 250° C.

In example 4, it is described that the generation of composite silver nanoparticles is confirmed from carbonic acid silver and phenol (C number of 6) by solution discoloration after heating at 180□ for 1 hour, and the silverization temperature is 300° C. In example 5, it is described that the generation of composite silver nanoparticles is confirmed from copper acetate and lauryl alcohol (C number of 12) by solution discoloration after heating at 100° C. for 1 hour, and the silverization temperature under hydrogenation nitrogen atmosphere is 250° C.

Furthermore, in example 6, it is described that the generation of composite platinum nanoparticles is confirmed from chlorination platinum and ethylene glycol (C number of 2) by solution discoloration after heating at 180° C. for 1 hour, and the heat treatment temperature is 300° C. In example 7, it is described that the generation of composite copper nanoparticles is confirmed from copper acetate and lauryl alcohol (C number of 12) by solution discoloration after heating at 110° C., and the copperization temperature under nitrogen atmosphere is 300° C. At last, in example 8, it is described that the generation of composite copper nanoparticles is confirmed from copper acetate, ethanol (C number of 2) and nonion detergent (sorbitan tristearate) by solution discoloration after heating at 150° C., and the copperization temperature under nitrogen atmosphere is 300° C.

As described above, in eight examples of patent document 3, it is only mentioned that the silver core having the organic coating layer larger than C number of 14 is described, and besides, the silverization temperature (metalization temperature) is the high temperature greater than 200° C. Since the carbon number is equal to or greater than 14, the molecular weight becomes large and the weight of organic coating layer increase relatively for the silver core weight, so that the amount of exhaust gas in firing increases by the increment of organic amount and the characteristics of paste get low. Besides, also in any one of composite silver nanoparticles, the metalization temperature considerably exceeds 200° C., then the composite metal nanoparticles realizing the desirable metalization temperature less than 200° C. is not generated. Therefore, they are impropriety cases as the substitute solder. This situation is clear. That is to say, the object of the present invention is to form the organic coating layer originated from alcohol, in other words, to form the organic coating layer composed of one or more members selected from an alcohol molecule derivative, an alcohol molecule residue and an alcohol molecule with a carbon number of 1 to 12 so that the metalization less than 200° C., more preferably 150° C. is reached, but said examples are so far conditions from said object. This situation is clear. Moreover, as for the metal core of silver and copper, it is not described which of single crystal core or polycrystal core it is and it is the fact that even a suggestion is not shown. Therefore, it is impossible to judge as for the good or bad of the electrical conductivity and the thermal conductivity.

The matter of comprehension inability is mentioned in patent document 5. It is described that the coating layer of organic material is formed around the center core including the inorganic metal salt or the decomposed inorganic metal compound when the inorganic metal salt coexists with the organic material. For example, it is mentioned in 6th page that the composite silver nanoparticles in which the organic material is physically adsorbed to silver or carbonic acid silver are generated when the mixture of carbonic acid silver and myristil alcohol (organic material with C number of 14) react at 120° C. for two hours. When the organic matter bonds around the carbonic acid silver, what the thermal decomposition temperature making silver precipitate from carbonic acid silver exceeds 400° C. is clear from the following reaction formula.

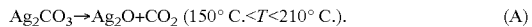

$$Ag_2CO_3 \rightarrow Ag_2O + CO_2 \ (150°\ C. < T < 210°\ C.). \quad (A)$$

$$Ag_2O \rightarrow 2Ag + \tfrac{1}{2}O_2 \ (T > 400°\ C.). \quad (B)$$

At first, though the reaction of formula (A) occurs, the decomposition temperature of formula (B) is larger than 400° C., so that the metalization less than 200° C. cannot be achieved, and it is impropriety as the substitute article of Sn—Pb solder whose melting point is 183° C. Besides, crystallinity of silver core is not described at all, and it is impossible to judge the good or bad of the electrical conductivity and thermal conductivity.

Furthermore, in claim 7 amended by the amendment, when heating the carbonic acid silver and myristil alcohol in coexistence state at the temperature T (° C.) of 70° C. to 140° C., the composite silver nanoparticles obtained by heating for the time t(h) for which the following formula (C) holds.

$$7.85 \leq (T+273)(20+\log t) \times 10^{-3} \leq 7.98 \quad (C)$$

When T=70° C. is substituted to formula (C) and the holding time t(h) is calculated, 794 h≦t≦1995 h is obtained, then the generation time at 70° C. is 794 hours to 1995 hours, and since it is 33 days to 83 days in day unit, the generation time becomes month unit. This is wrong clearly. When T=100° C. is substituted, the generation time becomes half day to one day because of 11.22 h≦t≦24.54 h. The result shows completely reverse situation for the present invention. When T=140° C. is substituted, 0.1 h≦t≦0.2 h holds, and in other words because of t=6 min to 12 min, the region valid for nanosilver generation appears, but even if it becomes proper in a limit region of (C) formula, it is clear that it is not the formula of guiding principle. Besides, when it is T=200° C., the reaction time becomes dozen seconds to several seconds, and this is different from the results of the present inventor, too. In the reaction time of dozen seconds to several seconds, it is impossible to control the chemical reaction generating the composite silver nanoparticles. Of course, because said (C) formula has the restriction of less than 140° C., what it cannot be applied to 200° C. is natural. According to the invention of the present inventors described below, when the reaction temperature is the range of 50° C. to 200° C., the reaction time is less than 1 hour, and the higher the temperature, the rapidly shorter the reaction time, and then it is necessary to set several minutes at 200° C. The reason is that the composite nanoparticles cohere rapidly when the reaction time becomes long, besides the metalization occurs simultaneously. The contents of patent document 5 completely show the reverse things for the present invention, so it cannot be adopted even in reference. In addition, since myristyl alcohol with C number of 14 has the large molecular weight, the weight of the organic coating layer compared with the silver core increases and the firing temperature becomes higher, at the same time, a large quantity of voids occur at the connection time because the amount of exhaust gas increases at the firing time, so that it has a defect that the adaptability as the paste for connection falls.

The composite metal nanoparticle of patent document 6 is formed from the metal core and the organic coating layer as the decomposition product obtained by the decomposition of metal salt, and it is different from the present invention in a point starting from the organic metal compound. The present invention forms the silver core from carbonic acid silver and forms the organic coating layer from alcohol, so the production method is different at all. Furthermore, the organic coating layer is a bond group of a hydrocarbon group with COO, $OSO_3$, $SO_3$ or $OPO_3$, so that the structure is complicated and the decomposition temperature is high. In particular, because sulfur S is included, $SO_X$ being an air pollution component is generated by firing and it is not fitted for the environmental criteria. As described in [0018], even if the metalization temperature can achieve around 150° C., it is the composite metal nanoparticle that it is impossible to carry out. In addition, S and P being impropriety in semiconductor bonding are contained, and since there is a danger that S and P spread to the semiconductor at the time of semiconductor bonding, it has a weak point that they cannot be employed in semiconductor bonding. Besides, the crystallinity of metal core can not be described and suggested at all, so it is impossible to judge the good and bad of the electrical conductivity and the thermal conductivity.

Because in the composite metal nanoparticle of patent document 7, the organic coating layer is formed by decomposing of the organic acid metal salt, the organic coating layer is organic acid group and the gasification temperature becomes considerably high. The melting point is 210° C. This situation is described in [0031], and it is mentioned in [0068] that it is fired in the temperature range of 210 to 250° C. Therefore, the metalization less than 200° C. or preferably 150° C. can not be realized by patent document 7 at all. Moreover, the crystallinity of metal core cannot be described and suggested at all, so it is impossible to judge the good and bad of the electrical conductivity and the thermal conductivity.

The present invention is done in the view point of above problems, and the present invention establishes the method and the production apparatus to generate the composite silver nanoparticle having the organic coating layer originated from alcohol with the carbon number of 1 to 12 at low temperature, so that it provides the composite silver nanoparticle having the organic coating layer originated from alcohol, in which the weight of silver core considerably increases than the conventional one because of smallness of C number and the metalization temperature (silverization temperature) less than 200° C. is realized. Said organic coating layer originated from alcohol is composed of one or more members selected from an alcohol molecule derivative, an alcohol molecule residue and an alcohol molecule, and because only $H_2O$ and $CO_2$ are generated by firing, it completely fits the environmental criteria. Besides, because it can metalize at the temperature less than 200° C., it can be used as a substitute solder of Pb—Sn solder. Besides, it was successful to restrict the interrelation between the decomposition start temperature T1 and the decomposition temperature T2 in the range of $T2-100 \leq T1 \leq T2$, so that it was succeeded in to produce the composite silver nanoparticles whose low temperature firing is possible. Because it is possible for the generation temperature PT (° C.) of such composite silver nanoparticles to be smaller than the metalization temperature T3, the low temperature generation in which the inequality of $PT \leq T3 \leq 200°$ C. holds is succeeded in. Furthermore, when the composite silver nanoparticles produced by the method of the present invention are observed by the high resolution transmission electron microscopy, the lattice image is clearly confirmed and it is found that they are the high crystalline composite silver nanoparticles. This situation is demonstrated. Therefore, it is succeeded in to produce the composite silver nanoparticles having the high electrical conductivity and the high thermal conductivity. At the same time, the present invention provides the composite silver nanopaste including said composite silver nanoparticles. The bonding method to connect the semiconductor and the electronic parts is established by means of this composite silver nanopaste and simultaneously the patterning method firing the silver pattern on the substrate with low melting point is established. Furthermore, as described above, the alcohol origin material is concretely an alcohol derivative, an alcohol residue or an alcohol molecule, and only $H_2O$ and $CO_2$ occur by firing, so that it can be significantly applied to the electronic part bonding of semiconductor etc. Carboxylic acid, carboxylic acid group, alkoxide and alkoxide group are included in the alcohol derivative, and whole compounds derived from alcohol through chemical reaction are included.

Means to Solve the Problem

The present invention was done to solve the above problem, and a composite silver nanoparticle comprising a silver core made up of aggregated silver atoms whose average particle diameter ranges from 1 to 20 nm, and an organic coating layer formed around said silver core by using of one or more members selected from an alcohol molecule derivative, an alcohol molecule residue and an alcohol molecule with a carbon number of 1 to 12.

The second form of the present invention is the composite silver nanoparticle according to said form 1, wherein an aggregation particle is formed by aggregation of a plurality of composite silver nanoparticles.

The third form of the present invention is the composite silver nanoparticle according to said form 1 or 2, wherein said organic coating layer includes at least an alkoxide group and/or a carboxylic acid group.

The fourth form of the present invention is the composite silver nanoparticle according to form 1, 2 or 3, wherein a metalization temperature T3 (° C.) obtained from differential thermal analysis (DTA) is equal to or less than 200° C. when a thermal analysis in atmosphere is performed for said composite silver nanoparticle with a temperature up velocity VT=1° C./min.

The fifth form of the present invention is the composite silver nanoparticle according to any one of forms 1 to 4, wherein a relation between a decomposition start temperature T1 (° C.) obtained from thermogravimetry (TG) and a decomposition temperature T2 (° C.) obtained from differential thermal analysis (DTA) is given by $T2-100 \leq T1 \leq T2$ when a thermal analysis in atmosphere is performed for said composite silver nanoparticle with a temperature up velocity VT=1(° C./min).

The sixth form of the present invention is the composite silver nanoparticle according to form 4 or 5, wherein a generation temperature generating said composite silver nanoparticle is lower than said metalization temperature T3 (° C.).

The seventh form of the present invention is the composite silver nanoparticle according to any one of forms 1 to 6, wherein a lattice image is observed for said silver core when said composite silver nanoparticle is observed by a high resolution transmission electron microscope.

The eighth form of the present invention is the composite silver nanoparticle according to any one of forms 4 to 7, wherein said decomposition start temperature T1, said decomposition temperature T2 and said metalization temperature T3 increase with increase of said temperature up velocity VT.

The ninth form of the present invention is the composite silver nanoparticle according to any one of forms 1 to 8, wherein starting raw materials are a silver salt and an alcohol with the carbon number of 1 to 12.

The tenth form of the present invention is a composite silver nanopaste characterized in that a composite silver nanoparticle according to any one of forms 1 to 9 is contained at least, and a solvent and/or a viscosity grant agent are added.

The eleventh form of the present invention is the composite silver nanopaste according to form 10, wherein a silver microparticles is blended.

The twelfth form of the present invention is the composite silver nanopaste according to form 10 or 11, wherein a paste decomposition start temperature Tp1 (° C.), a paste decomposition temperature Tp2 (° C.) and a paste metalization temperature Tp3 obtained from thermogravimetry (TG) and differential thermal analysis (DTA) increase with increase of temperature up velocity VT when a thermal analysis in atmosphere is performed for said composite silver nanopaste with said temperature up velocity VT (° C./min).

The thirteenth form of the present invention is the composite silver nanopaste according to form 10, 11 or 12, wherein when said thermal analysis in atmosphere is performed for said composite silver nanoparticle and said composite silver nanopaste with said temperature up velocity VT=1 to 20(° C./min), a relation of $T3 \leq Tp3 \leq T3+50$ is held between their metalization temperatures T3 (° C.) and Tp3 (° C.), respectively.

The 14th form of the present invention is a production method of composite silver nanoparticle comprising the steps of preparing an alcohol solution by mixing silver salt microparticles into an alcohol solvent with a carbon number of 1 to 12, heating said alcohol solution in a reaction chamber at a predetermined generation temperature PT for a predetermined generation time, forming a silver core with an average particle diameter of 1 to 20 nm through reducing of said silver salt microparticles by said alcohol solvent, and forming an organic coating layer around said silver core comprising one or more members selected from an alcohol molecule derivative, an alcohol molecule residue and an alcohol molecule.

The 15th form of the present invention is the production method of composite silver nanoparticle according to form 14, wherein said silver salt microparticles are dispersed or dissolved in said alcohol solvent.

The 16th form of the present invention is the production method of composite silver nanoparticle according to form 14 or 15, wherein said alcohol solvent is an excessive alcohol solvent in which said alcohol solvent is added more excessive than the mol number of said silver salt microparticles.

The 17th form of the present invention is the production method of composite silver nanoparticle according to form 14, 15 or 16 wherein a metalization temperature T3 (° C.) obtained from differential thermal analysis (DTA) is equal to or less than 200(° C.) when a thermal analysis in atmosphere is performed for said composite silver nanoparticle with a temperature up velocity VT=1(° C./min).

The 18th form of the present invention is the production method of composite silver nanoparticle according to form 17, wherein said generation temperature PT (° C.) is less than said metalization temperature T3 (° C.).

The 19th form of the present invention is the production method of composite silver nanoparticle according to any one of forms 14 to 18, wherein said generation time of said composite silver nanoparticle is equal to or less than 60 (min).

The 20th form of the present invention is the production method of composite silver nanoparticle according to any one of forms 14 to 19, wherein the generation reaction is stopped by cooling of said alcohol solution after said generation time.

The 21st form of the present invention is the production method of composite silver nanoparticle according to any one of forms 14 to 20, wherein said silver salt microparticles are micronized till the particle diameter reaches a range of 10 nm to 1000 nm.

The 22nd form of the present invention is the production method of composite silver nanoparticle according to any one of forms 16 to 21, wherein a mole ratio of said alcohol solvent to said silver salt microparticles is arranged in a range of 5 to 100 in said excess alcohol solution.

The 23rd form of the present invention is the production method of composite silver nanoparticle according to any one of forms 14 to 22, wherein said composite silver nanoparticle is separated from said alcohol solution in which said composite silver nanoparticle is generated.

The 24th form of the present invention is a production apparatus of composite silver nanoparticle comprising a raw material mixer preparing an alcohol solution by mixing of silver salt microparticles into an alcohol solvent, a reactor chamber generating composite silver nanoparticles through heating of said alcohol solution at a predetermined temperature for a predetermined time by a heater, and a chiller cooling said alcohol solution supplied from said reactor, wherein it is possible to install a component purifier separating said composite silver nanoparticles from said alcohol solution supplied from said chiller, and said raw material mixer, said reactor, said chiller and said component purifier are connected in a partial continuous system or a batch system.

The 25th form of the present invention is the production apparatus of composite silver nanoparticle according to form 24, wherein said silver salt microparticles supplied to said raw material mixer are micronized beforehand.

The 26th form of the present invention is the production apparatus of composite silver nanoparticle according to form 24, wherein said silver salt microparticles in said alcohol solution supplied from said raw material mixer are micronized by a micronizer, and a micronization alcohol solution formed by said micronizer is supplied to said reactor.

The 27th form of the present invention is the production apparatus of composite silver nanoparticle according to any one of forms 24 to 26, wherein a purified liquid including said composite silver nanoparticles supplied from said component purifier is treated, and said composite silver nanoparticles are collected as alcohol wet state or powder.

The 28th form of the present invention is the production apparatus of composite silver nanoparticle according to any one of forms 24 to 27, wherein said component purifier is composed of a centrifugal ultrafilter and said composite silver nanoparticles are diffused within an extraction solvent through a pore so that said purified liquid is formed.

The 29th form of the present invention is the production apparatus of composite silver nanoparticle according to form 28, wherein said ultrafilter is constructed from a triple tube of an inner tube, a middle tube and an outer tube, said excess alcohol solution generating said composite silver nanoparticles is supplied into an middle path formed between said inner tube and said middle tube by coax turn of said inner tube and said middle tube, said pore is formed on the surface of said inner tube, and said extraction solvent is supplied into an inner path inside of said inner tube, so that said composite silver nanoparticles are selectively diffused into said extraction solvent through said pore from said middle path.

The 30th form of the present invention is a bonding method comprising the steps of preparing a composite silver nanopaste according to any one of forms 10 to 13, forming a paste layer by coating a lower part with said composite silver nanopaste, arranging an upper part on said paste layer, and bonding said lower part and said upper part by metalizing said paste layer through heating.

The 31st form of the present invention is a patterning method comprising the steps of preparing a composite silver nanopaste according to any one of forms 10 to 13, forming a paste pattern by coating said composite silver nanopaste on a base body with a predetermined pattern, and forming a silver pattern by metalizing said paste pattern through heating.

Effect of the Invention

According to the first form of the present invention, there is provided the composite silver nanoparticle comprising a silver core made up of aggregated silver atoms whose average particle diameter ranges from 1 to 20 nm, and an organic coating layer formed around said silver core by using of one or more members selected from an alcohol molecule derivative, an alcohol molecule residue and an alcohol molecule with a carbon number of 1 to 12. Since the alcohol with the carbon number (the C number) of 1-12 is used, the alcohol molecular weight is comparatively small in comparison with the conventional one larger than C14, and the generation amount of void becomes small because the amount of exhaust gas at the firing time is small, so that there is a advantageous point that the bond strength is high and the silver core weight ratio increases. Because the organic coating layer is composed of the alcohol origin component, it is safe even though it adheres to hand and skin, and since only $CO_2$ and $H_2O$ gasify by firing, it is very safe and is extremely effective for environmental safeguard. The alcohol molecule derivative is whole alcohol induction materials which are derived from alcohol, and a carboxylic acid, a carboxylic acid group, an alkoxide and alkoxide group etc are included. The alcohol molecule residue is the residue that a part component of an alcohol molecule is divided, and alkoxide and alkoxide group are included, and other divided residues are included, too. The alcohol molecule is alcohol molecule in itself. The silver core particle diameter of the composite silver nanoparticle is 1 to 20 nm, and though the particle diameter of the composite silver nanoparticle in itself increases by the thickness of the alcohol organic coating layer, its thickness is not so large because the carbon number is limited to 1 to 12. The smaller the carbon number, the smaller the thickness, and at the same time it has a property that the weight ratio of the silver core increases and the bond strength becomes strong.

According to the second form of the present invention, there is provided the composite silver nanoparticles, wherein an aggregation particle is formed by aggregation of a plurality of composite silver nanoparticles. The composite silver nanoparticles of the present invention has a property that they singly disperse in organic solvents, but there is a case that they form the aggregation particles by aggregation through collision action during generation, and the aggregation particle is also called the composite silver nanoparticle in the present invention. As a result, the particle size distribution of the powder that the composite silver nanoparticles gathered distributes from the small to the large, and the minimum limit is the particle diameter $d_0$ of single composite silver nanoparticle and the maximum limit becomes $d_0 \times (N_{max})^{1/3}$ because it is proportional to the cube root of the aggregation number N. By using of the powder of composite silver nanoparticles having the particle size distribution described above, since the large and the small composite silver nanoparticles are sintered so as to bury the gaps mutually, there is an effect that the bond strength increases because of the fewness of the gap.

According to the third form of the present invention, composite silver nanoparticle comprising an organic coating layer that contains at least an alkoxide group and/or a carboxylic acid group is provided. Composite silver nanoparticles that form aggregated particles through aggregation of multiple particles are offered. When the molecular formula of an alcohol is expressed as $C_nH_{2n+1}OH$, its alkoxide group is $C_nH_{2n+1}O$, and even an alkoxide group of a lower species corresponds to said alkoxide group. It may be said that an alkoxide group is an alcohol molecule residue, but it may also be said that it is an alcohol molecule derivative. In addition, when the molecular formula of an alcohol is expressed as $C_nH_{2n+1}OH$, its carboxylic acid group is $C_{n-1}H_{2n-1}COO$, but it does not matter even if the carboxylic acid group is that of a lower species. This carboxylic acid group is included among the alcohol molecule derivatives. In cases where the organic coating layer includes a carboxylic acid group or an alkoxide group, the composite silver nanoparticles are extremely safe. In addition, there are cases where an organic coating layer transforms in time after the formation, and turn into carboxylic acid groups, alkoxide groups, or their mixed layer. $C_nH_{2n+1}O$ is an alkoxide group in a narrow sense, but it is employed in a wider sense when alkoxide-coated composite nanoparticles are referred to in the present invention, signifying composite silver nanoparticles having said alcohol origin organic coating layer. Because all the materials of the organic coating layer are alcohol origin, and the safety of alcohols is extremely high in comparison with other organic matters, the composite silver nanoparticles of the present invention are assured of safety, environmental protection characteristics, and ease of handling.

According to the fourth form of the present invention, composite silver nanoparticles are provided whose metalization temperature T3 (° C.) obtained by differential thermal analysis (DTA) is less than or equal to 200° C., when said thermal analysis is performed on said composite silver nanoparticles under atmosphere at a temperature up velocity VT=1° C./min. When differential thermal analysis (DTA) is performed on composite silver nanoparticles under atmosphere, the organic coating layers are oxidized, heat of reaction is generated, and a large DTA peak is produced. When this DTA peak consists of a single peak, the temperature in which this single peak finishes off is metalization temperature T3 (° C.). When said DTA peak consists of multiple peaks, the temperature in which the last peak finishes off is metalization temperature T3 (° C.). From the point of view of thermogravimetry (TG), the decrement end temperature of the TG curve corresponds to said metalization temperature T3 (° C.). With the present invention, because metalization temperature T3 is within 200° C., it becomes possible to fire the composite silver nanoparticles at low temperature. If temperature up rate VT at the time of DTA measurement becomes steep, said temperature T3 also increases, but in the present invention, metalization temperature T3 (° C.) is equal to or less than 200° C. when measured at VT=1° C./min.

At first, the present inventors studied composite silver nanoparticles of low-temperature firing type, and developed composite silver nanoparticles that satisfied T3≦150° C. or T2≦150° C., but after further studies came to develop composite silver nanoparticles in the range of T3≦200° C. Even when prior literature is examined, composite silver nanoparticles of T3≦200° C. do not exist, and composite silver nanoparticles of T3≦200° C. is realized for the first time by the present invention. By the development of composite silver nanoparticles whose metalization temperature T3 is less than or equal to 200° C., a success was achieved in providing a substitute solder of outstanding characteristic that is comparable to the fusing point of 183° C. in the conventional Sn—Pb solders. Because metalization temperature T3 is less than or equal to 200° C., the cost of manufacturing apparatuses and facilities can also be greatly reduced. Therefore, the composite silver nanoparticle of the present invention can be applied to various applications such as electronic materials such as printed wiring and electroconductive material, magnetic materials such as magnetic recording medium, electromagnetic wave absorption body, and electromagnetic wave resonator, structural materials such as far infrared material and compound film formation material, ceramics and metallic materials such as sintering aid and coating material, and medical care materials.

According to the fifth form of the present invention, it is composite silver nanoparticles whose relation between decomposition start temperature T1 (° C.) obtained by thermogravimetry (TG) and decomposition temperature T2 (° C.) obtained by differential thermal analysis (DTA) is T2−100≦T1≦T2 when thermal analysis is performed on said composite silver nanoparticles under atmosphere with temperature up velocity VT=1(° C./min). Said decomposition start temperature T1 (° C.) can be measured from the decrement start temperature of the TG curve, but when the TG curve decreases linearly from the beginning, then deviates from the straight line midway to decrease in manner of a secondary curve, then the change point, that is to say, the divergence point from the straight line, can be defined as decomposition start temperature T1. The straight line region can be understood to indicate the decrement region of the pure alcohol component. When a differentiation curve of the TG curve, that is to say, a DTG curve is used, one may define the temperature in which the DTG curve begins to drop from a constant value as decomposition start temperature $T1$. The decomposition temperature $T2$, in which the organic covering layer becomes strongly decomposed by oxidation, is defined by the peak temperature when the DTA peak consists of a single peak, and by the first peak temperature at the beginning when the DTA peak consists of multiple peaks. Within the range of $T2-100 \leq T1 \leq T2$, it signifies that decomposition start temperature $T1$ exists within the range of 100° C. below decomposition temperature $T2$, and when it is put together with $T2 \leq T3 \leq 200°$ C. of the fourth form, it becomes $T2-100 \leq T1 \leq T2 \leq T3 \leq 200°$ C. Therefore, it signifies that all of temperatures $T1$, $T2$, and $T3$ exist within a low-temperature region of less than or equal to 200° C., meaning that the composite silver nanoparticle of the present invention is for the purpose of low-temperature firing, and it is a characteristic of the composite silver nanoparticle concerning the present invention.

The present inventors carried out thermal analysis measurements of two types of CnAgAL (n=1-12), and obtained as a conclusion that the first type is $T2-60 \leq T1 \leq T2$, and the second type is $T2-90 \leq T1 \leq T2$. These were summarized, and, with the present invention, it was confirmed that the inequality $T2-100 \leq T1 \leq T2$ is established.

According to the sixth form of the present invention, composite silver nanoparticles are provided whose generation temperature $PT$ (° C.), where said composite silver nanoparticles are generated, is lower than metalization temperature $T3$ (° C.). According to the fourth form, metalization temperature $T3$ is $T3 \leq 200$(° C.), and in the present form, it is $PT \leq T3$ (° C.), and because of this, when both are combined, one obtains $PT \leq T3 \leq 200$(° C.). Therefore, because generation temperature $PT$ is lower than metalization temperature $T3$ whose maximum value is 200° C., composite silver nanoparticles for low-temperature production is provided by the present invention.

According to the seventh form of the present invention, a composite silver nanoparticle is provided in which a lattice image is observed when said composite silver nanoparticle is observed under a high resolution transmission electron microscope. When the composite silver nanoparticles of the present invention is photographed by the transmission electron microscope JEM-2000FX with accelerating voltage of 200 kV installed in Kyoto University, lattice images are confirmed in the silver kernels of the composite silver nanoparticles under monodispersed condition. Their silver kernel diameters were within a range of 1-20 nm, and the lattice spacing was found to be 0.24 nm, coinciding with the plane spacing of the (111) plane in bulk silver. From this result, it was understood that the silver cores are not polycrystalline, but instead single crystals of silver, or a condition near single crystals. Therefore, composite silver nanoparticles covered by the alcohol origin materials concerning the present invention has a high crystallinity to the extent that lattice images are observed, and as a result, grain boundaries nearly do not exist in the silver kernel interior. Because of this, it has been demonstrated that the electron scattering characteristics and the thermal scattering characteristics are minuscule, and they possess high electrical conductance and high thermal conductance. It is the epoch-making new material that completely negates the polycrystallinity that had been assumed conventionally. This situation was understood. That a lattice image is observed in a silver core having an organic covering layer of alcohol origin is a fact that became clear for the first time by the present invention.

According to the eighth form of the present invention, composite silver nanoparticles are provided in which said decomposition start temperature $T1$ (° C.), said decomposition temperature $T2$ (° C.), and said metalization temperature $T3$ (° C.) increase with the increase in temperature up velocity $VT$. When temperature up velocity $VT$ is varied only within a range of 1-20 (° C./min), a tendency is found in which decomposition start temperature $T1$ increases approximately 50° C., decomposition temperature $T2$ increases approximately 60° C., and metalization temperature $T3$ increases approximately 70° C. Because $T1$, $T2$, and $T3$ were defined with $VT=1$ (° C./min) in the fourth and the fifth forms, when the same compound silver nanoparticles are measured with $VT=20$ (° C./min), it is thought that $T1$, $T2$, and $T3$ increase respectively by 50° C., 60° C., and 70° C. However, needless to say, these temperature increase values depend upon the number of carbon of the organic covering layer, and it is thought that they depend also upon the silver kernel grain size to some extent.

According to the ninth form of the present invention, composite silver nanoparticles are provided in which a silver salt and an alcohol with carbon number of 1-12 are used as the starting materials. For said silver salt, an inorganic silver salt and an organic silver salt can be used. As for the inorganic salt, there are silver carbonate, silver chloride, silver nitrate, silver phosphate, silver sulfate, silver borate, and silver fluoride. As for the organic salt, there are fatty acid salts such as silver formate and silver acetate, sulfonate salt, and silver salts of hydroxyl group, thiol group, and enol group. Among these, a silver salt comprising C, H, O, and Ag or a silver salt comprising C, O, and Ag is desirable. The reason is that there is a possibility that atoms such as P, S, and N diffuse within a semiconductor or ceramics and become impurities that decrease the properties. From this point of view, silver carbonate ($Ag_2CO_3$) is the most preferred. Because alcohol is used as the solvent, composite silver nanoparticles of the present invention can be generated by the reducing power of the alcohol from either inorganic or organic silver salt at relatively low temperature. Inorganic silver salts are poorly soluble in an alcohol, but as for organic silver salts, there are ones soluble in alcohol, and ones poorly soluble in alcohol. Alcohol-soluble organic salts are extremely few, such as silver abietate, and inorganic silver salts and most of organic silver salts may be thought of as poorly soluble to alcohol.

The composite silver nanoparticles of the present invention are described as CnAgAL by the following notation. Corresponding to n=1-12, there are C1AgAL, C2AgAL, C3AgAL, C4AgAL, C5AgAL, C6AgAL, C7AgAL, C8AgAL, C9AgAL, C10AgAL, C11AgAL, and C12AgAL. Their meaning is composite silver nanoparticles generated by alcohols with carbon number n=1-12. Therefore, C1 signifies methanol, C2 ethanol, C3 propanol, C4 butanol, C5 pentanol, C6 hexanol, C7 heptanol, C8 octanol, C9 nonanol, C10 decanol, C11 undecanol, and C12 dodecanol. Because alcohols of n=even number are alcohols of natural plant origin, and on the other hand, n=odd number are chemically synthetic alcohols, the alcohols of n=even number are comparatively cheap, and can be used to provide cheap composite silver nanoparticles. In addition, the weight ratio of silver core becomes higher as the carbon number n decreases, and composite silver nanoparticles with greater silver quantity can be provided.

According to the tenth form of the present invention, composite silver nanopaste is provided containing at least the composite silver nanoparticles of any one of the first to ninth forms, and to which a solvent and/or a viscosity grant agent is added.

Said solvent is a material that disperses the powder comprising composite silver nanoparticles and thus forms a solution, and for example, alcohol, acetone, toluene, xylene, propanol, ether, petroleum ether, benzene and such can be used. Said viscosity grant agent is a material that is added to said solvent and gives the viscosity that makes it easier to apply to, and for example, turpentine, terpineol, methyl cellulose, ethyl cellulose, butyral, various terpene derivatives, IBCH (isobornyl cyclohexanol), glycerine, alcohols of or larger than C14 that are solid at normal temperature can be used. As for terpene derivatives, there are 1,8-terpenemonoacetate and 1,8-terpenediacetate among others. IBCH has a pine resin-like consistency, glycerine has a syrup-like consistency, and alcohols of or larger than C14 has a property in which they transform between solid and liquid, and show a lack of fluidity at or below 10° C. By mixing and dispersing the composite silver nanoparticle of the present invention to said nonfluid viscosity grant agent to form a nonfluid paste, aggregation between the composite silver nanoparticles do not occur at a low temperature of or below 10° C., because the composite silver nanoparticles are fixed in a dispersed manner. When said nonfluid paste is heated immediately before use, it becomes fluid and applicable as a paste, and thus can demonstrate its function as a paste. In addition, needless to say, if a solvent is added to said nonfluid paste just before use, it becomes a fluid paste without a need for heat application, and can demonstrate its function as a paste.

Because the composite silver nanoparticles of the present invention have metalization temperature T3 less than or equal to 200° C., it is desirable that the evaporating temperature or the decomposition temperature of the solvent and/or the viscosity grant agent is set as low as possible. Therefore, the firing temperature of a paste is determined not only by the metalization temperature of the composite silver nanoparticles, but it is also dependent on the evaporating temperature or the decomposition temperature of the solvent and/or the viscosity grant agent. In addition, it is necessary that it evaporates, decomposes, and dissipates by heating, and anything that carbonizes and remains behind is excluded. In addition, as usage configurations, a paste to which only solvents are added, a paste to which only viscosity grant agents are added, and a paste to which both solvents and viscosity grant agents are added may be utilized.

According to the eleventh form of the present invention, composite silver nanopaste is provided in which silver microparticles have been blended. Said composite silver nanoparticle comprises a silver kernel and an organic coating layer, and as the carbon number of the alcohol origin material forming the organic coating layer becomes smaller, the content percentage of silver in said composite silver nanoparticle becomes larger. Furthermore, to increase the content percentage of silver in the paste overall, it is preferable to blend silver microparticles into said paste. The smaller the particle size of the silver microparticles, the more preferable it becomes, but depending on the types of the junction area, a range of 50 nm-5 μm, for example, is preferable, and silver microparticles of 0.1 μm-1 μm are even more preferable, for they have size compatibility with composite silver nanoparticles. The mass ratio between composite silver nanoparticles and silver micoparticles can be adjusted appropriately.

According to the twelfth form of the present invention, there is provided the composite silver nanopaste, wherein a paste decomposition start temperature Tp1 (° C.), a paste decomposition temperature Tp2 (° C.) and a paste metalization temperature Tp3 obtained from thermogravimetry (TG) and differential thermal analysis (DTA) increase with increase of temperature up velocity VT when a thermal analysis in atmosphere is performed for said composite silver nanopaste with said temperature up velocity VT (° C./min).

Definitions of paste decomposition start temperature Tp1 (° C.), paste decomposition temperature Tp2 (° C.) and paste metalization temperature Tp3 (° C.) of composite silver nanopaste of the present invention correspond to the definitions of decomposition start temperature T1 (° C.), decomposition temperature T2 (° C.) and metalization temperature T3 (° C.) in composite silver nanoparticle of the present invention described previously. But, because, in composite silver nanopaste, a solvent and a viscosity grant agent are added to composite silver nanoparticles, desorption and oxidation decomposition of the solvent and/or the viscosity grant agent go ahead before the composite silver nanoparticles are oxidized and decomposed. Therefore, in TG curve and DTA curve, the curves of the solvent and/or the viscosity grant agent go ahead and the curve of composite silver nanoparticles follows after that. In other words, the first rapid decrease appearing in TG curve forms the first deep dip in DTG curve being the differentiation curve and the temperature that the DTG curve becomes almost zero after return of the dip can be judged as the paste decomposition start temperature Tp1. This Tp1 gives the second decrease start temperature of DTG curve. After this paste decomposition start temperature Tp1, a DTA peak appears in DTA curve, and the first DTA peak temperature appearing firstly is the paste decomposition temperature Tp2 (° C.). The steep last peak appearing lastly in DTA peaks can be considered as the emission peak of the binding energy between the naked silver cores remaining after the organic coating layer is oxidized and decomposed. The point at which this last peak falls and curves to the crosswise direction is defined as the paste metalization temperature Tp3 (° C.). These paste temperatures satisfy the inequality of Tp1≦Tp2≦Tp3.

When said temperature up rate VT varies in the range of 1-20(° C./min), there can be seen the tendency that the paste decomposition start temperature Tp1 increases by approximately 50° C., the paste decomposition temperature Tp2 increases by approximately 65° C. and the metalization temperature Tp3 increases by approximately 80° C. Therefore, when Tp1, Tp2 and Tp3 are measured while raising the temperature of composite silver nanopaste with both of VT=1 (° C./min) and VT=20 (° C./min), it can be considered that said Tp1, Tp2 and Tp3 increase by about 50° C., about 65° C. and about 80° C., respectively. However, needless to say that these temperature increment depend upon the carbon number of the organic coating layer, it can be considered that they are dependent on the particle diameter of silver core to some extent.

According to the thirteenth form of the present invention, there is provided the composite silver nanopaste, wherein when said thermal analysis in atmosphere is performed for said composite silver nanoparticle and said composite silver nanopaste with said temperature up velocity VT=1 to 20 (° C./min), a relation of T3≦Tp3≦T3+50 is held between their metalization temperatures T3 (° C.) and Tp3 (° C.), respectively. According to the study of the present inventor, it was found that the following inequality was approximately satisfied in the range of temperature up rate VT=1-20 (□/min) between T1, T2, T3 of composite silver nanoparticle (noted as CnAgAL, n=1-12) and Tp1, Tp2, Tp3 of composite silver nanopaste (noted as PCnAgAL, n=1-12).

$$T1(VT) \leq Tp1(VT) \leq T1(VT)+100 \quad (P1)$$

$$T2(VT) \leq Tp2(VT) \leq T2(VT)+70 \quad (P2)$$

$$T3(VT) \leq Tp3(VT) \leq T3(VT)+50 \quad (P3)$$

This present form expresses the formula (P1) to (P3). By using of this inequality, when the characteristic temperatures T1, T2, T3 of the composite silver nanoparticle are measured, it became possible to estimate the characteristic temperatures Tp1, Tp2, Tp3 of the composite silver nanopaste.

According to the 14th form of the present invention, there is provided a production method of composite silver nanoparticle comprising the steps of preparing an alcohol solution by mixing silver salt microparticles into an alcohol solvent with a carbon number of 1 to 12, heating said alcohol solution in a reaction chamber at a predetermined generation temperature PT for a predetermined generation time, forming a silver core with an average particle diameter of 1 to 20 nm through reducing of said silver salt microparticles by said alcohol solvent, and forming an organic coating layer around said silver core comprising one or more members selected from an alcohol molecule derivative, an alcohol molecule residue and an alcohol molecule. Alcohol solution is the mixing liquid of silver salt and alcohol, and when it makes the amount of alcohol increase and the generated composite silver nanoparticles become a floating state in the alcohol, the probability of mutual collision probability reduces, so that the meeting of composite silver nanoparticles can be prevented. In addition, a large quantity of alcohol molecules are absorbed on the surface of the silver salt microparticles, so the surface reaction is promoted. Because a general formula of alcohol is $R_nOH$ ($R_n$ is hydrocarbon group), $R_n$ is a hydrophobic group and OH is a hydrophilic group, the alcohol is a surface active agent (detergent) having the surface activity effect if a way of thinking is changed. Many of silver salts are anti-soluble in alcohol, but the surface of silver microparticle has a property that the OH group of alcohol is easy to be coupled with. Therefore, the silver salt microparticle is surrounded by alcohol and it may be said to become the stable single disperse colloid when the particle diameter of silver salt microparticle becomes small. If the particle diameter of silver salt microparticle becomes large, there is a possibility to precipitate in alcohol, but in a case that it becomes a disperse state for a certain time by mixing and agitating, it is good to complete the reaction in the meantime.

Additionally, even alcohol in itself has the reducing effect, but the alcohol changes easily to aldehyde at the generation temperature less than 200° C., and this aldehyde has the strong reducing effect. In other words, alcohol and/or aldehyde act on the surface of silver salt microparticle, so that silver gradually precipitates and all regions of silver salt microparticle are finally reduced and it is changed to silver core. The organic coating layer composed of one or more members selected from an alcohol molecule derivative originated from alcohol, an alcohol molecule residue and an alcohol molecule is formed around the silver core, so that the composite silver nanoparticle is generated. If the generation temperature PT is set in less than 200° C., for example, the composite silver nanoparticle of low metalization temperature T3 can be generated. In the present invention, the generation temperature PT is set lower than the metalization temperature T3 ($\leqq$200° C.), so the composite silver nanoparticle for low temperature firing is generated. Mean particle diameter of silver cores is 1-20 nm, but if micronization treatment of silver salt microparticles is done thoroughly, it is possible to produce the composite silver nanoparticles with smaller particle diameter.

According to the 15th form of the present invention, there is provided the production method of composite silver nanoparticle, wherein said silver salt microparticles are dispersed or dissolved in said alcohol solvent.

As the silver salt particle used in the present invention, an inorganic silver salt and an organic silver salt can be utilized. As for the inorganic salt, there are silver carbonate, silver chloride, silver nitrate, silver phosphate, silver sulfate, silver borate, and silver fluoride. As for the organic salt, there are fatty acid salts such as silver formate and silver acetate, sulfonate salt, and silver salts of hydroxyl group, thiol group, and enol group. In these salts, silver salt comprising of C, H, O and Ag or silver salt comprising of C, O and Ag is desirable. The reason is that there is a possibility that atoms such as P, S, and N diffuse within a semiconductor or ceramics and become impurities that decrease the properties. From this point of view, silver carbonate ($Ag_2CO_3$) is the most preferred. Because alcohol is used as the solvent, composite silver nanoparticles of the present invention can be generated by the reducing power of the alcohol from either inorganic or organic silver salt at relatively low temperature. Inorganic silver salts are poorly soluble in an alcohol, but as for organic silver salts, there are ones soluble in alcohol, and ones poorly soluble in alcohol. Alcohol-soluble organic silver salts are extremely few, such as silver abietate, and inorganic silver salts and most of organic silver salts may be thought of as poorly soluble to alcohol. Alcohol-soluble silver salt dissolves in alcohol in molecular level, and reactivity with alcohol is raised. On the other hand, alcohol anti-soluble silver salt is micronized, then is mixed and dispersed in alcohol, and when the microparticle size is micronized to nanosize, they disperse stably in alcohol solvent, and the reactivity with alcohol is raised.

According to the 16th form of the present invention, there is provided the production method of composite silver nanoparticle, wherein said alcohol solvent is an excessive alcohol solvent in which said alcohol solvent is added more excessive than the mol number of said silver salt microparticles.

In the present method, the alcohol mass is considerably excessive than the silver salt mass. For example, when carbonic acid silver is taken as a silver salt, the generation of normal silver alkoxide is given by the following formula (D).

$$Ag_2CO_3 + 2R_nOH \rightarrow 2R_nOAg + CO_2 + H_2O. \qquad (D)$$

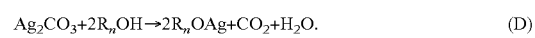

In other words, carbonic acid silver:alcohol=1 mol:2 mols, and this mole ratio is the stoichiometry ratio. In the present method, the mole ratio of alcohol is set considerably larger than said stoichiometry ratio, and the excess alcohol solution is used. When this excess degree rises, the generated composite silver nanoparticles become hard to collide mutually, so it becomes possible to prevent the meeting and aggregation of the composite silver nanoparticles. When the composite silver nanoparticle gets large by aggregation, the metalization temperature T3 becomes too high, and there is a possibility to make the metalization temperature T3 larger than 200° C. In the present production method, for the first time, it was succeeded in to decrease the metalization temperature T3 less than 200☐ by means of the excess alcohol solution.

According to the 17th form of the present invention, there is provided the production method of composite silver nanoparticle, wherein a metalization temperature T3 (° C.) obtained from differential thermal analysis (DTA) is equal to or less than 200 (° C.) when a thermal analysis in atmosphere is performed for said composite silver nanoparticle with a temperature up velocity VT=1 (° C./min). When the metalization temperature T3 is adjusted to be less than 200° C., it gets possible to adjust the paste metalization temperature Tp3 less than 250° C. based upon formula (P3), so it becomes possible to provide the paste for low temperature firing.

According to the 18th form of the present invention, there is provided the production method of composite silver nanoparticle, wherein said generation temperature PT (° C.) is less than said metalization temperature T3 (° C.). According to experience of the present inventor, there is a tendency that the generation temperature PT of composite silver nanoparticle is less than the metalization temperature T3 in air atmosphere, namely the relation of PT≦T3. Therefore, when T3≦200 (° C.), the generation temperature PT becomes PT≦T3≦200 (° C.), so the production method of composite silver nanoparticle for low-temperature generation and low-temperature firing can be provided.

According to the 19th form of the present invention, there is provided the production method of composite silver nanoparticle, wherein said generation time of said composite silver nanoparticle is equal to or less than 60 (min). Because the composite silver nanoparticles are gradually generated in the alcohol solution, the aggregation between composite silver nanoparticles occurs when the generation time becomes longer, and it was confirmed a fact that the particle diameter of composite silver nanoparticle increases. Under consideration of this point, the generation time is limited within 60 minutes, and if it is inside of this time, it is possible to produce the composite silver nanoparticle with the particle diameter of silver core to be directed. In addition, if the carbon number becomes small, the organic coating layer gets thin, and it was confirmed a fact that the aggregation accelerates with the action. Therefore, it becomes important that the smaller the carbon number, the shorter than 60 min the generation time.

According to the 20th form of the present invention, there is provided the production method of composite silver nanoparticle, wherein the generation reaction is stopped by cooling of said alcohol solution after said generation time. When the generation time is finished, the generation reaction is rapidly stopped by cooling of the alcohol solution, and simultaneously, the aggregation reaction can fall by that cooling, too, so that it became possible to produce the homogeneous composite silver nanoparticles kept the particle size. It is good that the cooling rate is more rapid, and there can be utilized the cooling system such as an electric cooling system and a fluid cooling-system. It is effective when it is simply cooled off to 0° C. by iced water. Furthermore, it is also possible to perform the rapid stop by dipping the reaction container in liquid nitrogen.

According to the 21st form of the present invention, there is provided the production method of composite silver nanoparticle, wherein said silver salt microparticles are micronized till the particle diameter reaches a range of 10 nm to 1000 nm. The mean particle diameter of commercial silver salt microparticles are 10 μm, but the variation of particle diameter distribution is large, and there are the particles of 50 μm, too. Therefore, these particles are made to the uniform mean diameter of 10 μm as possible through crushing by mixer, too. Next, while centrifugally rotating them together with beads and crushing forcibly the silver salt microparticles by beads, they are micronized till the particle diameter of silver salt microparticle becomes the range of 10 nm to 1000 nm, and it is possible to produce the composite silver nanoparticle having the uniformly small particle diameter of the silver core as the particle size becomes small.

According to the 22nd form of the present invention, there is provided the production method of composite silver nanoparticle, wherein a mole ratio of said alcohol solvent to said silver salt microparticles is arranged in a range of 5 to 200 in said excessive alcohol solution. The mole ratio of alcohol solvent to silver salt is prepared in the range of 5-200. In the range of less than 5, the aggregation of composite silver nanoparticles is outstanding, and in the range of more than 100, especially 200, it is uneconomical because the alcohol cost becomes too high, and the utility cost becomes unreasonable because the reaction chamber also becomes large. Furthermore, as for the mole ratio, the range of 10-100 is more preferable.

According to the 23rd form of the present invention, there is provided the production method of composite silver nanoparticle, wherein said composite silver nanoparticle is separated from said alcohol solution in which said composite silver nanoparticle is generated. The silver salt microparticles and the alcohol react perfectly in the reaction container, and it is most desirable that the composite silver nanoparticles and the alcohol remain in the reaction container. However, there is also a case that the silver salt not reacted yet and the composite silver nanoparticles coexist, so the purity of composite silver nanoparticles had better be improved by isolating of only the composite silver nanoparticles from the reaction container. In addition, even if some silver salt remains as an impurity, the silver salt decomposes by firing, too.

According to the 24th form of the present invention, there is provided a production apparatus of composite silver nanoparticle comprising a raw material mixer preparing an alcohol solution by mixing of silver salt microparticles into an alcohol solvent, a reactor chamber generating composite silver nanoparticles through heating of said alcohol solution at a predetermined temperature for a predetermined time by a heater, and a chiller cooling said alcohol solution supplied from said reactor, wherein it is possible to install a component purifier separating said composite silver nanoparticles from said alcohol solution supplied from said chiller, and said raw material mixer, said reactor, said chiller and said component purifier are connected in a continuous system, a partial continuous system or a batch system.

The present production apparatus basically comprises the raw material mixer preparing an alcohol solution by mixing of silver salt microparticles into an alcohol solvent, the reactor chamber generating composite silver nanoparticles through heating of said alcohol solution at a predetermined temperature for a predetermined time by a heater, and the chiller cooling said alcohol solution supplied from said reactor. To this basic construction, it is possible to install the component purifier separating said composite silver nanoparticles from said alcohol solution supplied from said chiller. Said reactor is composed of the heating apparatus and the reaction container, and as the heating apparatus, an induction heating apparatus • an infrared heating apparatus • a plasma heating apparatus • a laser heating apparatus • a supersonic wave heating apparatus or their combination heating apparatus can be used. The present apparatus may be the continuous production apparatus or the batch system production apparatus, and therefore, there is provided the production apparatus of composite silver nanoparticles, wherein said raw material mixer, said reactor, said chiller and said component purifier are connected in a continuous system, a partial continuous system or a batch system. By using of the present apparatus, it becomes possible to produce the composite silver nanoparticles with high-speed and large quantity, and there can be provided the mass production apparatus of the substitute solder instead of Sn—Pb solder. The case that the raw material mixer is made to the raw material micronization mixer by adding the beads into said raw material mixer is also included in the present form.

According to the 25th form of the present invention, there is provided the production apparatus of composite silver nanoparticle, wherein said silver salt microparticles supplied to said raw material mixer are micronized beforehand. If the carbonic acid silver added into said raw material mixer is micronized beforehand by the mixer and beads, the micronization and uniformity of the particle diameter of silver salt microparticles to be reacted can be assured, so that the uniformity of the particle diameter of generated composite silver nanoparticles can be leveled up. Of course, it is needless to say that said silver salt microparticle can be micronized by the mixer in said raw material mixer. Therefore, as the apparatus form, there is provided the production apparatus wherein the micronization crusher, raw material mixer, reactor, chiller and component purifier are composed in the continuous system or the batch system. If the micronization crusher is positioned as the first step micronization, the raw material micronization mixer may be positioned as the super-micronization by the bead.

According to the 26th form of the present invention, there is provided the production apparatus of composite silver nanoparticle, wherein said silver salt microparticles in said alcohol solution supplied from said raw material mixer are micronized by a micronizer, and a micronization alcohol solution formed by said micronizer is supplied to said reactor. Therefore, as the apparatus form, there is provided the production apparatus wherein the raw material mixer, micronizer, reactor, chiller and component purifier are composed in the continuous system or the batch system. In this apparatus layout, it is different from the construction in a point that the micronizer is disposed between the raw material mixer and the reactor. At all events, as the silver microparticles are micronized still more, the micronization of the composite silver nanoparticles and the smallness and uniformity of the particle diameter can be achieved.

According to the 27th form of the present invention, there is provided the production apparatus of composite silver nanoparticle, wherein a purified liquid including said composite silver nanoparticles supplied from said component purifier is treated, and said composite silver nanoparticles are collected as alcohol wet state or powder. The purification liquid in which the composite silver nanoparticles dispersed is finally extracted, and if the solvent is separated from this extract liquid, the composite silver nanoparticles to be finally directed can be isolated. There is the separation method such as a film separation method and an evaporation drying method. The wet condition means that said powder is wet by a small quantity of solvent as alcohol, so it can be realized to prevent the scatter of powder.

According to the 28th form of the present invention, there is provided the production apparatus of composite silver nanoparticle, wherein said component purifier is composed of a centrifugal ultrafilter and said composite silver nanoparticles are diffused within an extraction solvent through a pore so that said purified liquid is formed. In the alcohol solution in which the composite silver nanoparticles are generated, there exist the silver salt microparticles not reacted yet, composite silver nanoparticles and alcohol, and the order of particle diameter is silver salt microparticle>composite silver nanoparticle>alcohol. In addition, as for the mass order, it is considered to be silver salt microparticle>composite silver nanoparticle>alcohol. Therefore, by the centrifugal method, the alcohol of light mass is separated by splashing outward. In addition, the composite silver nanoparticles are separated by diffusing into the extraction solvent such as hexane and toluene. As a result, the silver salt can be separated, too. As thus described, If the components are separated, the recycling of alcohol and carbonic acid silver becomes possible, and it becomes possible to collect the pure composite silver nanoparticle powder in which the impurity is not mixed.

According to the 29th form of the present invention, there is provided the production apparatus of composite silver nanoparticle, wherein said ultrafilter is constructed from a triple tube of an inner tube, a middle tube and an outer tube, said excessive alcohol solution generating said composite silver nanoparticles are supplied into an middle path formed between said inner tube and said middle tube by coax turn of said inner tube and said middle tube, said pore is formed on the surface of said inner tube, and said extraction solvent is supplied into an inner path inside of said inner tube, so that said composite silver nanoparticles are selectively diffused into said extraction solvent through said pore from said middle path. The alcohol of small mass is flown outward by the centrifugal force, and when the pore is formed on the surface of said middle tube, the alcohol is separated into the outer path formed between the middle tube and the outer tube. Only silver salt microparticles remain in the middle path. In this way, by using of the present apparatus, the alcohol, the silver salt microparticles not reacted yet and the composite silver nanoparticles are separated, respectively.

According to the 30th form of the present invention, there is provided the bonding method comprising the steps of preparing a composite silver nanopaste according to any one of forms 10 to 13, forming a paste layer by coating a lower part with said composite silver nanopaste, arranging an upper part on said paste layer, and bonding said lower part and said upper part by metalizing said paste layer through heating. The present form is the bonding method of two bodies by use of the composite silver nanopaste, one body and the other body are called the lower part and the upper part, respectively, and when both parts are adhered through the paste layer, the strong bonding can be achieved by silverization the paste layer due to firing. Besides, because the silver film is superior to the electrical conductivity and the thermal conductivity and the low temperature firing is possible, the low melting point bonding of the bodies becomes possible.

According to the 31st form of the present invention, there is provided the patterning method comprising the steps of preparing a composite silver nanopaste according to any one of forms 10 to 13, forming a paste pattern by coating said composite silver nanopaste on a base body with a predetermined pattern, and forming a silver pattern by metalizing said paste pattern through heating. For example, like a case that a predetermined pattern of silver film is formed on the resin substrate of low melting point, it is provided the method to form the silver film of a variety of patterns on various materials with low temperature by the present invention form.

BRIEF DESCRIPTION OF DRAWINGS

FIG. 1 is an explanatory diagram of the first process of low temperature generation reaction of composite silver nanoparticle concerning the present invention.

FIG. 2 is an explanatory diagram of the second process of low temperature generation reaction of composite silver nanoparticle concerning the present invention.

FIG. 52 is a magnitude relation diagram of characteristic temperature (T1, T2, T3, Tp1, Tp2, Tp3) of CnAgAL and PCnAgAL obtained from FIG. 51.

DENOTATION OF REFERENCE NUMERALS

Figure 3:
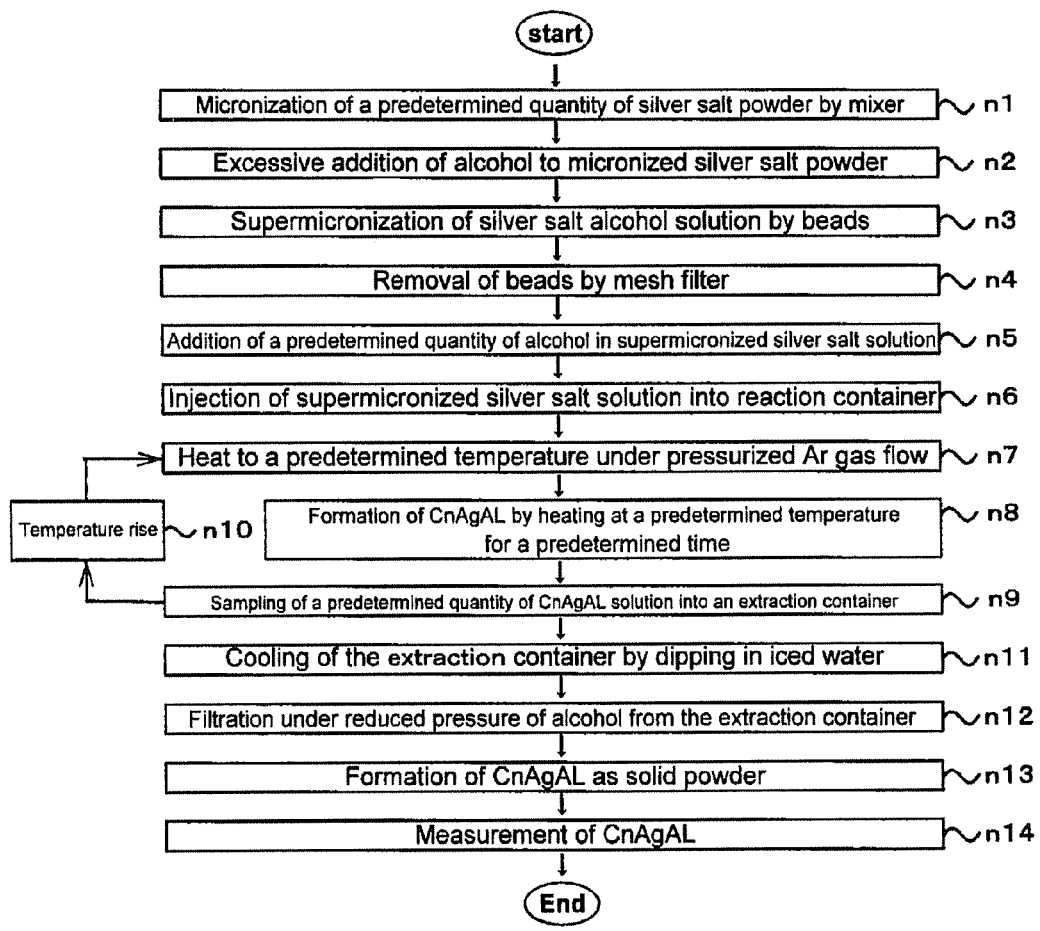
FIG. 3 is a detailed flow diagram showing the low temperature generation steps of composite silver nanoparticle concerning the present invention.

10 super micronizer, 11 raw material mixer, 12 super micronization container, 13 input port, 14 center tube, 15 rotation axis, 16 rotation blade, 17 beads, 20 reactor, 21 raw material supply port, 22 reaction tube, 23 heater, 24 generation region, 25 chiller, 26 cooling region, 27 generation output port, 30 component purifier, 31 outer tube, 32 middle tube, 33 super pore, 34 inner tube, 35 pore, 36 inner path, 37 middle path, 38 outer path, 40 middle separator, 41 silver salt separation container, 42 alcohol separation container, 50 powder collector, 51 spray, 52 drier, 53 mist, 54 hopper, 55 collection tube, 56 powder collection container, HE extraction solvent

BEST MODE FOR CARRYING OUT THE INVENTION

As follows, the embodiments of composite silver nanoparticle, composite silver nanopaste, their production methods, production apparatus, bonding method and patterning method concerning the present invention are explained in details with reference to diagrams and tables.

FIG. 1 is an explanatory diagram of the first process of low temperature generation reaction of composite silver nanoparticle concerning the present invention. An inorganic compound used as the raw material is silver salt (1). For said silver salt, an inorganic silver salt and an organic silver salt can be used. As for the inorganic salt, there are silver carbonate, silver chloride, silver nitrate, silver phosphate, silver sulfate, silver borate, and silver fluoride. As for the organic salt, there are fatty acid salts such as silver formate and silver acetate, sulfonate salt, and silver salts of hydroxyl group, thiol group, and enol group. Among their silver salts, a silver salt comprising C, H, O and Ag, or a silver salt comprising C, O and Ag is desirable in a point that the impurities are not included. The reason is that even if the silver salt was mixed in the generated composite silver nanoparticles as the impurity, only $H_2O$, $CO_2$ and $O_2$ are generated by firing. In the embodiments of the present invention, silver carbonate (Ag2CO3) is described below as preferable silver salt, but it is needless to say that other silver salts are similar.

As for the alcohol, alcohol shown as formula (2) is employed. The Rn of formula (3) shows the hydrocarbon group of alcohol. Carbon number n is limited to 1-12. In general, the silver salt microparticles are alcohol indissolubility, but the hydrophilic group OH of alcohol has the property that is easy to bond with the surface of a silver salt microparticle. In addition, the hydrophobic group Rn of alcohol has the high affinity with alcohol solvent. Therefore, as shown in formula (4), when the silver salt microparticles are dispersed in alcohol solvent, alcohol is adsorbed circumferentially on the silver salt microparticles so that they float in the alcohol solution. When the particle size of silver salt microparticles is small, the stable colloid of silver salt particles is formed. On the other hand, when the particle size of silver salt microparticles is large, there is a case that they precipitate, but there is no problem if the floating state continues for several tens minutes, and it is good to make them react while agitating slowly.

FIG. 2 is an explanatory diagram of the second process of low temperature generation reaction of composite silver nanoparticle concerning the present invention. In order to clear the reaction formula, carbonic acid silver as silver salt is explained as an example, but other silver salts are similar, too. Carbonic acid silver on the surface of a carbonic acid silver microparticle reacts with alcohol, and aldehyde $R_{n-1}CHO$ is generated simultaneously with silverization as shown in formula (5). In addition, There also exists the reaction path that silver alkoxide AgORn is generated promptly without formation of aldehyde as shown in formula (6). Said aldehyde has the strong reducing effect, and as shown in formula (7), the carbonic acid silver is reduced, and the carboxylic acid Rn−1COOH is formed simultaneously with the silverization. The Ag, $AgOR_n$ and $R_{n-1}COOH$ generated intermediately aggregate each other according to the reaction shown in formula (9), and $Ag_{k+m}(OR)_m$ and $Ag_{k+m}(OR_n)_m R_{n-1}COOH$ are generated as the composite silver nanoparticles. These composite silver nanoparticles are illustrated in formula (10) and (11). Said reaction is the surface reaction of carbonic acid silver microparticles, the reaction continues gradually from surface to inside, and the carbonic acid silver microparticles becoming the center cores convert to the silver cores. At last, the composite silver nanoparticles shown in formula (10) and (11) are generated. Formula (10) and (11) show the constitutive formula of the silver core and the organic coating layer formed around it.

There is one case that the organic coating layer is the alkoxide $OR_n$, and there is also the other case that it is the carboxylic acid $R_{n-1}COOH$. Of course, there is also another case of carboxylic acid group $R_{n-1}COO$ that desorption of H occurs from the carboxylic acid (fatty acid). Therefore, as for the organic coating layer, there exist alkoxide, alkoxide group, carboxylic acid, carboxylic acid group or their mixing form.

Table 1 shows the kind of raw material of composite silver nanoparticles (carbonic acid silver and alcohol), the mass and the mole ratio of excess alcohol solution. In addition, Table 1 shows the molecular weight of raw material of composite silver nanoparticles and the mole number of 100 g. Individual names of alcohol are shown in correspondence with the carbon number (C number). Example 1, example 2, example 3, example 4, example 5, example 6, example 7, example 8, example 9, example 10, example 11 and example 12 described below correspond to n=6, n=8, n=10, n=12, n=1, n=2, n=4, n=3, n=5, n=7, n=9 and n=11, respectively.

As shown in formula (D) described previously, the stoichiometry ratio is given by carbonic acid silver:alcohol=1 mol:2 mol in the gas reaction between carbonic acid silver and alcohol. However, as shown in Table 1, it becomes necessary to disperse the carbonic acid silver in excess alcohol. This is the reason to decrease the collision probability of generated composite silver nanoparticles and to prevent the aggregation of composite silver nanoparticles. As shown in Table 1, the mole ratio is prepared in the range of alcohol mole/carbonic acid silver mole=10-63.9, and it becomes the excess alcohol solution. Even in silver salt aside from carbonic acid silver, it is adjusted to the excess alcohol solution. Table 1 is as follows.

TABLE 1

Mass of Raw Materials of Composite Silver Nanoparticle and Mole Ratio of Excess Alcohol Solution

| Example No | C Number | Ag2CO3 Mass | Ag2CO3 Mole | Alcohol | Alcohol Mass | Alcohol Mole | Mole Ratio | Composite Silver Nanoparticle |
|---|---|---|---|---|---|---|---|---|
| Example 1 | 6 | 100 g | 0.363 mol | C6H13OH | 2300 g | 23.2 mol | 63.9 | C6AgAL |
| Example 2 | 8 | 100 g | 0.363 mol | C8H17OH | 880 g | 6.8 mol | 18.7 | C8AgAL |
| Example 3 | 10 | 100 g | 0.363 mol | C10H21OH | 2200 g | 14.0 mol | 38.6 | C10AgAL |
| Example 4 | 12 | 100 g | 0.363 mol | C12H25OH | 1120 g | 6.0 mol | 16.5 | C12AgAL |
| Example 5 | 1 | 100 g | 0.363 mol | CH3OH | 116 g | 3.63 mol | 10.0 | C1AgAL |
| Example 6 | 2 | 100 g | 0.363 mol | C2H5OH | 167 g | 3.63 mol | 10.0 | C2AgAL |
| Example 7 | 4 | 100 g | 0.363 mol | C4H9OH | 269 g | 3.63 mol | 10.0 | C4AgAL |
| Example 8 | 3 | 100 g | 0.363 mol | C3H7OH | 873 g | 14.52 mol | 40.0 | C3AgAL |
| Example 9 | 5 | 100 g | 0.363 mol | C5H11OH | 1280 g | 14.52 mol | 40.0 | C5AgAL |
| Example 10 | 7 | 100 g | 0.363 mol | C7H15OH | 2531 g | 21.78 mol | 60.0 | C7AgAL |
| Example 11 | 9 | 100 g | 0.363 mol | C9H19OH | 3142 g | 21.78 mol | 60.0 | C9AgAL |
| Example 12 | 11 | 100 g | 0.363 mol | C11H23OH | 3753 g | 21.78 mol | 60.0 | C11AgAL |

Molecular Weight and 100 g Mole Number of Raw Materials

| C Number | Raw Material | Molecular Formula | Molecular Weight | Mole Number of 100 g |
|---|---|---|---|---|
|  | Carbonic Acid Silver | Ag2CO3 | 275.744 | 0.363 |
| 1 | Methanol | CH3OH | 18.015 | 5.551 |
| 2 | Ethanol | C2H5OH | 18.015 | 5.551 |
| 3 | Propanol | C3H7OH | 60.096 | 1.665 |
| 4 | Butanol | C4H9OH | 18.015 | 5.551 |
| 5 | Pentanol | C5H11OH | 88.150 | 1.134 |
| 6 | Hexanol | C6H13OH | 18.015 | 5.551 |
| 7 | Heptanol | C7H15OH | 116.207 | 0.861 |
| 8 | Octanol | C8H17OH | 18.015 | 5.551 |
| 9 | Nonanol | C9H19OH | 144.258 | 0.693 |
| 10 | Decanol | C10H21OH | 18.015 | 5.551 |
| 11 | Undecanol | C11H23OH | 172.312 | 0.580 |
| 12 | Dodecanol | C12H25OH | 18.015 | 5.551 |

FIG. 3 is a detailed flow diagram showing the low temperature generation steps of composite silver nanoparticle concerning the present invention. In the step n=1, a predetermined amount of commercial silver salt is micronized with the mixer. Even if the mean diameter of the commercial silver salt is 10 μm, its variation is extremely large. It is uniformed to be the particle diameter of approximately 10 nm by the mixer. In the step n=2, the micronized silver salt powder is dispersed in the alcohol of excess amount. In the step n=3, the excess alcohol solution of silver salt is turned together with the beads, and it is gradually super-micronized by mashing the silver salt particles. The relation between the bead particle diameter and the super-micronization particle diameter of silver salt is described below by use of Table 2. In the step n=4, the beads are collected through the mesh. In the step n=5, the alcohol is finally added, so that the alcohol solution of an excessive predetermined mole ratio is prepared.

In the step n=6, the excess alcohol solution of the super-micronization silver salt is added into the reaction container, and in the step n=7, it is heated to a predetermined temperature. This predetermined temperature corresponds to the generation temperature PT. In the step n=8, it is heated only for a predetermined time at said predetermined temperature, and CnAgAL is generated. In the step n=9, only a predetermined amount of CnAgAL solution is sampled, and in the step n=10, the temperature raised up still more, so that CnAgAL is generated at a higher generation temperature. By this repetition, CnAgAL of various generation temperatures are produced. The extracted CnAgAL solution is rapidly and promptly cooled to 0° C. by iced water in the step n=11, and the generation reaction is stopped. In the step n=12, the alcohol is pressurized filtered from the extraction container, and in the step n=13, the generated CnAgAL is collected as the solid powder. In the step n=14, various CnAgAL generated at various generation temperatures are measured in various ways.

Table 2 is the relation table between the bead particle diameter and the super-micronization particle diameter of silver salt including $Ag_2CO_3$. The smaller the bead particle diameter, the smaller the super-micronization particle diameter, so that the particle diameter of CnAgAL generated above becomes small, too. The bead particle diameter exists in 1 mm-0.03 mm, and hence the super-micronization particle diameter can be freely controlled in the range of 5000 nm-10 nm.

TABLE 2

Raw Material Silver Salt Size: Size Distribution beyond 10 μm
Micronized Silver Salt Size: Uniform 10 μm
Super Micronization of Micronized Silver Salt due to Beads
(Rotation by the Revolution of 2000 rpm and Autorotation of 800 rpm)

| Beads Size (mm) | Rotation Time (min) | Silver Salt Super-Micronization Size (nm) |
|---|---|---|
| 0.03 | 5 | 10 |
| 0.05 | 5 | 50 |
| 0.1 | 5 | 200 |
| 0.2 | 5 | 800 |
| 0.5 | 5 | 2000 |
| 1 | 5 | 5000 |

Figure 4:
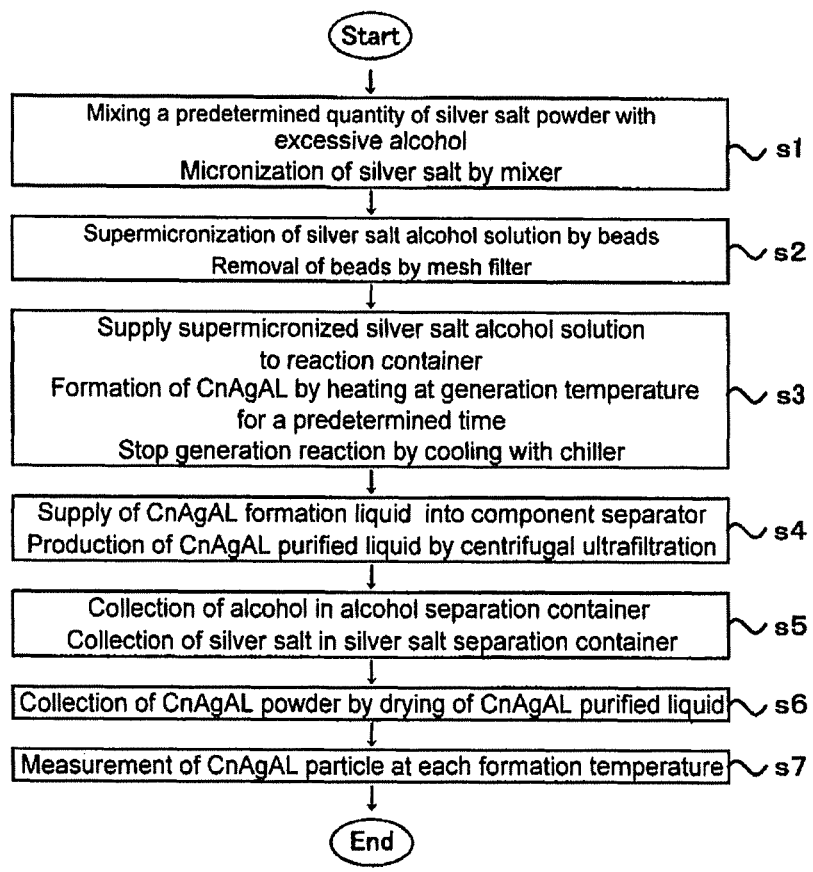
FIG. 4 is a detailed flow diagram of production apparatus showing the low temperature generation steps due to the production apparatus of composite silver nanoparticle concerning the present invention.

FIG. 4 is a detailed flow diagram of production apparatus showing the low temperature generation steps due to the production apparatus of composite silver nanoparticle concerning the present invention. This flow diagram corresponds to each production step of the production apparatus of FIG. 5. In the step s=1, a predetermined amount of silver salt powder is mixed with the excess alcohol, and the silver salt particles are uniformly micronized by the mixer. In the step s=2, the silver salt alcohol solution is super-micronized by the beads, and the beads are removed by the mesh filter. Therefore, the super-micronization silver salt alcohol solution is completed at this step. In the step s=3, the super-micronization silver salt alcohol solution is supplied to the reactor, it is heated at the generation temperature for the predetermined time (the generation time) and CnAgAL is generated. In here, the carbon number n of alcohol is set in the range of n=1-12. The extracted alcohol solution is cooled promptly and the generation reaction is stopped.

In the step s=4, the generated CnAgAL solution is supplied to the component purifier and CnAgAL purification liquid is produced through the centrifugal ultrafiltration. In the step s=5, the alcohol component of said alcohol solution is collected in the alcohol separation container, so that the silver salt is collected in the silver salt separation container. In the step s=6, the extraction solvent is vaporized by drying of said CnAgAL purification liquid and CnAgAL powder is collected. In the step s=7, The CnAgAL particles at each generation temperature are measured in various ways.

Figure 5:
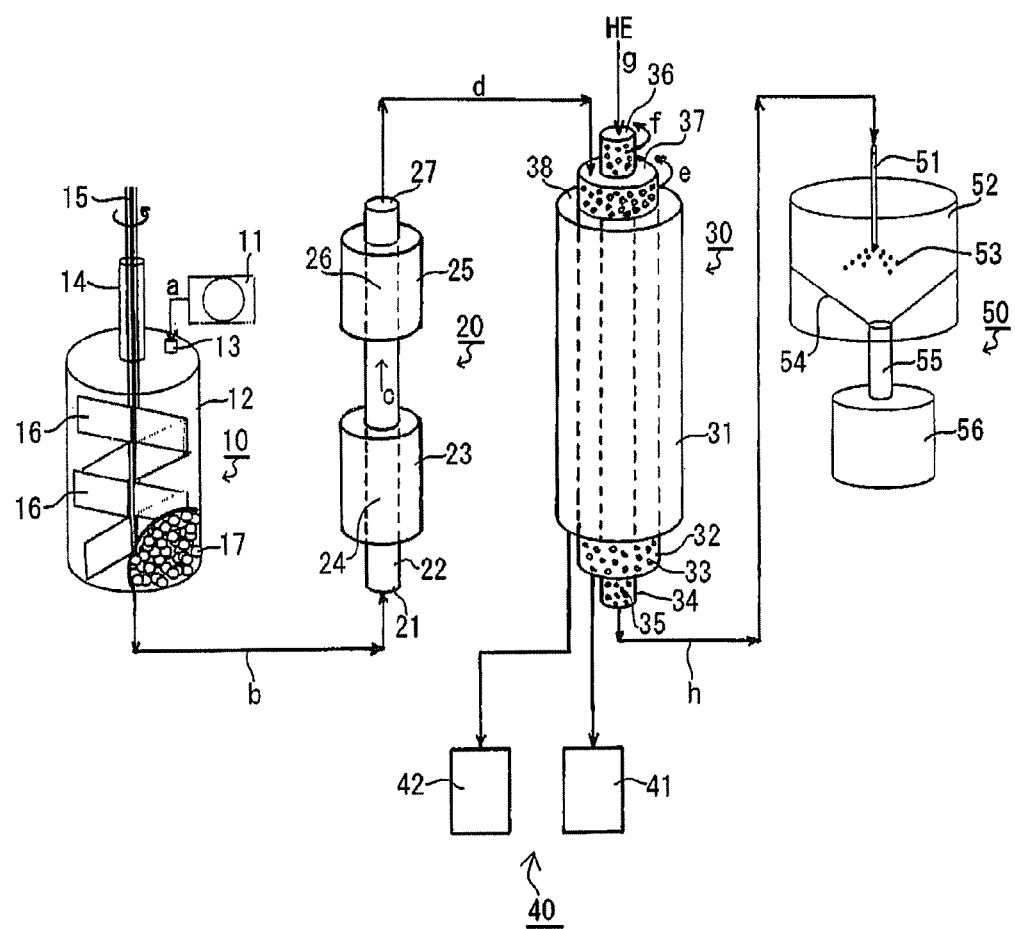
FIG. 5 is a schematic diagram of the production apparatus of composite silver nanoparticle concerning the present invention.

FIG. 5 is a schematic diagram of the production apparatus of composite silver nanoparticle concerning the present invention. The function of each part apparatus of the present production apparatus corresponds to each step shown in FIG. 4. The super-micronizer 10 is composed of the raw material mixer 11 and the super-micronization container 12. The predetermined excess quantity of alcohol and the predetermined amount of silver salt are added in the raw material mixer 11, in which the mixer is installed. This micronization excess alcohol solution is supplied from the input port 13 to the super-micronization container 12 in the arrow direction a. Because the interior of the super-micronization container 12 is filled with many beads 17, the rotation blade 16 rotates by the rotation axis inserted to the center tube 14, so that said silver salt micronization particles are mashed by the beads and the silver salt micronization particles are converted to the silver salt super-micronization particles. The super-micronization excess alcohol is supplied in the reactor 20 in the arrow direction b.

In the reactor 20, the super-micronization excess alcohol solution is supplied from the raw material supply port 21 to the reaction tube 22, and while being heated by the heater 23, CnAgAL is generated in the generation region 24. Furthermore, it is supplied in the arrow direction c, so that the reaction liquid is cooled to low temperature in the cooling region 26 by the chiller 25 and the generation reaction is rapidly stopped. Said generation alcohol solution is supplied from the generation output port 27 to the component purifier 30 in the arrow direction d.

The component purifier 30 is the triple tube composed of the outer tube 31, the middle tube 32 and the inner tube 34, in which the middle tube 32 rotates axially in the arrow direction e, the inner tube 34 rotates axially in the arrow direction f and the outer tube 31 is the fixed tube not rotating. The pores 35 having the size of the extent through which CnAgAL can pass are formed innumerably on the surrounding wall surface of the inner tube 34. At the same time, the super-pores 33 having the size of the extent through which alcohol molecule can pass are formed innumerably on the surrounding wall surface of the middle tube 32.

The inner path 36 is opened in the inner tube 34, the middle path 37 is formed in the gap between the inner tube 34 and the middle tube 32, and the outer path 38 is formed in the gap between the middle tube 32 and the outer tube 31. The extraction solvent HE such as hexane which diffusely disperses CnAgAL is supplied into the middle path 36. The generation alcohol solution emitted from the generation output port 27 is supplied to the middle path 37 in the arrow direction d.

The generated composite silver nanoparticles CnAgAL, the silver salt not reacted yet and the alcohol are included in the generation alcohol solution. The lightest alcohol molecule in mass goes to the outer path 38 through the super-pore 33 by the centrifugal force. CnAgAL diffuses into the extraction solvent HE of the inner path 36 through the pore 35. The silver salt not reacted yet remains in the middle path 37.

The middle separator 40 is composed of the alcohol separation container 42 and the silver salt separation container 41. The alcohol flowing out from the outer path 38 is collected to the alcohol separation container 42, and the silver salt not reacted yet flowing out from the middle path 37 is collected to the silver salt separation container 41. The extraction solvent which contained CnAgAL flowing out from the inner path 36 is supplied to the powder collector 50 in the arrow direction h.

The CnAgAL extraction solution is sprayed as the mist 53 from the spray 51 to the dryer 52, and the extraction solvent evaporates so that CnAgAL is made to the powder. The CnAgAL powder is collected from the hopper 54 to the powder collection container 56 through the collection tube 55.

Figure 6:
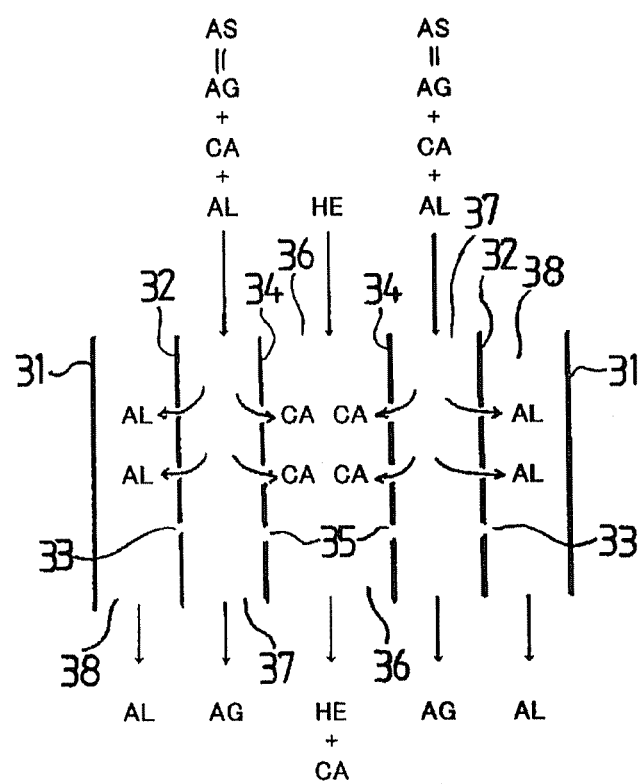
FIG. 6 is a purification method diagram due to the component purifier of production apparatus of FIG. 5.

FIG. 6 is a purification method diagram due to the component purifier of production apparatus of FIG. 5. The generation alcohol solution AS supplied to the middle path 37 is the mixture solution of the silver salt AG, the composite silver nanoparticles CA and the alcohol molecule AL. The extraction solvent HE is supplied to the middle path 36. By the powerful centrifugal force for the substances in the middle path 37, the lightest alcohol molecule AL in mass is exhausted from the super-pore 33 to the outer path 38. The composite silver nanoparticles CA diffusely seeps into the extraction solvent HE from the pore 35. As a result, the extraction solution which contained the composite silver nanoparticles CA is drained from the inner path 36, the silver salt not reacted yet AG is exhausted from the middle path 37 and the alcohol AL is exhausted from the outer path 38. In this way, three kinds of materials are separated and collected.

Example 1

C6AgAL

Table 3 is a table summarizing the measurement data obtained from the experiments concerning to C6AgAL as "the generation amount of C6AgAL in the low temperature generation reaction", "the mass of each material amount in the low temperature generation of C6AgAL" and "the relation between the generation temperature and the characteristic temperatures of C6AgAL". In "the generation amount of C6AgAL in the low temperature generation reaction", as shown in table, there is described the detailed experimental data relating to the generation time and the generation amount of C6AgAL for each generation temperature. In "the mass of each material amount in the low temperature generation of C6AgAL", there is described the mass ratio between carbonic acid silver and C6AgAL contained in the generation material, and the mass ratio between organic component and Ag contained in C6AgAL, in said each generation temperature (70° C., 80° C., 90° C., 100° C., 111.5° C.). In here, total mass of the generation material or C6AgAL is put at 1. In "the relation between the generation temperature and the characteristic temperatures of C6AgAL", there is described the TG decrease start temperature T1 (° C.), the DTA peak temperature T2 (° C.) and the metalization temperature T3 (° C.) concerning to C6AgAL generated at said each generation temperature PT (° C.).

As thus described, the generation temperature PT can be varied freely, and when the generation temperature PT increases, there is shown the tendency that the decomposition start temperature T1 corresponding to the TG decrease start temperature, the decomposition temperature T2 corresponding to the DTA first peak temperature and the metalization temperature T3 corresponding to the DTA final peak end temperature gradually increase. Therefore, while the generation temperature PT is set so that the decomposition temperature T2 becomes equal to or less than 150° C., it is possible to produce the composite silver nanoparticles designed freely. The metalization temperature T3 increases by several degrees than the decomposition temperature T2. In the thermal analysis, TG curve shows the weight decrease with % in the thermogravimetry curve, and what TG curve starts the decrease shows that the organic material is gasified from the organic coating layer. Therefore, the TG decrease start temperature, namely the decomposition start temperature T1 is equivalent to the decomposition start temperature of the organic material. DTA curve shows the generation of heat with μV in differential thermal analysis curve. What DTA curve rises shows the generation of heat due to decomposition reaction, and what DTA curve decreases shows the cooling. When DTA curve forms a peak, it shows that the generation of decomposition heat reaches the maximum at the peak temperature, and shows that the decomposition reaction reaches the peak. In the case that a plurality of DTA peaks exist, the decomposition temperature is defined by the DTA first peak temperature. The present inventor considers that the DTA final peak in DTA peaks is the emission peak of the binding energy by which the naked silver cores bond each other after the organic coating layer is gasified. Therefore, the DTA first peak temperature shows the decomposition temperature at which the decomposition of organic material advances with the maximum rate. When the organic material is perfectly gasified, the generation of heat stops, so that said peak falls rapidly and the temperature at which the falling has finished is equivalent to the metalization (silverization) temperature T3. In other words, TG curve falls down rapidly at the decomposition temperature T2, and the total amount of organic material is gasified, so that TG curve converges to the constant value at the metalization temperature T3. After having passed said DTA peak, when DTA curve increases and decreases, and TG curve decreases, it shows that another reaction aside from the composite silver nanoparticles occurs and the individual analysis becomes necessary. At all events, the DTA first peak appearing in DTA curve shows the decomposition and gasification of the organic coating layer in composite silver nanoparticles.

TABLE 3

Generation Amount of C6AgAL in Low Temperature Generation Reaction

| Generation Temp. (° C.) | Generation Time (min) | Generation Amount at Each Temp.(g) | Generation Amount per min(g) | Integration Time(min) | Integration Amount(g) | Integration Amount per min(g) |
| --- | --- | --- | --- | --- | --- | --- |
| 70 | 22 | 9.1 | 0.41 | 22 | 9.1 | 0.41 |
| 80 | 22 | 5.1 | 0.23 | 44 | 14.2 | 0.32 |
| 90 | 17 | 9 | 0.53 | 61 | 23.2 | 0.38 |
| 100 | 18 | 11.8 | 0.66 | 79 | 35 | 0.44 |
| 111.5 | 14 | 37.5 | 2.68 | 93 | 72.5 | 0.78 |

Mass(%) of Each Material Amount in Low Temperature Generation of C6AgAL

| Carbonic Acid Silver (%) | C6AgAL(%) | Organic Component Amount(%) | Ag Amount(%) |
| --- | --- | --- | --- |
| 0.909 | 0.091 | 0.124 | 0.876 |
| 0.858 | 0.142 | 0.107 | 0.893 |
| 0.768 | 0.232 | 0.088 | 0.912 |
| 0.650 | 0.350 | 0.080 | 0.920 |
| 0.275 | 0.725 | 0.050 | 0.950 |

Relation Between Generation Temperature and Characteristic Temperature of CnAgAL

| Generation Temp. PT(° C.) | Decomposition Start Temp. T1(° C.) | Decomposition Temp. T2(° C.) | Metalization Temp. T3(° C.) |
| --- | --- | --- | --- |
| 70 | 104 | 129 | 131 |
| 80 | 104 | 133 | 134.6 |
| 90 | 104 | 132 | 134 |
| 100 | 104.5 | 137 | 144.5 |
| 111.5 | 105 | 152 | 161 |

Figure 7:
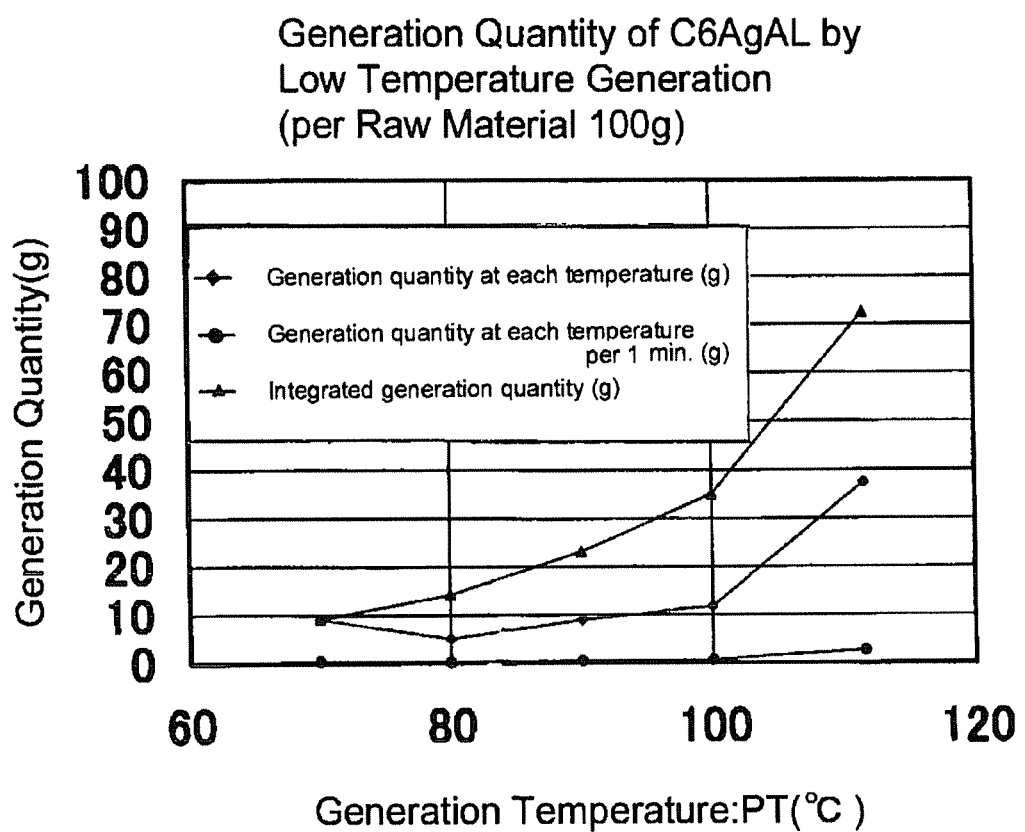
FIG. 7 is a relation diagram between generation quantity and generation temperature of C6AgAL concerning the present invention.

FIG. 7 is a relation diagram between generation quantity and generation temperature of C6AgAL concerning the present invention. The vertical line is the generation quantity (g) of C6AgAL, and the each temperature generation quantity (g), each temperature generation quantity (g) per one minute and the integration generation quantity (g) are plotted for each generation temperature PT (° C.) with black rhombus, black circle and black triangle, respectively. As found clearly from the diagram, C6AgAL is generated even in less than 100° C., and it is confirmed that the composite silver nanoparticles of the present invention are generated at low temperature.

Figure 8:
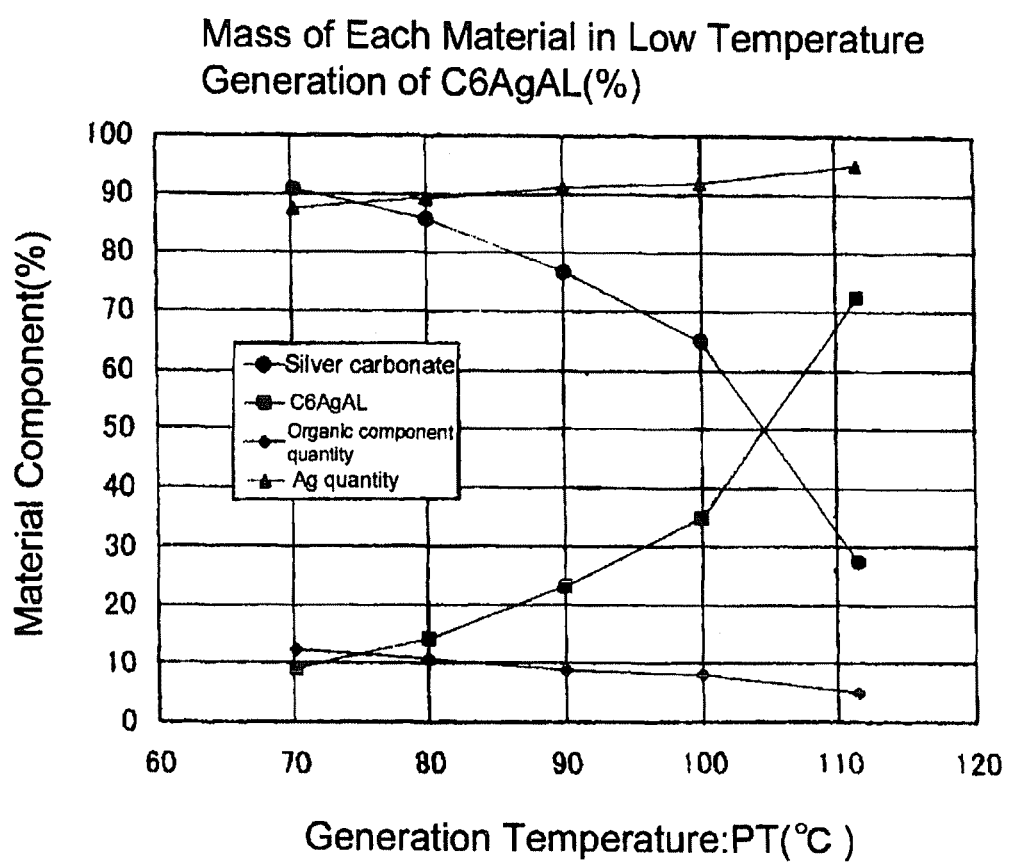
FIG. 8 is a relation diagram between material component (%) and generation temperature of C6AgAL concerning the present invention.

FIG. 8 is a relation diagram between material component (%) and generation temperature of C6AgAL concerning the present invention. That is to say, in FIG. 8, the mass ratios (%) of carbonic acid silver and C6AgAL described in "the mass of each material amount in the low temperature generation of C6AgAL" of Table 3 are plotted for the generation temperature PT (° C.) with black circle and black quadrangle, respectively, and the mass ratios (%) of organic component amount and Ag quantity contained in C6AgAL are plotted for the generation temperature PT (° C.) with black rhombus and black triangle, respectively. With rise of generation temperature, the mass ratio of carbonic acid silver (black circle) decreases, and the mass ratio of C6AgAL (black quadrangle) increases, so it is found that C6AgAL is generated by use of carbonic acid silver as raw material. In particular, even in the generation temperature of less than or equal to 100° C., C6AgAL is generated, and it is confirmed that the composite silver nanoparticles of the present invention are generated at low temperature by use of carbonic acid silver as raw material. Furthermore, as for the generated C6AgAL, the ratio of Ag quantity (black triangle) is high in the low-temperature generation, so it is found that the preferable composite silver nanoparticles are generated. Therefore, the composite silver nanoparticles of the present invention have the high metal component rate, so it is the preferable material as substitute solder. This situation is demonstrated.

FIG. 9 to FIG. 13 show the thermal analysis diagrams of C6AgAL at the generation temperature PT=70° C., 80° C., 90° C., 100° C. and 110° C., respectively with the temperature up rate VT=1° C./min concerning the present invention. In the diagram, the arrow PT, T1, T2 and T3 show the generation temperature, the decomposition start temperature, the decomposition temperature and the metalization temperature, respectively, and these concrete temperatures are described in "the relation between the generation temperature and the characteristic temperatures of C6AgAL", and they are estimated from the thermal analyses of FIG. 9-FIG. 13. Let us explain by use of FIG. 9 as a representative. When the temperature becomes higher than the decomposition temperature T1 in DTA (differential thermal analysis), it is found that the heat dissipation quantity clearly increases because the organic coating layer of C6AgAL is decomposed. Moreover, the heat dissipation quantity due to decomposition of the organic coating layer shows the peak value at the decomposition temperature T2. These results coincide with TG (thermogravimetry measurement), and in the higher temperature side than the decomposition start temperature T1, it is found that the mass decreases due to decomposition of the organic coating layer. Total amount of the organic coating layer is gasified at the metalization temperature T3 at which said DTA final peak falls down, and it shows the completeness of silverization in which the silver cores of composite silver nanoparticles bond each other.

Figure 9:
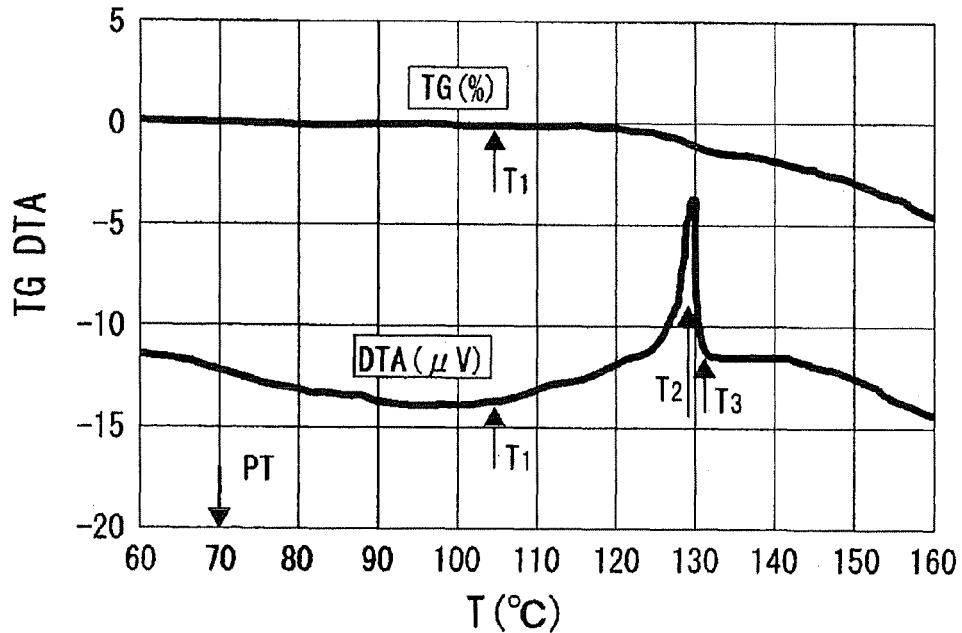
FIG. 9 is a thermal analysis diagram of C6AgAL at generation temperature PT=70° C. concerning the present invention.
Figure 10:
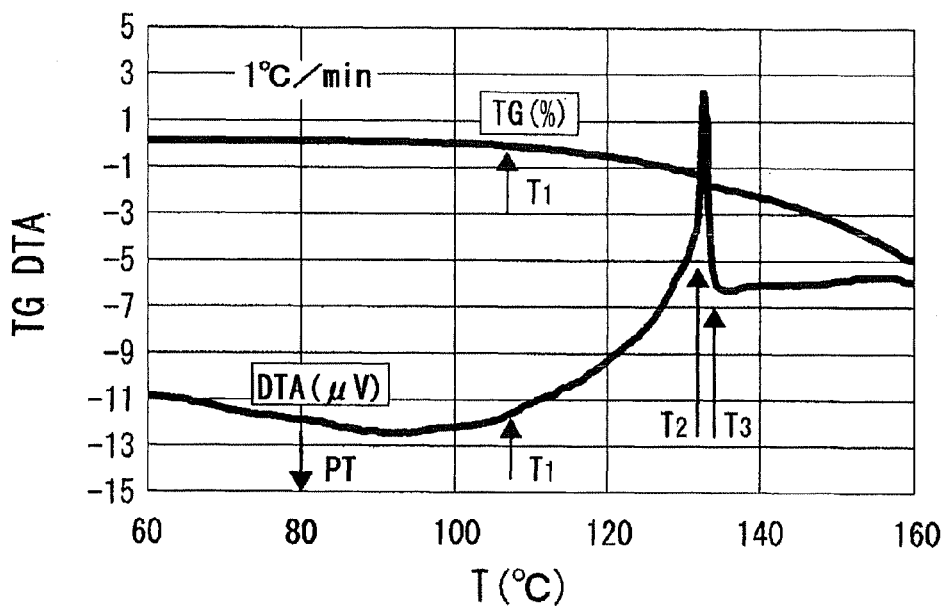
FIG. 10 is a thermal analysis diagram of C6AgAL at generation temperature PT=800 (temperature up rate 1° C./min) concerning the present invention.
Figure 11:
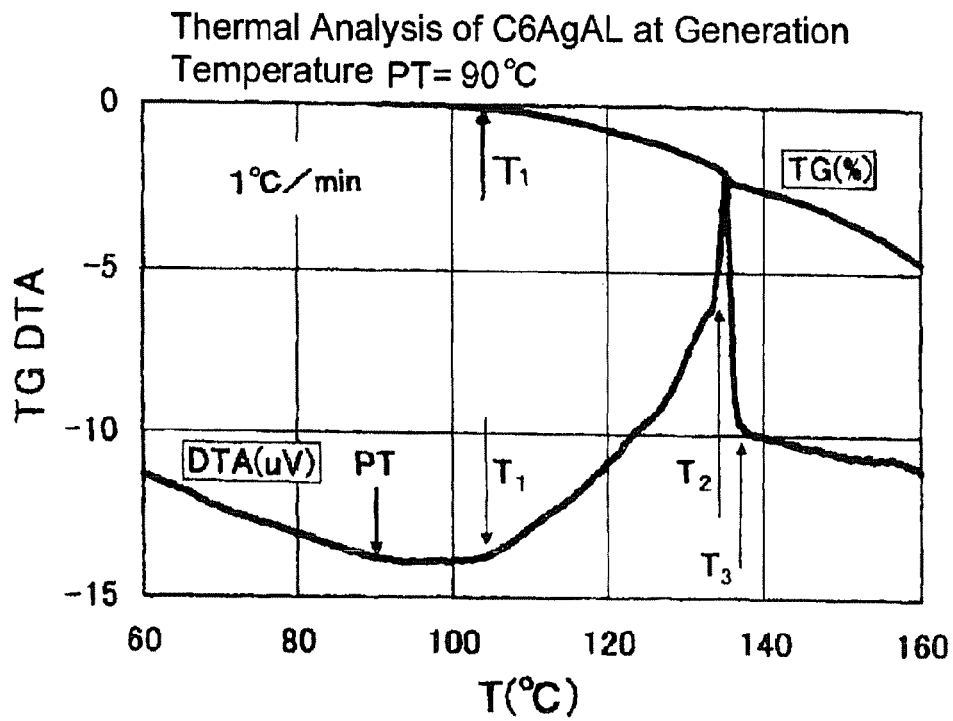
FIG. 11 is a thermal analysis diagram of C6AgAL at generation temperature PT=90° C. (temperature up rate 1° C./min) concerning the present invention.
Figure 12:
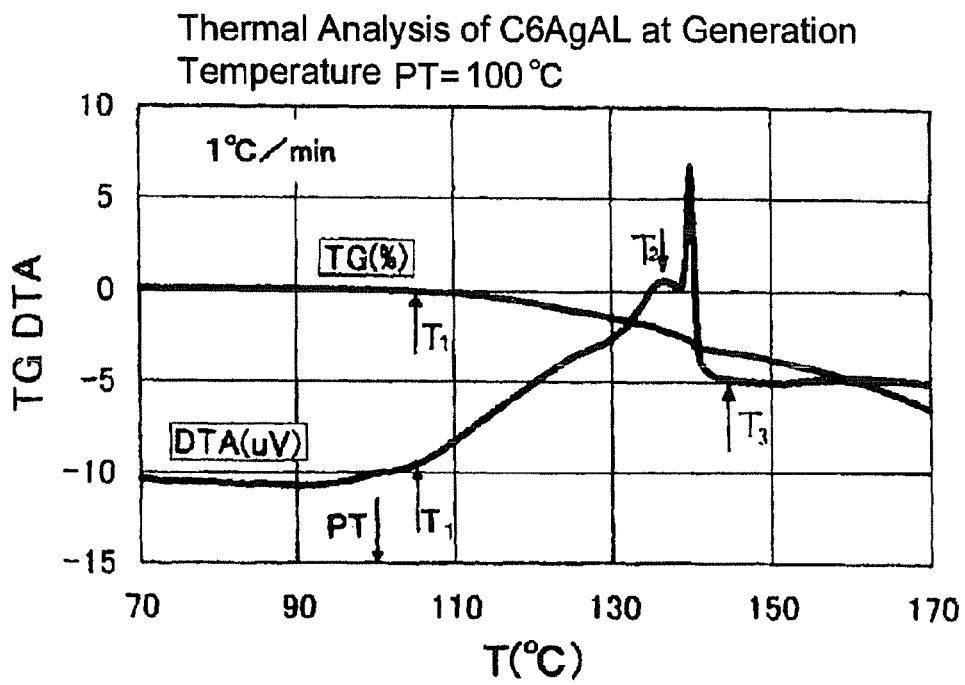
FIG. 12 is a thermal analysis diagram of C6AgAL at generation temperature PT=100° C. (temperature up rate 1° C./min) concerning the present invention.
Figure 13:
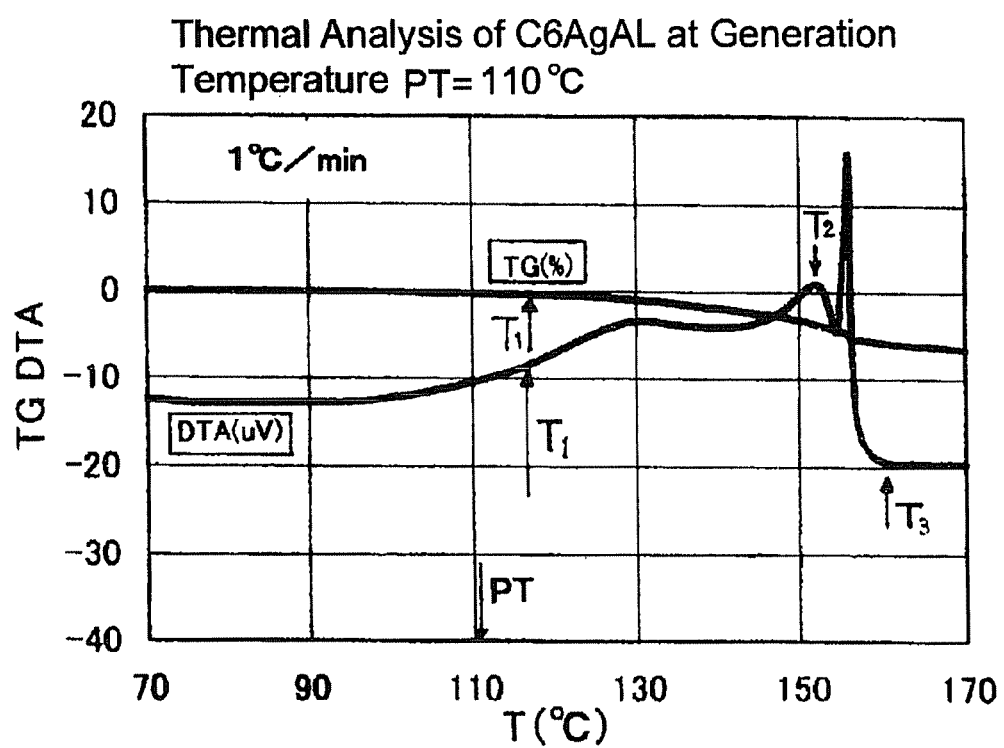
FIG. 13 is a thermal analysis diagram of C6AgAL at generation temperature PT=110° C. (temperature up rate 1° C./min) concerning the present invention.

In FIG. 9-FIG. 11, DTA peak is the single peak, but in FIG. 12-FIG. 13, DTA peak becomes the double peaks. As described above, DTA first peak is the decomposition peak that the decomposition occurs rapidly, and DTA final peak, namely DTA second peak is the binding energy peak of the naked silver cores, and this way of thinking facilitates understanding. In a fact, there are the DTA first peak and the DTA second peak even in FIG. 9-FIG. 11, but it is considered that it is seen in single peak by overlap because they come close mutually.

Furthermore, as shown in FIG. 12, the large peak value of heat dissipation quantity appears in the DTA first peak temperature T2 and the depression is seen in TG, too. In addition, TG becomes constant value in the metalization temperature T3 at which said DTA final peak falls down. Afterwards, TG decreases slowly, because it is thought that the organic material of the carbonic acid silver being the impurities decreases. In addition, In FIG. 12-FIG. 13, DTA final peak appears while continuing in DTA first peak, and the DTA first peak temperature T2 and the metalization temperature T3 of this first peak are estimated as the characteristic temperatures. As shown in FIG. 9-FIG. 12, when the generation temperature PT exists in the range of 70° C.-100° C., the decomposition temperature T2 and the metalization temperature T3 becomes less than 150° C. Besides, the decomposition start temperature T1 is included in the range of the 60° C. downward region of the decomposition temperature T2. That is to say, if using C6AgAL obtained at the generation temperature less than 100° C., it is possible to provide the preferable substitute solder material that the contained organic material is decomposed and metalized in less than 150° C. In addition, in FIG. 13, the decomposition temperature T2 and the metalization temperature T3 become T2=153° C. and T3=161° C., respectively, but they are slightly gone over 150° C., and it can be used as the substitute solder material. In addition, since T1=105° C., the TG decrease start temperature T1 is included in the range of the 60° C. downward region of DTA peak temperature T2.

Example 2

C8AgAL

Table 4 is a table in which the measurement results of plasmon absorption and aldehyde absorption in the low temperature production of C8AgAL are described. While raising the temperature in the reaction tube, the sample is picked in each temperature, and the optical densities (O.D.) of absorption peak (wave length: 410 nm) and aldehyde absorption (wave length: 290 nm) of nanoparticle plasmon are measured. The reaction time is the time reaching each temperature, and is equivalent to the generation time. Additionally, the peak position of nanoparticle plasmon is equivalent to the resonance energy of surface plasmon in nanoparticles.

TABLE 4

Measurement of Plasmon Absorption and Aldehyde Absorption in Low Temperature Generation of C8AgAL

| Reaction Temperature (° C.) | Reaction Time (min) | Plasmon Absorption Peak 410 nm | Aldehyde Absorption Optical Density 290 nm |
|---|---|---|---|
| 30 | 0 | | |
| 60 | 3 | 0.04 | 0.004 |
| 70 | 5 | 0.1 | 0.006 |
| 90 | 10 | 0.4 | 0.008 |
| 105 | 15 | 0.025 | 0.01 |
| 115 | 20 | 0.005 | 0.02 |
| 120 | 25 | 0.003 | 0.03 |
| 125 | 30 | 0.002 | 0.05 |
| 130 | 35 | | 0.09 |

Figure 14:
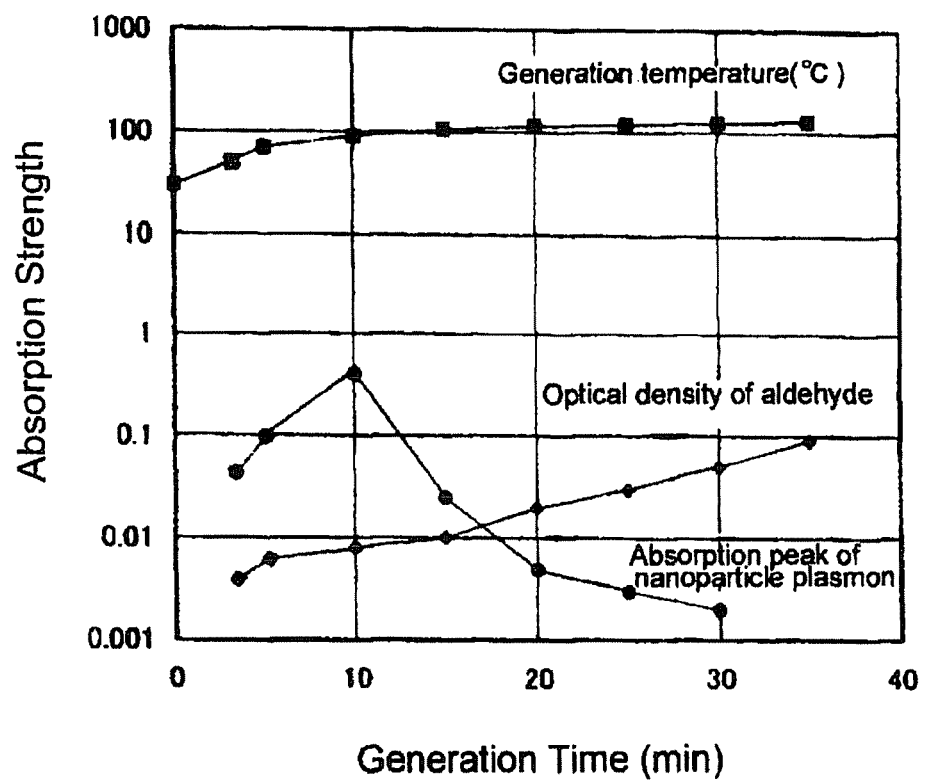
FIG. 14 is a relation diagram between absorption strength and generation temperature of C8AgAL concerning the present invention.

FIG. 14 is a relation diagram between absorption strength and generation temperature of C8AgAL concerning the present invention. This diagram is a diagram that the absorption strength and the reaction temperature (generation temperature) described in Table 4 are plotted for the reaction time, and the absorption strength of nanoparticle plasmon and the aldehyde optical density are plotted with black circle and black rhombus, respectively. As stated in explanation of FIG. 2, carbonic acid silver on the surface of a carbonic acid silver microparticle reacts with alcohol, and aldehyde $R_{n-1}CHO$ is generated simultaneously with silverization, so that the carbonic acid silver is reduced and silverized by the powerful reducing action of aldehyde and the carboxylic acid $R_{n-1}COOH$ is formed. The Ag, $AgOR_n$ and $R_{n-1}COOH$ generated intermediately aggregate each other and the composite silver nanoparticle is generated. In FIG. 14, the absorption strength of nanoparticle plasmon suddenly increases for first 10 minutes, and it is found that the nanoparticles grow rapidly. On the other hand, the aldehyde optical density increases slowly, and as stated above, while the carbonic acid silver is silverized by the reaction with alcohol, the silverization of carbonic acid silver is strengthened by the reducing reaction of aldehyde generated, and it is found that the composite silver nanoparticles are generated with high efficiency for a short time. Furthermore, the generation temperature (reaction temperature) for the generation time of 10 minutes is 90° C., and it is demonstrated from this measurement that the composite silver nanoparticles are generated with high efficiency in less than 100° C. In addition, it is considered that the decrease of absorption strength of nanoparticle plasmon is due to the increase of the composite silver nanoparticles generated while aggregating.

Additionally, also in C6AgAL of example 1, the nanoparticle plasmon absorption strength and aldehyde optical density are measured, but the same results as example 2 are obtained. Hence, description of the measurement results is omitted. In addition, the same results as the example 1 are obtained also in the thermal analysis relating to the example 2, and the generation of composite silver nanoparticles is confirmed in less than 100° C. Moreover, DTA peak temperature T2 is less than 150☐, and it is confirmed that the TG decrease start temperature T1 is included in the range of the 60° C. downward region of said T2 and is confirmed that the decomposition of the organic coating layer and the metalization occur in less than 150° C.

Example 3

C10AgAL

Figure 15:
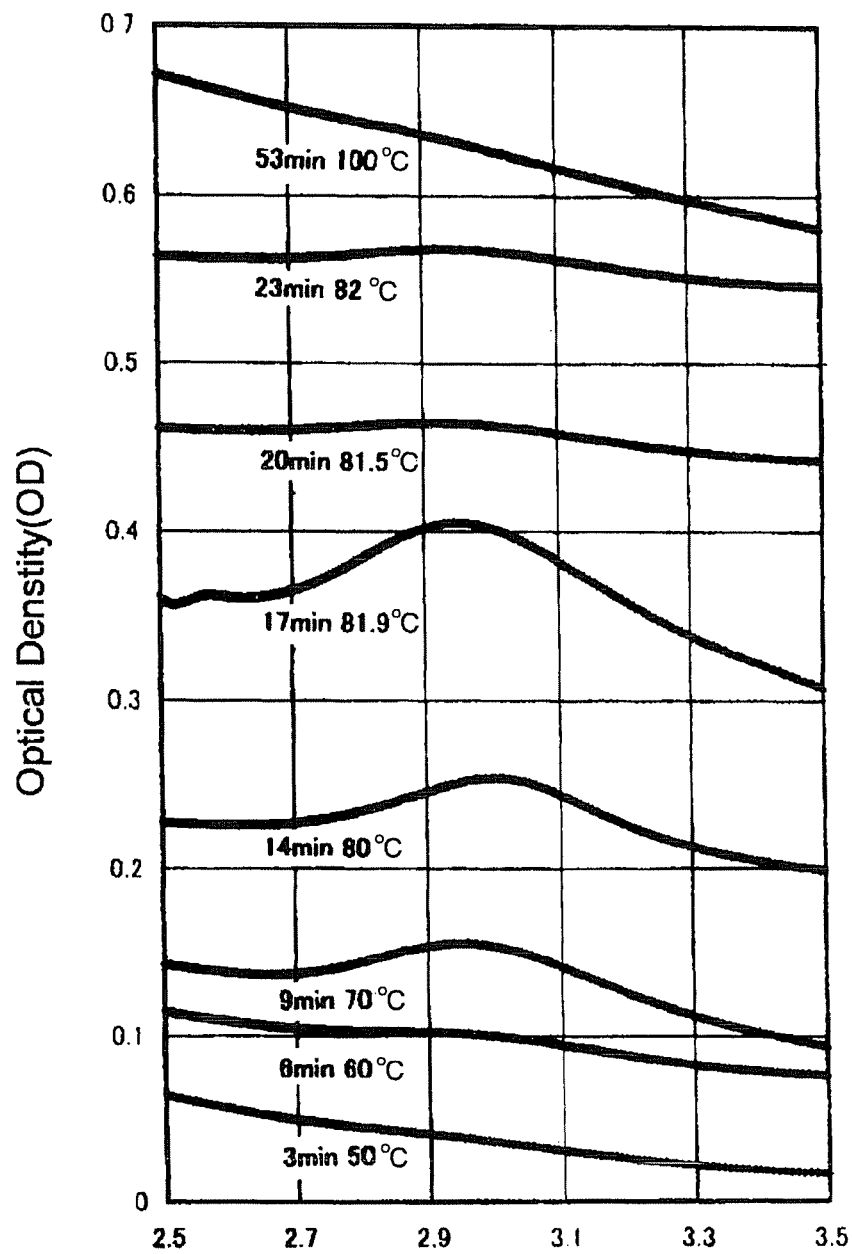
FIG. 15 is a relation diagram between optical concentration and photon energy of surface plasmon transition region showing the generation of C10AgAL concerning the present invention.

FIG. 15 is a relation diagram between optical concentration and photon energy of surface plasmon transition region showing the generation of C10AgAL concerning the present invention. As for C10AgAL, in the same manner as example 2, the optical measurement in the surface plasmon transition region is performed, and as shown in the diagram, the growth of absorption strength due to the surface plasmon of nanoparticles with temperature up is measured. In the generation of C10AgAL, the absorption due to the surface plasmon becomes the maximum in the spectrum of generation temperature of 81.9° C. and generation time of 17 min.

Figure 16:
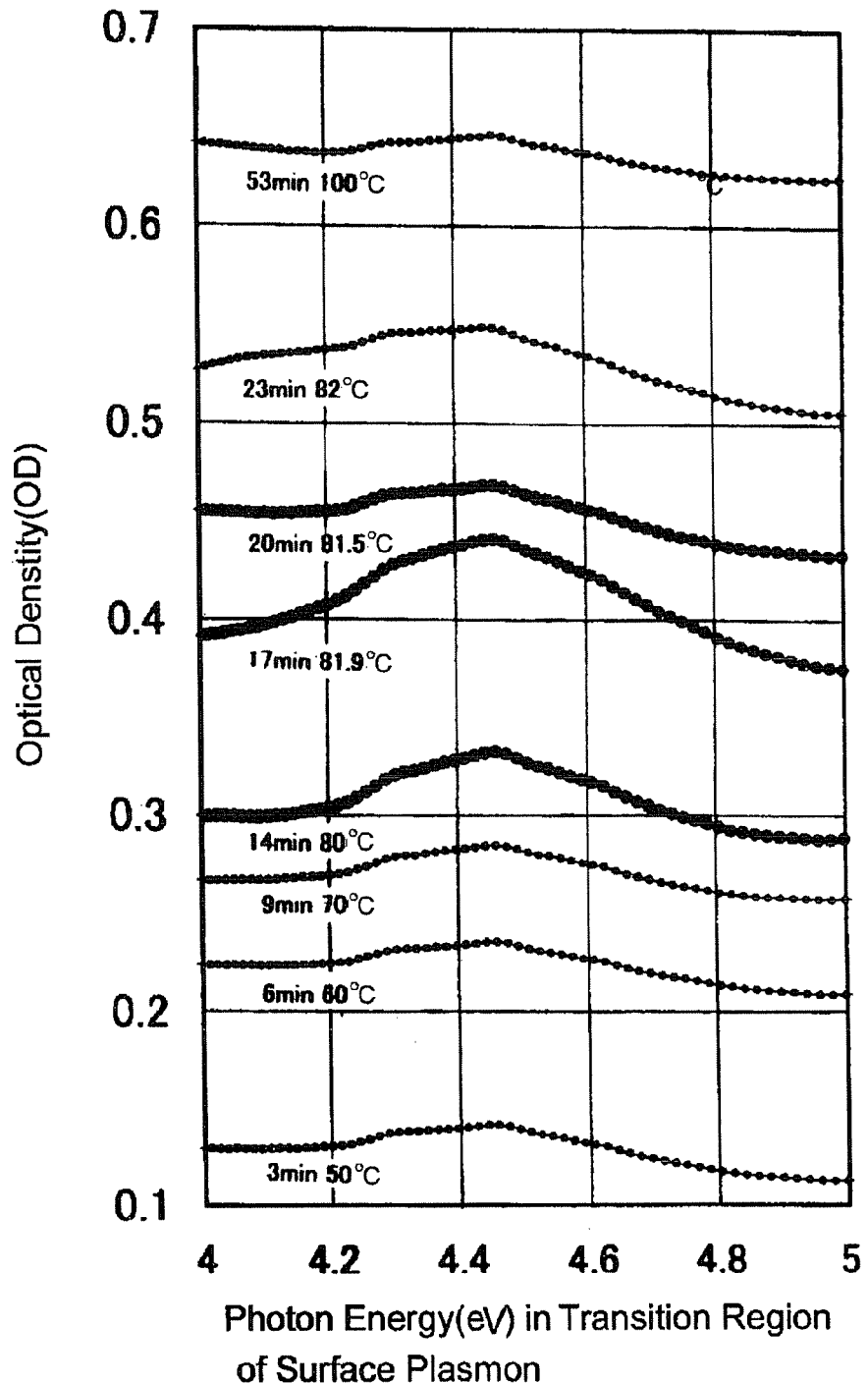
FIG. 16 is a relation diagram between optical concentration and photon energy of surface plasmon transition region showing the aldehyde generation in generation of C10AgAL concerning the present invention.

FIG. 16 is a relation diagram between optical concentration and photon energy of surface plasmon transition region showing the aldehyde generation in generation of C10AgAL concerning the present invention. The carbonic acid silver on the surface of the carbonic acid silver microparticles reacts with alcohol, and the aldehyde is generated simultaneously with silverization, so that the increase of absorption strength due to aldehyde is measured with the temperature up and increase of generation time. That is to say, the aldehyde absorption becomes the maximum in the generation temperature of 81.9° C. and the generation time of 17 min, and it is proved that the reduction of carbonic acid silver is promoted by aldehyde.

Figure 17:
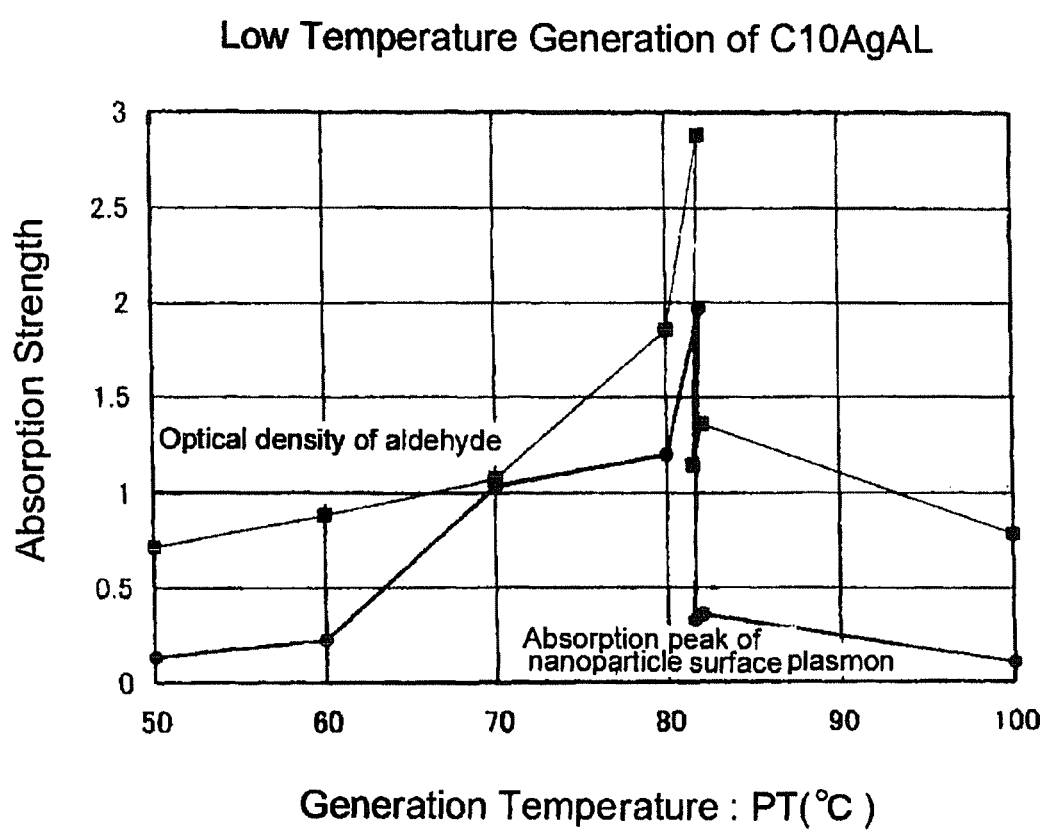
FIG. 17 is a relation diagram between absorption strength and generation temperature of C10AgAL concerning the present invention.

FIG. 17 is a relation diagram between absorption strength and generation temperature of C10AgAL concerning the present invention. In this diagram, the absorption strength of surface plasmon and the aldehyde optical density shown in FIG. 15 and FIG. 16 are plotted for the generation temperature with black circle and black quadrangle, respectively. Before the generation temperature PT arrives at 100° C., it is found that the absorption strength of surface plasmon suddenly increases and the aldehyde absorption increases. That is to say, as described above, the carbonic acid silver is silverized by the reaction with alcohol, and the silverization of carbonic acid silver is reinforced by the reducing reaction due to aldehyde generated, so the composite silver nanoparticles are generated with high efficiency in less than 100° C.

Table 5 is a list of "dependency between generation temperature and generation time of plasmon absorption of C10AgAL" and "dependency between generation temperature and generation time of aldehyde absorption of C10AgAL". While gradually raising the temperature of the reaction container (generation temperature), the plasmon absorption and the aldehyde absorption were measured.

TABLE 5

| | Generation Temperature (° C.) | Generation Time (min) |
|---|---|---|
| Dependency of Generation Time and Generation Temperature of Plasmon Absorption of C10AgAL | | |
| Plasmon Absorption Strength on Nanoparticle Surface | | |
| 0.134 | 50 | 3 |
| 0.228 | 60 | 6 |
| 1.034 | 70 | 9 |
| 1.2 | 80 | 14 |
| 1.966 | 81.9 | 17 |
| 0.331 | 81.5 | 20 |
| 0.362 | 82 | 23 |
| 0.103 | 100 | 53 |
| Dependency of Generation Time and Generation Temperature of Aldehyde Absorption of C10AgAL | | |
| Aldehyde Generation Density | | |
| 0.714 | 50 | 3 |
| 0.886 | 60 | 6 |
| 1.071 | 70 | 9 |
| 1.857 | 80 | 14 |
| 2.886 | 81.9 | 17 |
| 1.143 | 81.5 | 20 |
| 1.357 | 82 | 23 |
| 0.786 | 100 | 53 |

Figure 18:
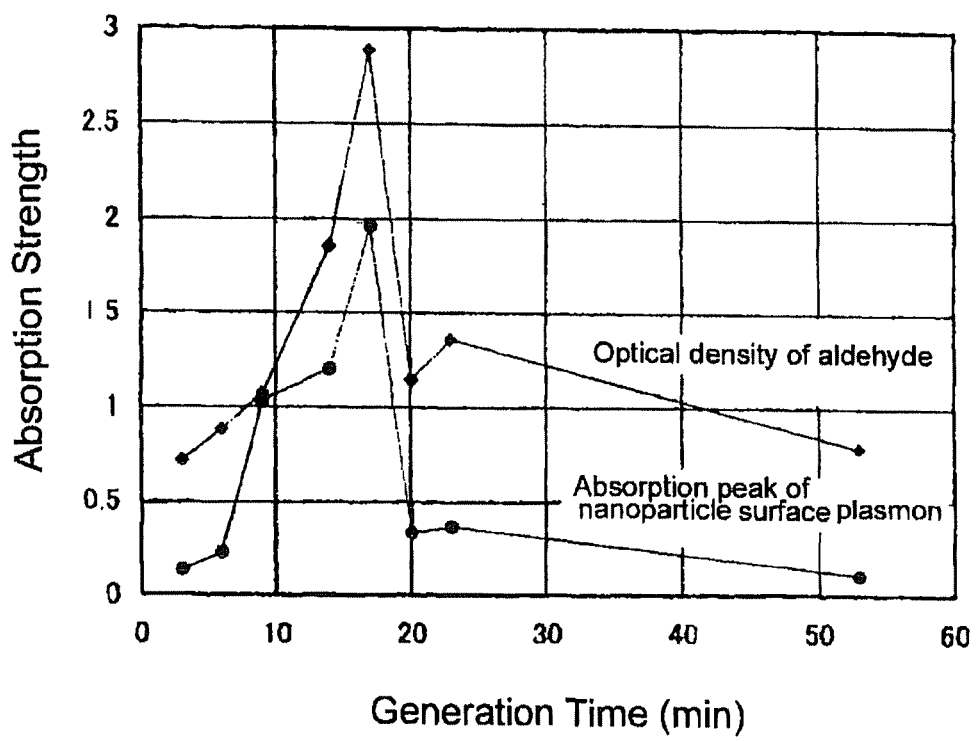
FIG. 18 is a relation diagram between absorption strength and generation time of C10AgAL concerning the present invention.

FIG. 18 is a relation diagram between absorption strength and generation time of C10AgAL concerning the present invention. In this diagram, the absorption strength of surface plasmon and the aldehyde optical density shown in Table 5 are plotted for the generation time with black circle and black rhombus, respectively. The absorption strength and aldehyde absorption of surface plasmon suddenly increase, and they become the maximum at the generation time of 17 min. The carbonic acid silver is silverized by the reaction with alcohol, and it is found that the silverization of carbonic acid silver is performed with high efficiency by the reducing reaction of aldehyde generated. It is recognized that the generation temperature PT is equal to or less than 100° C. and the generation of C10AgAL occurs rapidly within dozens of minutes.

Figure 19:
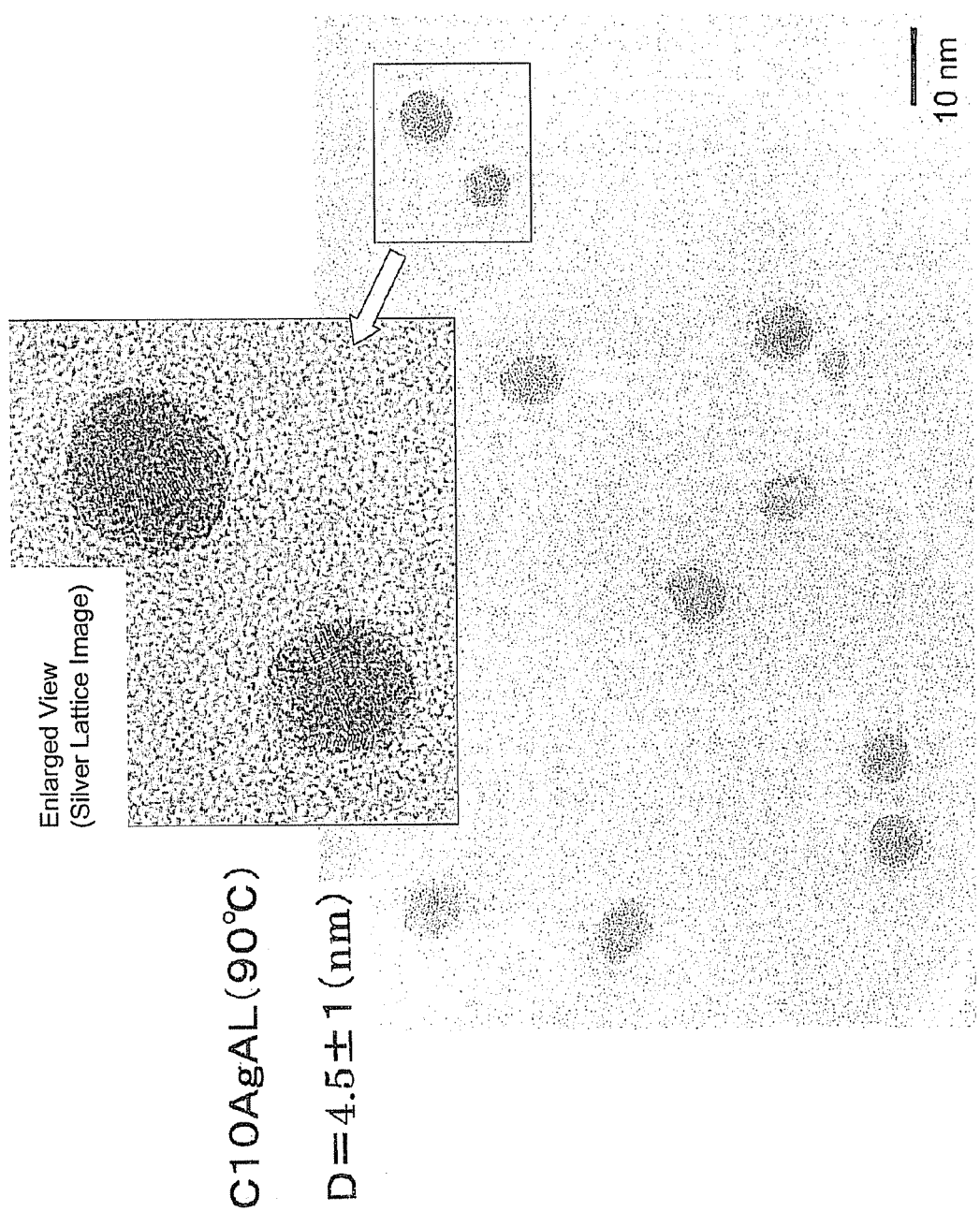
FIG. 19 is a transmission electron microscopy diagram showing the lattice image of C10AgAL generated at 90° C.

FIG. 19 is a transmission electron microscopy diagram showing the lattice image of C10AgAL generated at 90° C. In the enlarged diagram of the transmission electron microscope image, the lattice image of silver core of silver nanoparticle is seen definitely, and it is demonstrated that the crystallinity is extremely high. It was found that the silver core almost became a single crystal from this lattice image. By this high crystallinity, it can be concluded that the composite silver nanoparticles of the present invention have high electrical conductivity and high thermal conductivity. In addition, because the organic coating layer of composite silver nanoparticles cannot be observed by the transmission electron microscope, it is not seen in the diagram, but it is clear that the organic coating layer is formed from the experimental results stated above. Furthermore, the diameters of 3000 composite silver nanoparticles are measured, and the mean diameter D is estimated at D=4.5±1 (nm), so it is found that the composite silver nanoparticles with the preferable size are obtained.

Example 4

C12AgAL

Figure 20:
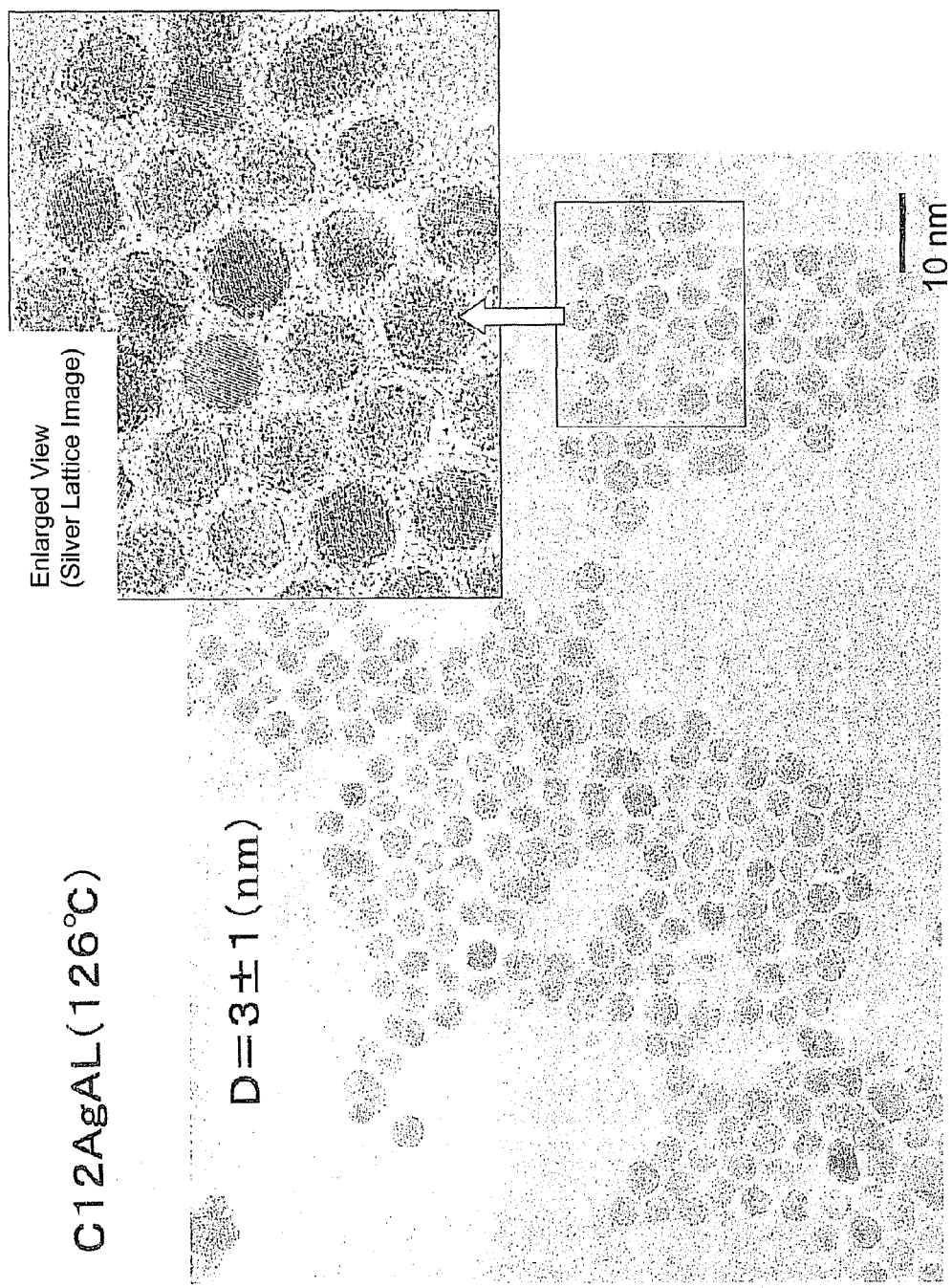
FIG. 20 is a transmission electron microscopy diagram showing the lattice image of C12AgAL generated at 126° C.

FIG. 20 is a transmission electron microscopy diagram showing the lattice image of C12AgAL generated at 126° C. Also as for C12AgAL, the transmission electron microscope image is observed, and in its enlarged diagram, the lattice image of silver nanoparticle is seen definitely and it is found that it crystallizes highly. From this lattice image, it can be judged to be almost single crystal. By this single crystallinity, it is concluded that the composite silver nanoparticles of the present invention have high electrical conductivity and high thermal conductivity.

The diameters of 3000 composite silver nanoparticles are measured, and the mean diameter D is estimated at $D=3\pm1$ (nm). The generation temperature of C12AgAL exceeds 126° C. and 100° C., but the composite silver nanoparticles with the extremely small diameter of $D=3\pm1$ (nm) are obtained.

Figure 21:
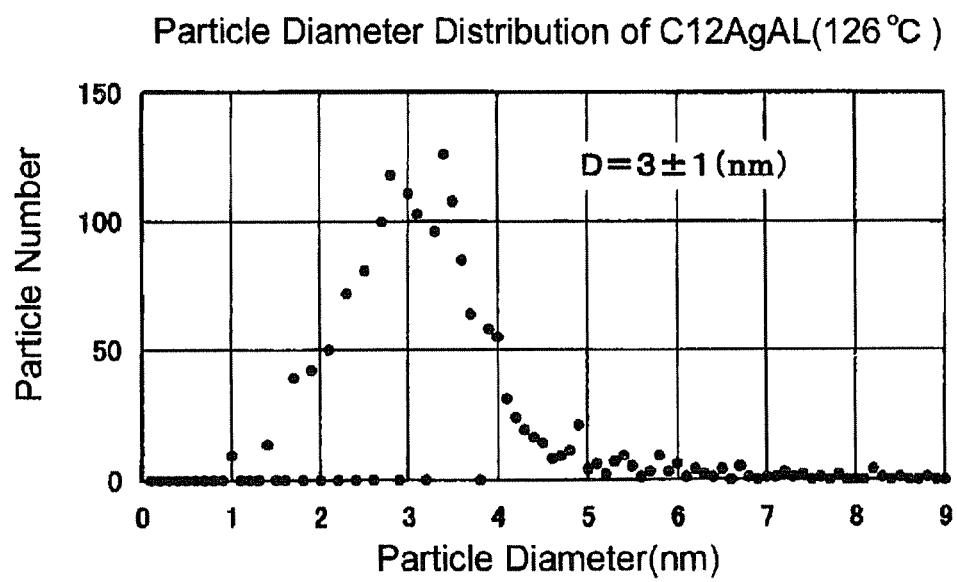
FIG. 21 is a particle diameter distribution diagram of C12AgAL shown in FIG. 20.

FIG. 21 is a particle diameter distribution diagram of C12AgAL shown in FIG. 20. As described above, the diameters of 3000 composite silver nanoparticles are measured, and there is estimated the mean diameter D which is considered to be in accordance with Gaussian distribution, and the mean diameter D is estimated at $D=3\pm1$ (nm) from this distribution.

Example 5

C1AgAL

Figure 22:
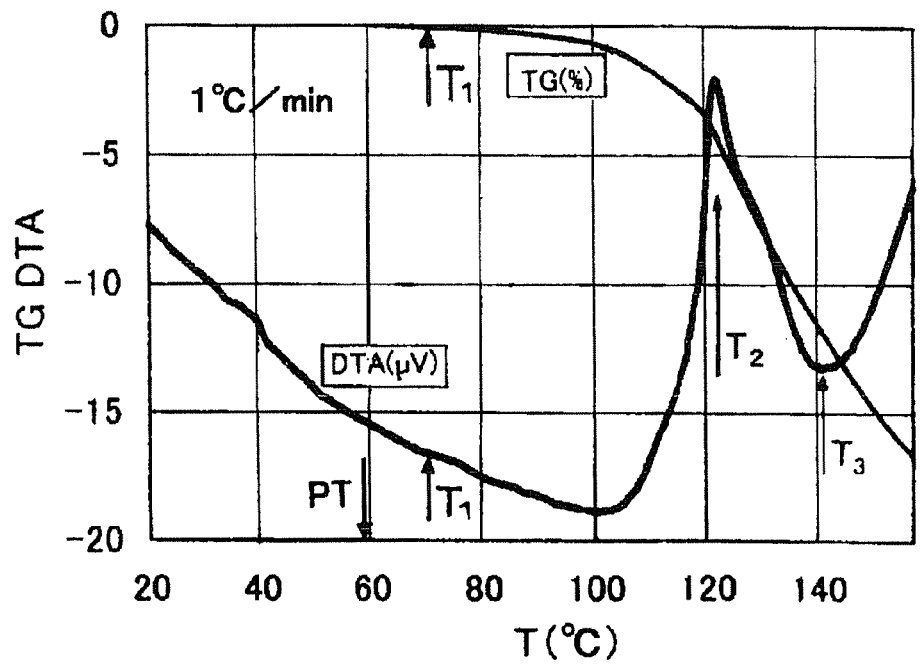
FIG. 22 is a thermal analysis diagram of C1AgAL at generation temperature PT=59° C. (temperature up rate 1° C./min) concerning the present invention.

FIG. 22 is a thermal analysis diagram of C1AgAL at generation temperature PT=59° C. (temperature up rate 1° C./min) concerning the present invention. In the same manner as example 1, the decomposition start temperature $T1$ (° C.), the decomposition temperature $T2$ (° C.) and the metalization temperature $T3$ (° C.) are estimated to be $T1=70°$ C., $T2=123°$ C. and $T3=141°$ C. from TG and DTA, respectively. Also in C1AgAL, it is found that C1AgAL is generated in less than 100° C., the organic component such as the organic coating layer is decomposed and metalized in less than 150° C. Because it is $T2-T1=53$ (° C.), TG decrease start temperature $T1$ is included in the range of the 60° C. downward region of DTA peak temperature $T2$. This situation was understood. Said 60° C. is set as the boundary value including this 53° C. In a case of the composite silver nanoparticles with small carbon number like C1AgAL, since the component ratio of silver is high, they can be used as a metal material of the substitute solder material and pattern material with small organic component.

Example 6

C2AgAL

Figure 23:
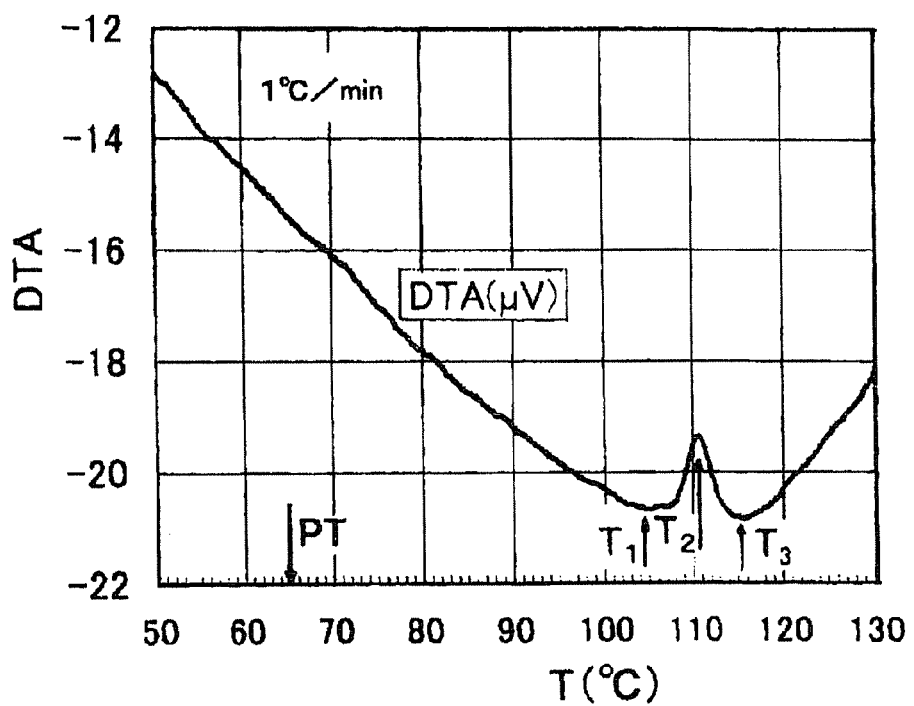
FIG. 23 is a thermal analysis diagram of C2AgAL at generation temperature PT=65° C. (temperature up rate 1° C./min) concerning the present invention.

FIG. 23 is a thermal analysis diagram of C2AgAL at generation temperature PT=65° C. (temperature up rate 1° C./min) concerning the present invention. As shown in the diagram, also in C2AgAL with small carbon number, the decomposition start temperature $T1$ (° C.), the decomposition temperature $T2$ (° C.) and the metalization temperature $T3$ (° C.) are measured from TG and DTA, and estimated to be $T1=109°$ C., $T2=111°$ C. and $T3=115°$ C., respectively. Therefore, it is experimentally confirmed that as for C2AgAL generated in less than 100° C., the organic component such as the organic coating layer is decomposed in less than 150° C. and it is metalized. In addition, because it is $T2-T1=2$ (° C.), TG decrease start temperature $T1$ is included in the range of the 60° C. downward region of DTA peak temperature $T2$. This situation was understood.

Figure 24:
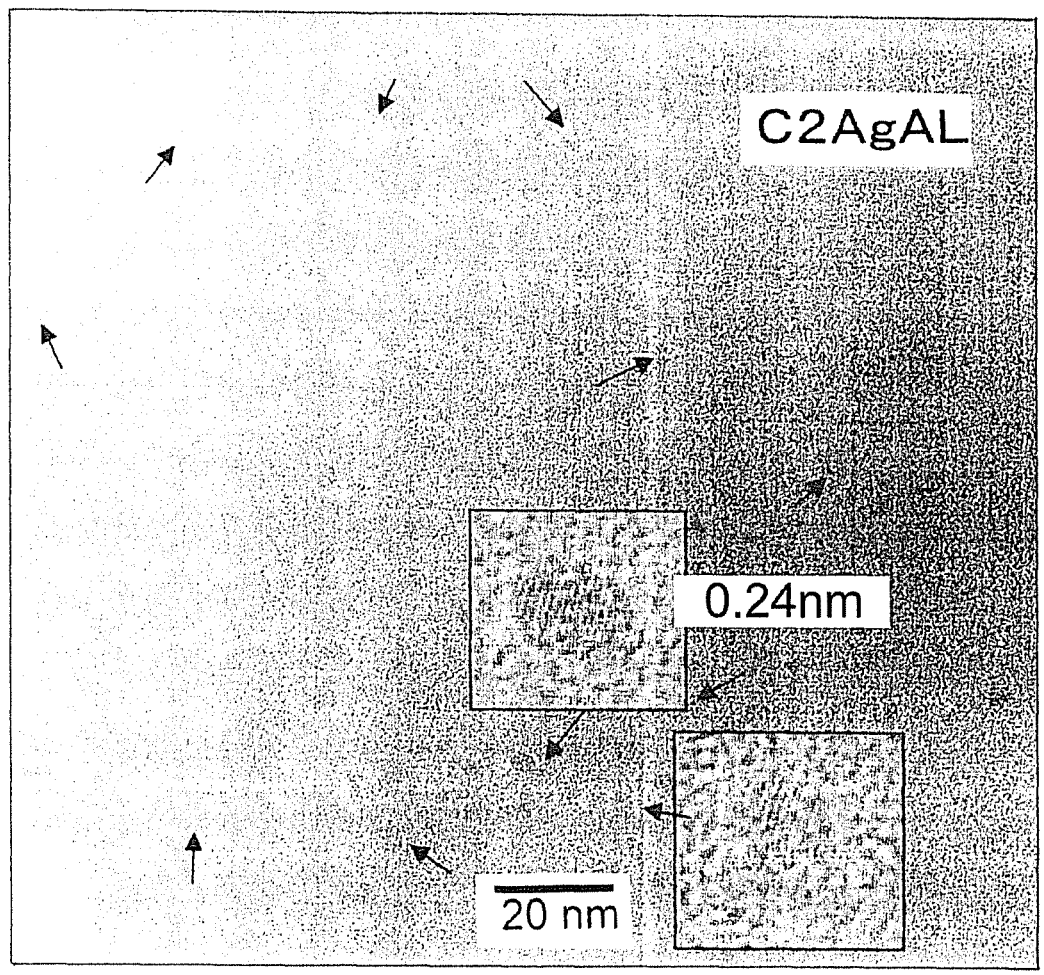
FIG. 24 is a transmission electron microscopy diagram showing the lattice image of C2AgAL concerning the present invention.

FIG. 24 is a transmission electron microscopy diagram of C2AgAL generated at 65° C. The transmission electron microscope image is also observed about C2AgAL, and in the enlarged diagram, the lattice image of silver nanoparticle is seen definitely and it is found that it crystallize with high crystallinity. From this lattice image, it can be judged to be almost the single crystal. The surface interval of lattice image is 0.24 nm. When calculating from the lattice constant of bulk silver crystal of $a=0.40862$ nm, since the plane spacing of (111) plane becomes $d=a/\sqrt{3}=0.24$ nm, it was found that the lattice images express (111) plane. By this single crystallinity, it is concluded that the composite silver nanoparticles of the present invention have high electric conductivity and high thermal conductivity.

Example 7

C4AgAL

Figure 25:
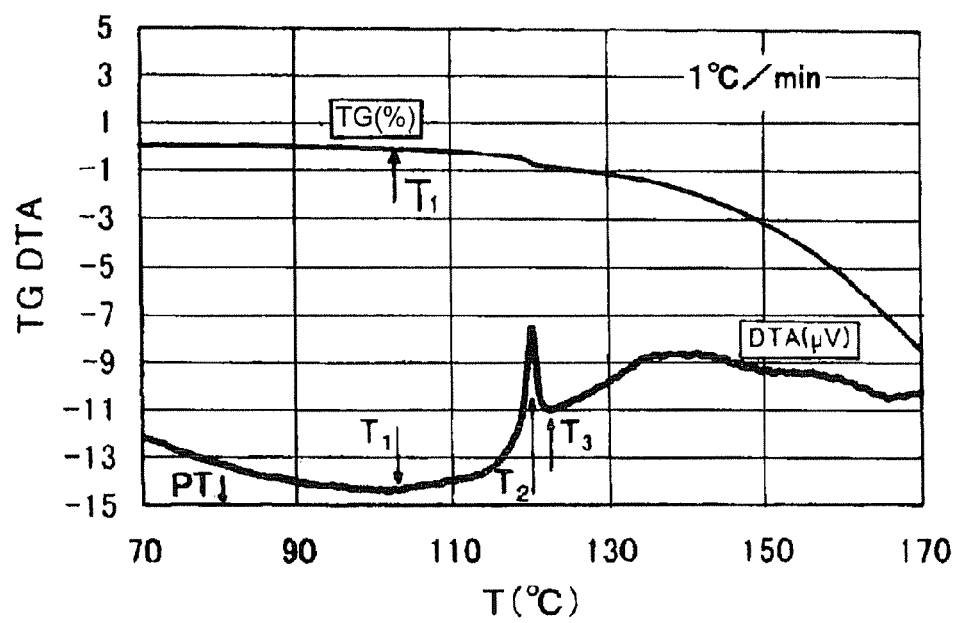
FIG. 25 is a thermal analysis diagram of C4AgAL at generation temperature PT=80° C. (temperature up rate 1° C./min) concerning the present invention.

FIG. 25 is a thermal analysis diagram of C4AgAL at generation temperature PT=80° C. concerning the present invention. Also in C4AgAL, the decomposition start temperature $T1$ (° C.), the decomposition temperature $T2$ (° C.) and the metalization temperature $T3$ (° C.) are measured from TG and DTA, and estimated to be $T1=103°$ C., $T2=120°$ C. and $T3=122°$ C., respectively. From described above, it is experimentally confirmed that as for C4AgAL generated in less than 100° C., the organic component such as the organic coating layer is decomposed in less than 150° C. and it is metalized. In addition, because it is $T2-T1=17$ (° C.), TG decrease start temperature $T1$ is included in the range of the 60° C. downward region of DTA peak temperature $T2$.

Figure 26:
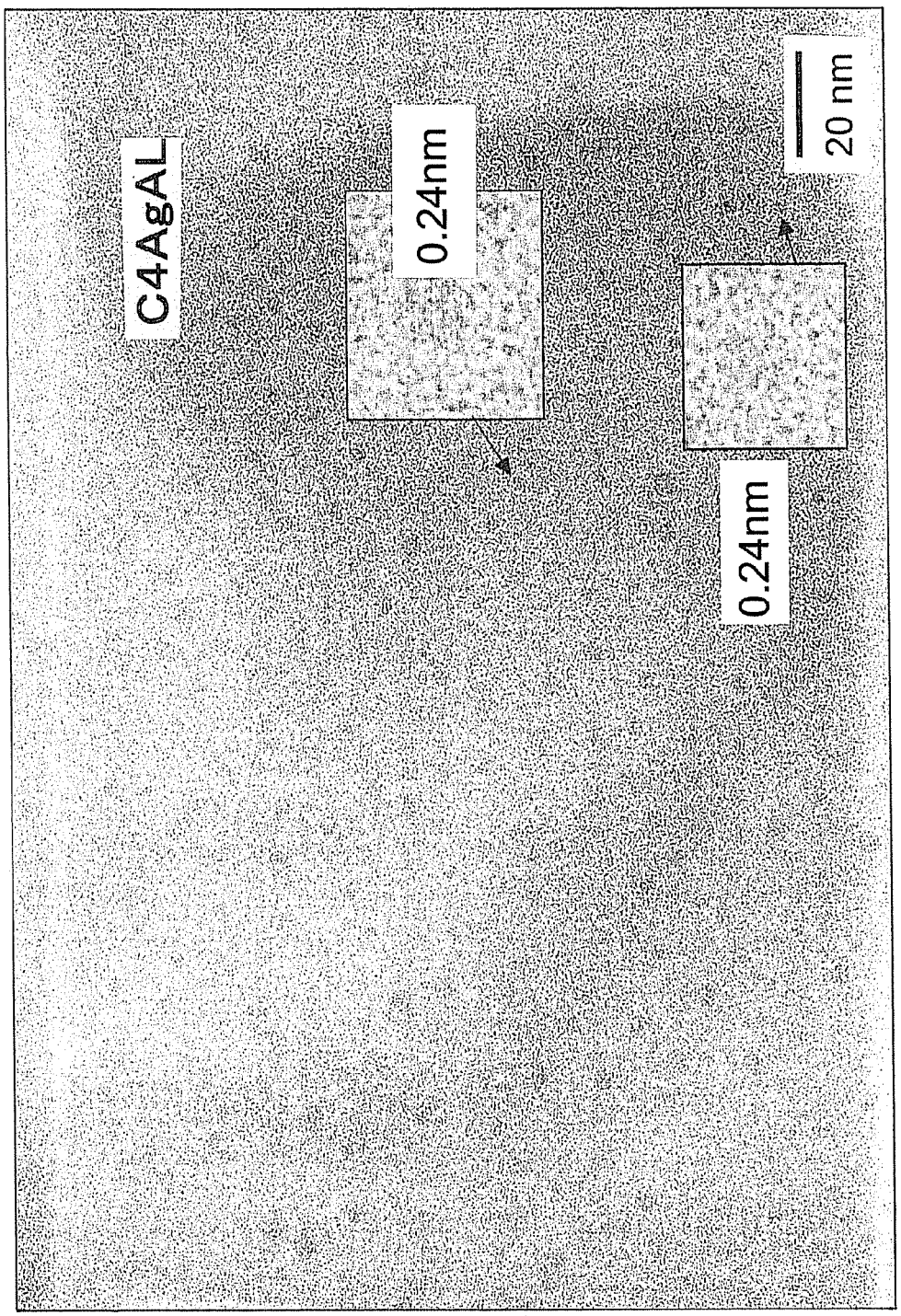
FIG. 26 is a transmission electron microscopy diagram showing the lattice image of C4AgAL concerning the present invention.

FIG. 26 is a transmission electron microscope diagram of C4AgAL generated at 80° C. The transmission electron microscope image is observed also about C4AgAL, in the enlarged diagram, the lattice image of silver nanoparticle is seen definitely and it is found that it crystallizes with high crystallinity. The plane spacing of lattice image is 0.24 nm. Because it coincides with the plane spacing $d=0.24$ nm of (111) plane of bulk silver crystal becomes, it was found that said lattice image expresses (111) plane. Though the upper side silver core is judged to be the single crystal, the lower side silver crystal can be concluded to be single crystal or twin. By this high crystallinity, it can be concluded that the compound silver nanoparticles of the present invention has high electric conductivity and high thermal conductivity.

Example 8

C3AgAL

The heat analysis was done about C3AgAL of generation temperature PT=88° C. The decomposition start temperature $T1$ (° C.), the decomposition temperature $T2$ (° C.) and the metalization temperature $T3$ (° C.) are measured from TG and DTA, and estimated to be $T1=112°$ C., $T2=129°$ C. and $T3=132°$ C., respectively. Therefore, it is experimentally confirmed that as for C3AgAL generated in less than 100° C., the organic component such as the organic coating layer is decomposed in less than 150° C. and it is metalized. In addition, because it is $T2-T1=17$ (° C.), TG decrease start temperature $T1$ is included in the range of the 60° C. downward region of DTA peak temperature $T2$. This situation was understood. Furthermore, The lattice image is observed also in the silver core of C3AgAL particle by the high resolution transmission electron microscope. Since the same as described above, the TG•DTA curves and the electron microscope diagram are omitted.

Example 9

C5AgAL

The heat analysis was done about C5AgAL of generation temperature PT=89° C. The decomposition start temperature T1 (° C.), the decomposition temperature T2 (° C.) and the metalization temperature T3 (° C.) are measured from TG and DTA, and estimated to be T1=117° C., T2=134° C. and T3=138° C., respectively. Therefore, it is experimentally confirmed that as for C3AgAL generated in less than 100° C., the organic component such as the organic coating layer is decomposed in less than 150° C. and it is metalized. Because it is T2−T1=17 (° C.), TG decrease start temperature T1 is included in the range of the 60° C. downward region of DTA peak temperature T2. This situation was understood. Additionally, the lattice image is observed also in the silver core of C5AgAL particle by the high resolution transmission electron microscope. Since the same as described above, the TG•DTA curves and the electron microscope diagram are omitted.

Example 10

C7AgAL

The heat analysis was performed about C7AgAL of generation temperature PT=92° C. The decomposition start temperature TIM), the decomposition temperature T2 (° C.) and the metalization temperature T3 (° C.) are measured from TG and DTA, and estimated to be T1=120° C., T2=135° C. and T3=141° C., respectively. From this result, it is experimentally confirmed that as for C7AgAL generated in less than 100° C., the organic component such as the organic coating layer is decomposed in less than 150° C. and it is metalized. Because it is T2−T1=15 (° C.), TG decrease start temperature T1 is included in the range of the 60° C. downward region of DTA peak temperature T2. This situation was understood. Moreover, the lattice image is observed also in the silver core of C7AgAL particle by the high resolution transmission electron microscope. Since the same as described above, the TG•DTA curves and the electron microscope diagram are omitted.

Example 11

C9AgAL

The heat analysis was performed about C9AgAL of generation temperature PT=94° C. The decomposition start temperature T1 (° C.), the decomposition temperature T2 (° C.) and the metalization temperature T3 (° C.) are measured from TG and DTA, and estimated to be T1=124° C., T2=138° C. and T3=144° C., respectively. From this result, it is experimentally confirmed that as for C9AgAL generated in less than 100° C., the organic component such as the organic coating layer is decomposed in less than 150° C. and it is metalized. Because it is T2−T1=14 (° C.), TG decrease start temperature T1 is included in the range of the 60° C. downward region of DTA peak temperature T2. This situation was understood. Moreover, the lattice image is observed also in the silver core of C9AgAL particle by the high, resolution transmission electron microscope. Since the same as described above, the TG•DTA curves and the electron microscope diagram are omitted.

Example 12

C11AgAL

The heat analysis was performed about C11AgAL of generation temperature PT=98° C. The decomposition start temperature T1 (° C.), the decomposition temperature T2 (° C.) and the metalization temperature T3 (° C.) are measured from TG and DTA, and estimated to be T1=127° C., T2=141° C. and T3=148° C., respectively. From this result, it is experimentally confirmed that as for C11AgAL generated in less than 100° C., the organic component such as the organic coating layer is decomposed in less than 150° C. and it is metalized. Because it is T2−T1=14 (° C.), TG decrease start temperature T1 is included in the range of the 60° C. downward region of DTA peak temperature T2. This situation was understood. In addition, the lattice image is observed also in the silver core of C11AgAL particle by the high resolution transmission electron microscope. Since the same as described above, the TG•DTA curves and the electron microscope diagram are omitted.

In Table 6, there are the concrete values of the generation temperature PT, the decomposition start temperature T1 (° C.), the decomposition temperature T2 (° C.) and the metalization temperature T3 (° C.) in examples 1-12 are described. It became clear that the generation temperature PT is less than 100° C. except C12AgAL, the decomposition temperature T2 and the metalization temperature T3 are equal to or less than 150° C., and the decomposition start temperature T1 exists in the range of the 60° C. downward region of the decomposition temperature T2. Although the generation temperature PT of C12AgAL is 126° C., it is the same condition as other CnAgAL that the decomposition temperature T2 and the metalization temperature T3 are less than 150° C. and the decomposition start temperature T1 exists in the range of the 60° C. downward region of the decomposition temperature T2. This situation was understood. Therefore, the conditions that the decomposition temperature T2 is in less than 150° C. and the decomposition start temperature T1 exists in the range of the 60° C. downward region of the decomposition temperature T2 are the common conditions in CnAgAL of C1 to C12. This situation was understood. In said measurement of CnAgAL, the inequality of T2−60≦T1≦T2 was obtained.

TABLE 6

Relation Between Characteristic Temp. of CnAgAL PT, T1, T2, T3, BT(° C.) and Organic Carbon Number of Alcohol Origin

| Example No | C Number | Generation Temp. PT | Decomposition Start Temp. T1 | Decomposition Temp. T2 | Metalization Temp. T3 | Alcohol Boiling Point BT |
|---|---|---|---|---|---|---|
| Example 5 | 1 | 59 | 70 | 123 | 141 | 64.7 |
| Example 6 | 2 | 65 | 109 | 111 | 115 | 78.3 |
| Example 8 | 3 | 88 | 112 | 129 | 132 | 97.4 |
| Example 7 | 4 | 80 | 103 | 120 | 122 | 117 |

TABLE 6-continued

Relation Between Characteristic Temp. of CnAgAL PT, T1, T2,
T3, BT(° C.) and Organic Carbon Number of Alcohol Origin

| Example No | C Number | Generation Temp. PT | Decomposition Start Temp. T1 | Decomposition Temp. T2 | Metalization Temp. T3 | Alcohol Boiling Point BT |
|---|---|---|---|---|---|---|
| Example 9 | 5 | 89 | 117 | 134 | 138 | 137 |
| Example 1 | 6 | 70 | 104 | 129 | 131 | 157 |
| Example 10 | 7 | 92 | 120 | 135 | 141 | 176.8 |
| Example 2 | 8 | 60 | 97 | 117 | 125 | 184.7 |
| Example 11 | 9 | 94 | 124 | 138 | 144 | 214 |
| Example 3 | 10 | 90 | 112 | 130 | 136 | 231 |
| Example 12 | 11 | 98 | 127 | 141 | 148 | 243 |
| Example 4 | 12 | 126 | 134 | 143 | 150 | 261 |

Figure 27:
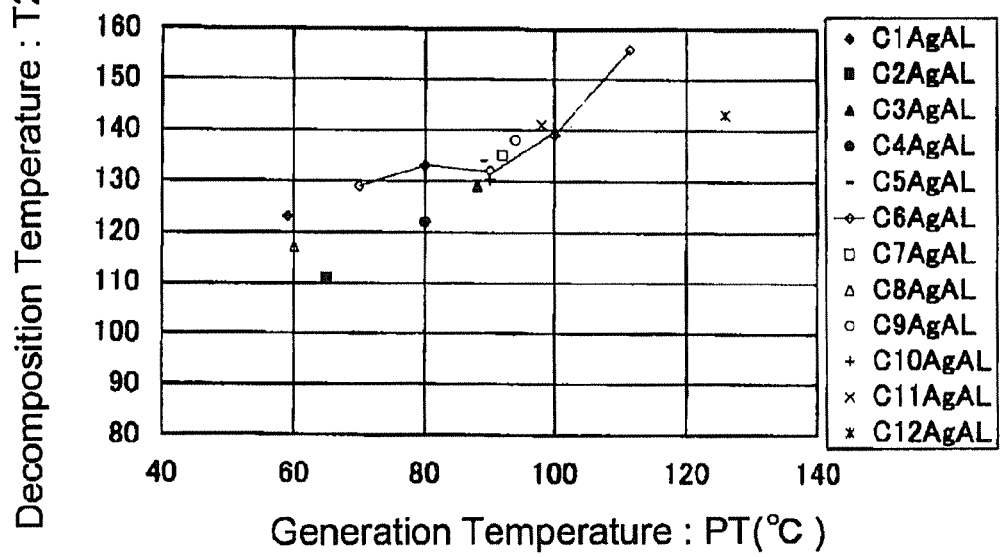
FIG. 27 is a relation diagram between generation temperature PT and decomposition temperature T2 of composite silver nanoparticle CnAgAL (C1-C12) concerning the present invention.

Table 7 is a relation list between the generation temperature PT and the decomposition temperature T2 in the composite silver nanoparticle. FIG. 27 is a diagram illustrating the data of Table 7, in which the transverse axis and the vertical axis are represented by the generation temperature PT (° C.) and the decomposition temperature T2 (° C.), respectively. The condition that the decomposition temperature T2 is less than 150° C. is only in C6AgAL of the generation temperature PT=111.5° C., and other C6AgAL satisfies T2≦150° C. Therefore, in the present embodiment, the decomposition temperature T2≦150° C. was obtained.

Figure 28:
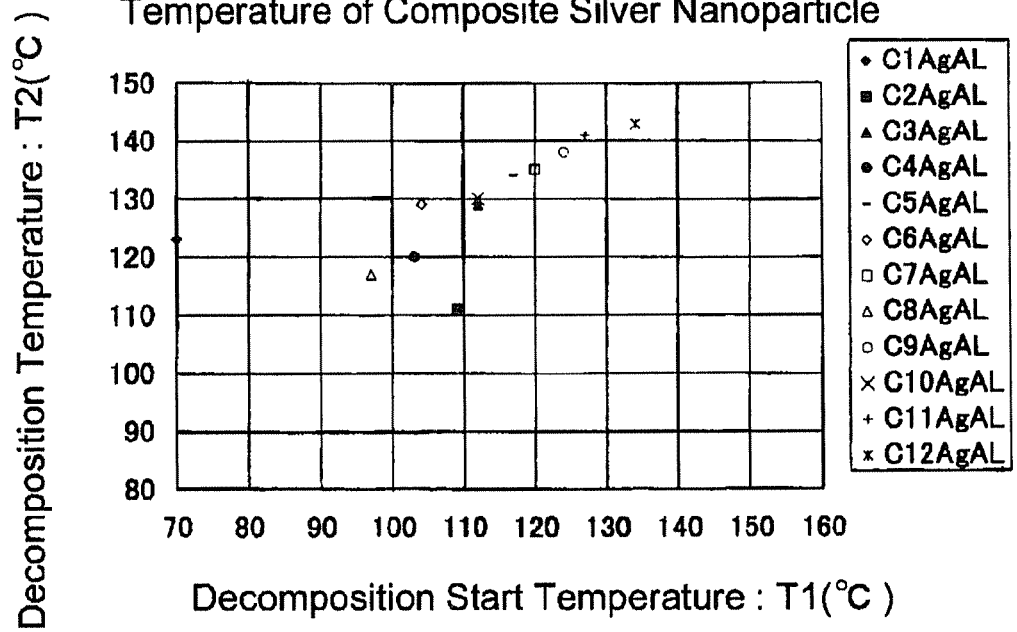
FIG. 28 is a relation diagram between decomposition start temperature T1 and decomposition temperature T2 of composite silver nanoparticle CnAgAL (C1-C12) concerning the present invention.

Table 8 is a relation list between the decomposition start temperature T1 and the decomposition temperature T2 in the composite silver nanoparticle. FIG. 28 is a diagram illustrating the data of Table 8, in which the transverse axis and the vertical axis are represented by the decomposition start temperature T1 (° C.) and the decomposition temperature T2 (° C.), respectively. As shown clearly from the diagram 28, it is held that the decomposition temperature T2 is less than 150° C. and the decomposition start temperature T1 is less than 140° C.

TABLE 7

Relation Between Generation Temperature PT(° C.) and Decomposition Temperature T2(°C) of Composite Silver Nanoparticle

| Generation Temp: PT(° C.) | C1AgAL | C2AgAL | C3AgAL | C4AgAL | C5AgAL | C6AgAL |
|---|---|---|---|---|---|---|
| 59 | 123 | | | | | |
| 60 | | | | | | |
| 65 | | 111 | | | | |
| 70 | | | | | | 129 |
| 80 | | | | 122 | | 133 |
| 88 | | | 129 | | | |
| 89 | | | | | 134 | |
| 90 | | | | | | 132 |
| 92 | | | | | | |
| 94 | | | | | | |
| 98 | | | | | | |
| 100 | | | | | | 139 |
| 111.5 | | | | | | 156 |
| 126 | | | | | | |

| Generation Temp: PT(° C.) | C7AgAL | C8AgAL | C9AgAL | C10AgAL | C11AgAL | C12AgAL |
|---|---|---|---|---|---|---|
| 59 | | | | | | |
| 60 | | 117 | | | | |
| 65 | | | | | | |
| 70 | | | | | | |
| 80 | | | | | | |
| 88 | | | | | | |
| 89 | | | | | | |
| 90 | | | | 130 | | |
| 92 | 135 | | | | | |
| 94 | | | 138 | | | |
| 98 | | | | | 141 | |
| 100 | | | | | | |
| 111.5 | | | | | | |
| 126 | | | | | | 143 |

TABLE 8

Relation Between Decomposition Start Temperature T1(° C.) and Decomposition Temperature T2(° C.) of Composite Silver Nanoparticle

| Decomp. Start Temp.: T1(° C.) | C1AgAL | C2AgAL | C3AgAL | C4AgAL | C5AgAL | C6AgAL |
|---|---|---|---|---|---|---|
| 104 |  |  |  |  |  | 131 |
| 97 |  |  |  |  |  |  |
| 112 |  |  |  |  |  |  |
| 134 |  |  |  |  |  |  |
| 70 | 123 |  |  |  |  |  |
| 109 |  | 111 |  |  |  |  |
| 103 |  |  |  | 120 |  |  |
| 112 |  |  | 129 |  |  |  |
| 117 |  |  |  |  | 134 |  |
| 120 |  |  |  |  |  |  |
| 124 |  |  |  |  |  |  |
| 127 |  |  |  |  |  |  |

| Decomp. Start Temp.: T1(° C.) | C7AgAL | C8AgAL | C9AgAL | C10AgAL | C11AgAL | C12AgAL |
|---|---|---|---|---|---|---|
| 104 |  |  |  |  |  |  |
| 97 |  | 125 |  |  |  |  |
| 112 |  |  |  | 136 |  |  |
| 134 |  |  |  |  |  | 150 |
| 70 |  |  |  |  |  |  |
| 109 |  |  |  |  |  |  |
| 103 |  |  |  |  |  |  |
| 112 |  |  |  |  |  |  |
| 117 |  |  |  |  |  |  |
| 120 | 135 |  |  |  |  |  |
| 124 |  |  | 138 |  |  |  |
| 127 |  |  |  |  | 141 |  |

Table 9 is a relation list between the decomposition start temperature T1, the decomposition temperature T2 and the formula T2−60 in the composite silver nanoparticle. The formula T2−60 is described to judge the satisfaction of the range of T2−60≦T1≦T2. In said embodiment, it is clear numerically that said range is satisfied.

TABLE 9

Range of Decomposition Start Temp. of CnAgAL
T2 − 60 ≦ T1 ≦ T2

| Example No | C Number | T2 − 60 (° C.) | Decomposition Start Temp. T1 (° C.) | Decomposition Temp. T2 (° C.) |
|---|---|---|---|---|
| Example 5 | 1 | 63 | 70 | 123 |
| Example 6 | 2 | 51 | 109 | 111 |
| Example 8 | 3 | 69 | 112 | 129 |
| Example 7 | 4 | 60 | 103 | 120 |
| Example 9 | 5 | 74 | 117 | 134 |
| Example 1 | 6 | 71 | 104 | 131 |
| Example 10 | 7 | 75 | 120 | 135 |
| Example 2 | 8 | 65 | 97 | 125 |
| Example 11 | 9 | 78 | 124 | 138 |
| Example 3 | 10 | 76 | 112 | 136 |
| Example 12 | 11 | 81 | 127 | 141 |
| Example 4 | 12 | 90 | 134 | 150 |

Figure 29:
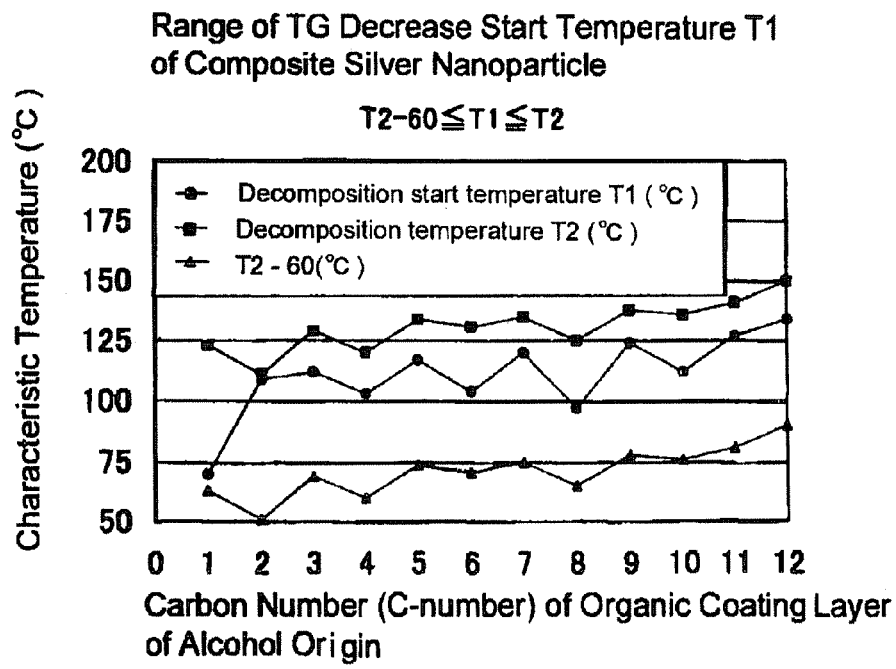
FIG. 29 is a relation diagram showing the range T2−60≦T1≦T2 of decomposition start temperature T1 of composite silver nanoparticle CnAgAL (C1-C12) concerning the present invention.

FIG. 29 is a diagram illustrating the data of Table 9, in which the transverse axis and the vertical axis show the C number and the characteristic temperature, respectively. The characteristic temperatures are the generation temperature PT, the decomposition start temperature T1, the decomposition temperature T2 and the metalization temperature T3, and T2−60 is contained as the characteristic temperature in FIG. 29, too. The black quadrangle is the decomposition temperature T2, the black triangle is T2−60 and the black circle shows the decomposition start temperature. Because there are all black circles between the black triangle and the black quadrangle, it is proved in said embodiments that the inequality T2−60≦T1≦T2 holds in C1-C12.

Table 10 is a list of the generation temperature PT, the decomposition start temperature T1 (° C.), the decomposition temperature T2 (° C.), the metalization temperature T3 (° C.) and the boiling point BT of alcohol with the correspondence C number. Alcohol with the correspondence C number means that it is $C_nH_{2n+1}OH$ when C number=n.

TABLE 10

Relation Between Characteristic Temp. of CnAgAL PT, T1, T2, T3, BT(° C.) and Organic Carbon Number of Alcohol Origin

| Example No | C Number | Generation Temp. PT | Decomposition Start Temp. T1 | Decomposition Temp. T2 | Metalization Temp. T3 | Alcohol Boiling Point BT |
|---|---|---|---|---|---|---|
| Example 5 | 1 | 59 | 70 | 123 | 141 | 64.7 |
| Example 6 | 2 | 65 | 109 | 111 | 115 | 78.3 |

TABLE 10-continued

Relation Between Characteristic Temp. of CnAgAL PT, T1, T2, T3, BT(° C.) and Organic Carbon Number of Alcohol Origin

| Example No | C Number | Generation Temp. PT | Decomposition Start Temp. T1 | Decomposition Temp. T2 | Metalization Temp. T3 | Alcohol Boiling Point BT |
|---|---|---|---|---|---|---|
| Example 8 | 3 | 88 | 112 | 129 | 132 | 97.4 |
| Example 7 | 4 | 80 | 103 | 120 | 122 | 117 |
| Example 9 | 5 | 89 | 117 | 134 | 138 | 137 |
| Example 1 | 6 | 70 | 104 | 129 | 131 | 157 |
| Example 10 | 7 | 92 | 120 | 135 | 141 | 176.8 |
| Example 2 | 8 | 60 | 97 | 117 | 125 | 184.7 |
| Example 11 | 9 | 94 | 124 | 138 | 144 | 214 |
| Example 3 | 10 | 90 | 112 | 130 | 136 | 231 |
| Example 12 | 11 | 98 | 127 | 141 | 148 | 243 |
| Example 4 | 12 | 126 | 134 | 143 | 150 | 261 |

Figure 30:
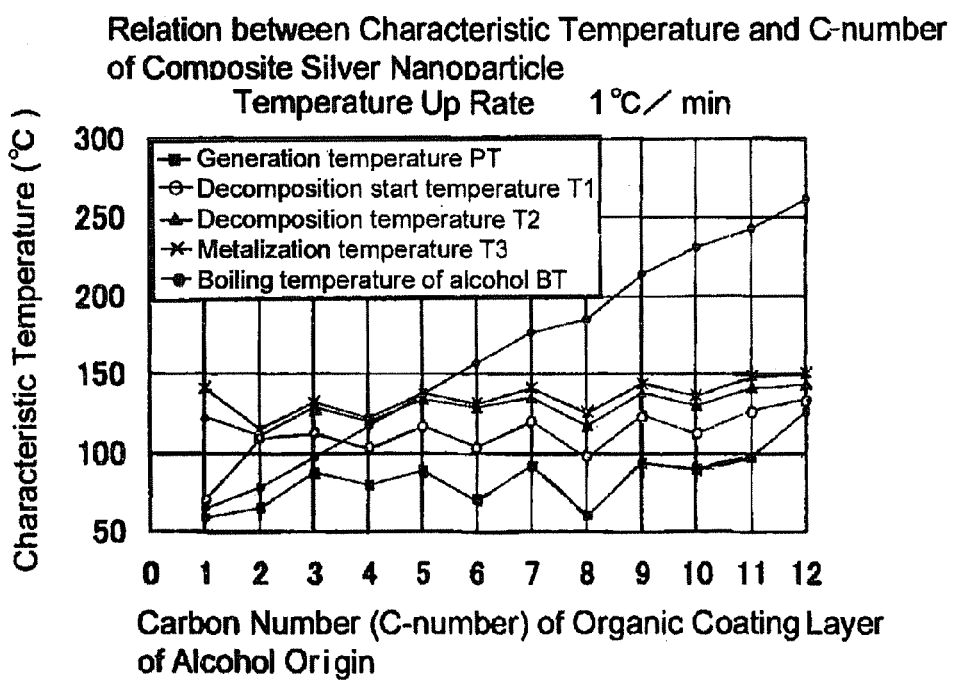
FIG. 30 is a relation diagram between characteristic temperature (PT, T1, T2, T3) and C number in the temperature up rate 1° C./min of composite silver nanoparticle CnAgAL (C1-C12) concerning the present invention.

FIG. 30 is a diagram illustrating the data of Table 10, in which the transverse axis and the vertical axis show the C number of organic coating layer of alcohol origin and the characteristic temperature, respectively. The characteristic temperatures are the generation temperature PT, the decomposition start temperature T1, the decomposition temperature T2, the metalization temperature T3 and the boiling point BT of alcohol. All the main conditions of the present invention are included in FIG. 30. About a condition of generation temperature PT≦100° C., it holds entirely except C12. About the DTA peak temperature T2≦150° C., it holds entirely in all of C1-C12. About the metalization temperature T3≦150° C., it holds entirely in all of C1-C12. About T2−60≦T1≦150° C., it holds entirely in all of C1-C12. The present invention is the silver salt reaction in the excess alcohol solution, but as for the heating temperature control, it is also done to control with the boiling point BT of alcohol. By way of example only, since the boiling point of methanol of C1 is BT=64.7° C., even if alcohol is reacted in a boiling condition, the alcohol temperature does not exceed 64.7° C., and the generation temperature PT is fixed to PT=64.7° C.(=BT). However, the alcohol boiling point BT rises depending on C number. In the alcohol of the low boiling point, it is possible to set the generation temperature more highly than the boiling point by the pressurized boiling. Additionally, in the alcohol of the high boiling point, it is possible to set the generation temperature more lowly than the boiling point by the depressurized boiling.

Table 11 is a list of lattice image by the high resolution transmission electron microscope of CnAgAL in C1-C12. In all of composite silver nanoparticles of C1-C12, the lattice image of silver core is confirmed, and it is demonstrated that the crystallinity is extremely high. As thus described, it is the first event by the present inventor that the lattice image of silver core was confirmed in the alkoxide silver nanoparticles, and it was successful to provide the alkoxide coating nanoparticles having the high crystallinity such as single crystal and twin crystal. Therefore, it is demonstrated that the electroconductivity and the thermal conductivity of CnAgAL of the present invention are extremely high.

TABLE 11

Presense of Silver Lattice Image by Transmission Electron Microscope of CnAgAL

| Example No | Composite Silver Nanoparticle | C Number | Presense of Lattice Image |
|---|---|---|---|
| Example 1 | C6AgAL | 6 | Existence |
| Example 2 | C8AgAL | 8 | Existence |
| Example 3 | C10AgAL | 10 | Existence |
| Example 4 | C12AgAL | 12 | Existence |
| Example 5 | C1AgAL | 1 | Existence |
| Example 6 | C2AgAL | 2 | Existence |
| Example 7 | C4AgAL | 4 | Existence |
| Example 8 | C3AgAL | 3 | Existence |
| Example 9 | C5AgAL | 5 | Existence |
| Example 10 | C7AgAL | 7 | Existence |
| Example 11 | C9AgAL | 9 | Existence |
| Example 12 | C11AgAL | 11 | Existence |

Examples 011-123

Characteristics of composite Silver Nanopaste of C1-C12

Next, the composite silver nanopaste was produced by using of composite silver nanoparticles generated with the present invention. The following three kinds of pastes were produced by using of each CnAgAL of C1-C12.

(1) CnAgAL+viscosity grant agent, (2) CnAgAL+solvent+viscosity grant agent, (3) CnAgAL+silver particle+solvent+viscosity grant agent.

At least one of CnAgAL has the metalization temperature T3 shown in examples 1-12, and the others of CnAgAL have the metalization temperature slightly different from the metalization temperature T3 of said examples. However, as for the metalization temperature T3, a material less than or equal to 150° C. is chosen entirely. As for the particle size of silver particle, two kinds of 0.4 μm and 1.0 μm are employed. The solvent is chosen from methanol, ethanol, butanol, xylene, toluene and hexane. The viscosity grant agent is chosen from turpentine, terpineor, terpin derivative (mixture of 1,8-terpin monoacetate and 1,8-terpin diacetate) and methyl cellulose. Methyl cellulose is powder, and it is used together with solvent by all means. In Tables 12 and 13, there are just described the particle diameter of silver particle, the kind of solvent, the kind of viscosity grant agent, the mass % of each component and the paste firing temperature in atmospheric air. In Tables 12 and 13, there are also described the metalization temperature T3 (° C.) and the paste firing temperature in atmospheric air of CnAgAL with C1-C12.

TABLE 12

Composition and Paste Firing Temperature in Air of Composite Silver Nanopaste of Alcohol Origin (C1-C6)

| Example No | CnAgAL (Expression) | CnAgAL Mass (mass %) | Silver Particle (mass %) | Solvent Kind | (mass %) | Viscosity Grant Agent Kind | (mass %) | Paste Firing Temp. in Air (° C.) | CnAgAL (° C.) Metalization Temp |
|---|---|---|---|---|---|---|---|---|---|
| Example 011 | C1AgAL | 90 | | | | Turpentine oil | 10.0 | 120 | 90 |
| Example 012 | C1AgAL | 90 | | Methanol | 0.5 | Turpentine oil | 9.5 | 150 | 120 |
| Example 013 | C1AgAL | 50 | 0.4 μm 40% | Methanol | 1.0 | Turpentine oil | 9.0 | 190 | 141 |
| Example 21 | C2AgAL | 90 | | | | Turpentine oil | 10.0 | 135 | 105 |
| Example 22 | C2AgAL | 90 | | Ethanol | 0.5 | Turpentine oil | 9.5 | 145 | 115 |
| Example 23 | C2AgAL | 50 | 0.4 μm 40% | Ethanol | 1.0 | Turpentine oil | 9.0 | 170 | 125 |
| Example 31 | C3AgAL | 90 | | | | Turpentine oil | 10.0 | 150 | 120 |
| Example 32 | C3AgAL | 90 | | Ethanol | 0.5 | Turpentine oil | 9.5 | 168 | 132 |
| Example 33 | C3AgAL | 50 | 1.0 μm 40% | Ethanol | 1.0 | Turpentine oil | 9.0 | 190 | 140 |
| Example 41 | C4AgAL | 90 | | | | Terpin Derivative | 10.0 | 150 | 122 |
| Example 42 | C4AgAL | 90 | | Buthanol | 0.5 | Terpin Derivative | 9.5 | 170 | 140 |
| Example 43 | C4AgAL | 50 | 0.4 μm 40% | Buthanol | 1.0 | Terpin Derivative | 9.0 | 200 | 140 |
| Example 51 | C5AgAL | 90 | | | | Terpin Derivative | 10.0 | 170 | 138 |
| Example 52 | C5AgAL | 90 | | Xylene | 0.5 | Terpin Derivative | 9.5 | 200 | 150 |
| Example 53 | C5AgAL | 50 | 0.4 μm 40% | Xylene | 1.0 | Terpin Derivative | 9.0 | 260 | 150 |
| Example 61 | C6AgAL | 90 | | | | Terpin Derivative | 10.0 | 170 | 131 |
| Example 62 | C6AgAL | 90 | | Toluene | 0.5 | Terpin Derivative | 9.5 | 200 | 150 |
| Example 63 | C6AgAL | 50 | 1.0 μm 40% | Toluene | 1.0 | Terpin Derivative | 9.0 | 270 | 150 |

TABLE 13

Composition and Paste Firing Temperature in Air of Composite Silver Nanopaste of Alcohol Origin (C7-C12)

| Example No | CnAgAL (Expression) | CnAgAL Mass (mass %) | Silver Particle (mass %) | Solvent Kind | (mass %) | Viscosity Grant Agent Kind | (mass %) | Paste Firing Temp. in Air (° C.) | CnAgAL (° C.) Metalization Temp |
|---|---|---|---|---|---|---|---|---|---|
| Example 71 | C7AgAL | 90 | | | | Terpin Derivative | 7.0 | 160 | 122 |
| Example 72 | C7AgAL | 93 | | Methanol | 0.5 | Terpin Derivative | 6.5 | 190 | 141 |
| Example 73 | C7AgAL | 53 | 0.4 μm 40% | Methanol | 1.0 | Terpin Derivative | 6.0 | 220 | 141 |
| Example 81 | C8AgAL | 90 | | | | Terpin Derivative | 7.0 | 165 | 125 |
| Example 82 | C8AgAL | 93 | | Ethanol | 0.5 | Terpin Derivative | 6.5 | 190 | 150 |
| Example 83 | C8AgAL | 53 | 0.4 μm 40% | Ethanol | 1.0 | Terpin Derivative | 6.0 | 220 | 150 |
| Example 91 | C9AgAL | 90 | | | | Terpin Derivative | 7.0 | 180 | 144 |
| Example 92 | C9AgAL | 93 | | Buthanol | 0.5 | Terpin Derivative | 6.5 | 200 | 150 |
| Example 93 | C9AgAL | 53 | 1.0 μm 40% | Buthanol | 1.0 | Terpin Derivative | 6.0 | 240 | 150 |
| Example 101 | C10AgAL | 90 | | | | Terpin Derivative | 7.0 | 180 | 136 |
| Example 102 | C10AgAL | 93 | | Hexane | 0.5 | Terpin Derivative | 6.5 | 220 | 148 |
| Example 103 | C10AgAL | 53 | 0.4 μm 40% | Hexane | 1.0 | Terpin Derivative | 6.0 | 260 | 148 |
| Example 111 | C11AgAL | 90 | | | | Terpin Derivative | 7.0 | 190 | 148 |
| Example 112 | C11AgAL | 93 | | Xylene | 0.5 | Terpin Derivative | 6.5 | 210 | 148 |
| Example 113 | C11AgAL | 53 | 0.4 μm 40% | Xylene | 1.0 | Terpin Derivative | 6.0 | 230 | 148 |
| Example 121 | C12AgAL | 90 | | | | Terpin Derivative | 7.0 | 200 | 150 |
| Example 122 | C12AgAL | 93 | | Toluene | 0.5 | Methyl cellulose | 6.5 | 400 | 150 |
| Example 123 | C12AgAL | 53 | 1.0 μm 40% | Toluene | 1.0 | Methyl cellulose | 6.0 | 450 | 150 |

The paste firing temperature in atmospheric air is set to be higher than the metalization temperature T3 of CnAgAL. The reason is not only that it makes CnAgAL metalize but also that it makes the solvent vaporize and it is necessary to make the viscosity grant agent vaporize, decompose or gasify. In addition, the metalization temperature T3 of CnAgAL is equal to or less than 150° C., but when it is fired with the higher temperature than the metalization temperature, the graceful metal film can be formed and the silver film with the high electroconductivity can be formed. Therefore, as shown in Table 12 and Table 13, the paste firing temperature in atmospheric air is set to be higher than said metalization temperature T3, and it is confirmed that the performance of silver film is improved in the higher temperature. When turpentine is used as the viscosity grant agent, the paste firing temperature in atmospheric air is adjusted to be equal to or less than 200° C. Additionally, when terpin derivative is used as the viscosity grant agent, the firing temperature is set to be more highly. Furthermore, when methyl cellulose is used as the viscosity grant agent, the firing temperature is set to be much more highly like 400° C. or 450° C. As stated above, the paste firing temperature in atmospheric air depends upon the gasification temperature of viscosity grant agent.

The 36 kinds of pastes shown in examples 011-123 are coated on the heat-resisting glass substrates, and when they are fired with the paste firing temperatures in atmospheric air described in Tables 12 and 13, the graceful silver films are formed on the glass substrates. When the formed silver film surfaces are observed with the optical microscope and their specific resistances are measured, they are the silver films to be worthy of practical use. This situation is confirmed and the composite silver nanopastes of the present invention are effective. This situation is concluded.

Example 124

Bonding Between Semiconductor Electrode and Circuit Board

When a semiconductor chip and a circuit board are the upper part and the lower part, respectively, the bonding tests were done. An electrode end of the semiconductor chip is inserted into a through hole of the circuit board, the composite silver nanopaste of examples 011-123 is coated to the contact portion between both, and 36 kinds of paste test pieces were got. Afterwards, said coated portions are heated locally with the paste firing temperatures described in Tables 12 and 13, said coated portions are metalized and the bonding were completed. After having cooled off, there were not the problems in 36 kinds of test pieces when the appearance of bonding portion was inspected by the optical microscope. The electric continuity test and electric resistance measurement were done, but it is confirmed that it effectively functions as the substitute solder. From said 36 kinds of bonding tests, it was found that the composite silver nanopaste concerning the present invention could be used industrially as the substitute solder.

Example 125

Formation of Silver Pattern on the Heat-Resisting Glass Substrate

A heat-resisting glass substrate is used as the base body, the composite silver nanopaste of examples 011-123 is printed on the base body by the screen printing, and there were obtained 36 kinds of test bodies on which the paste pattern with the predetermined pattern is formed. Afterwards, said test bodies were heated at the paste firing temperature in atmospheric air described in Tables 12 and 13 by the electric furnace, and the silver patterns were formed from said paste patterns. After having cooled off, there was not the problem in 36 kinds of test bodies when the surface of said silver pattern was inspected by the optical microscope. From said 36 kinds of pattern formation tests, it was found that the composite silver nanopaste concerned the present invention can be used industrially as the silver pattern formation material.

Examples 1001-1012

Thermal Analysis of the Second Embodiment of CnAgAL (n=1-12)

As explained above, the thermal analysis was done for CnAgAL (n=1-12) of the first embodiment and the lists of the characteristic temperatures were obtained as Table 10, FIG. 29 and FIG. 30. In order to investigate this point furthermore, the present inventor performed the experiment obtaining the lists of the characteristic temperatures for CnAgAL (n=1-12) of another composite silver nanoparticles.

Figure 37:
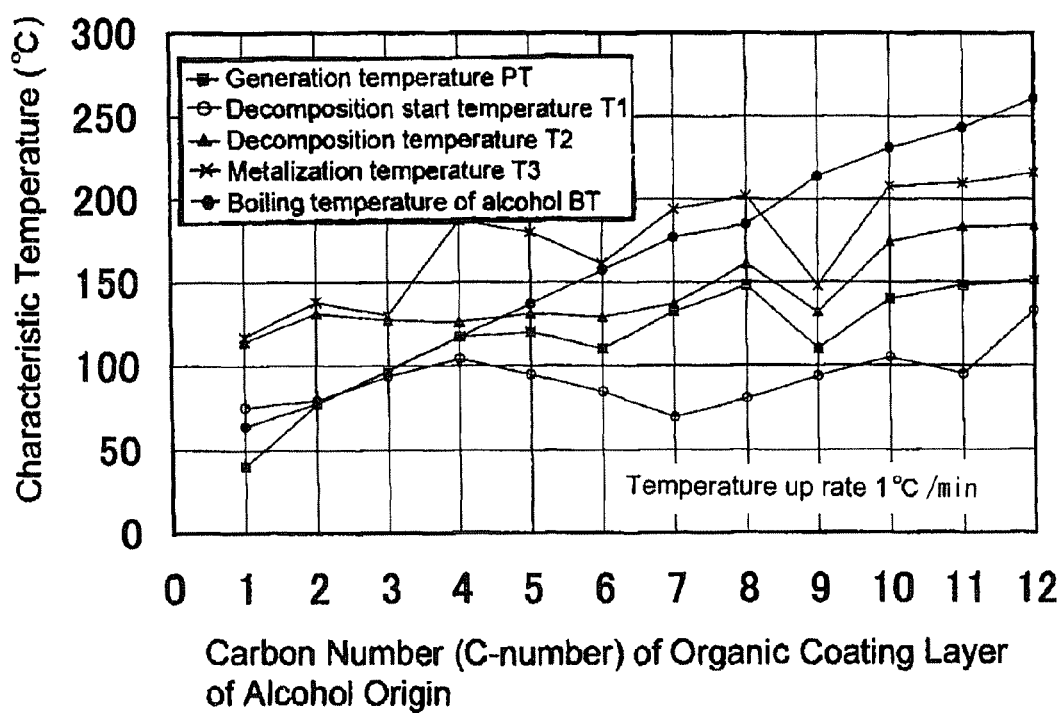
FIG. 37 is a relation diagram between characteristic temperature (PT, T1, T2, T3) and C number in the temperature up rate 1° C./min of composite silver nanoparticles CnAgAL (C1-C12) of another embodiment.

FIG. 31-FIG. 36 are the thermal analysis diagrams performed with the temperature up rate of 1° C./min for another composite silver nanoparticles C1AgAL-C12AgAL, and each thermal analysis diagram is configured from TG curve and DTA curve. The decomposition start temperature T1 is the TG decrease start temperature, the decomposition temperature T2 is the DTA first peak temperature, and the metalization temperature T3 is the TG decrease end temperature or the DTA last peak end temperature. These concrete temperatures and the generation temperature PT are described in Table 14, and the temperatures of T1, T2 and T3 are estimated from the thermal analyses of FIG. 31-FIG. 13. Furthermore, FIG. 37 is the relation diagram between the characteristic temperature (PT, T1, T2, T3) and the C number in the temperature up rate ft/min of the composite silver nanoparticles CnAgAL (C1-C12) of examples 1001-1012, and the temperatures shown in Table 14 are plotted.

TABLE 14

Relation 2 Between Generation Temp PT(° C.) and Characteristic Temp T1•T2•T3(° C.) of C1AgAL~C12AgAL Powder

| Example No | CnAgAL | C Number | Generation Temp. PT | Decomposition Start Temp. T1 | Decomposition Temp. T2 | Metalization Temp. T3 |
|---|---|---|---|---|---|---|
| Example 1001 | C1AgAL | 1 | 40 | 76 | 114 | 117 |
| Example 1002 | C2AgAL | 2 | 78 | 80 | 131 | 138 |
| Example 1003 | C3AgAL | 3 | 97 | 94 | 127 | 130 |
| Example 1004 | C4AgAL | 4 | 117 | 104 | 126 | 187 |
| Example 1005 | C5AgAL | 5 | 120 | 95 | 131 | 180 |
| Example 1006 | C6AgAL | 6 | 110 | 85 | 129 | 161 |
| Example 1007 | C7AgAL | 7 | 132 | 70 | 137 | 194 |
| Example 1008 | C8AgAL | 8 | 148 | 81 | 161 | 202 |
| Example 1009 | C9AgAL | 9 | 110 | 94 | 132 | 148 |
| Example 1010 | C10AgAL | 10 | 140 | 105 | 174 | 208 |
| Example 1011 | C11AgAL | 11 | 148 | 95 | 183 | 210 |
| Example 1012 | C12AgAL | 12 | 151 | 133 | 184 | 216 |

Figure 31:
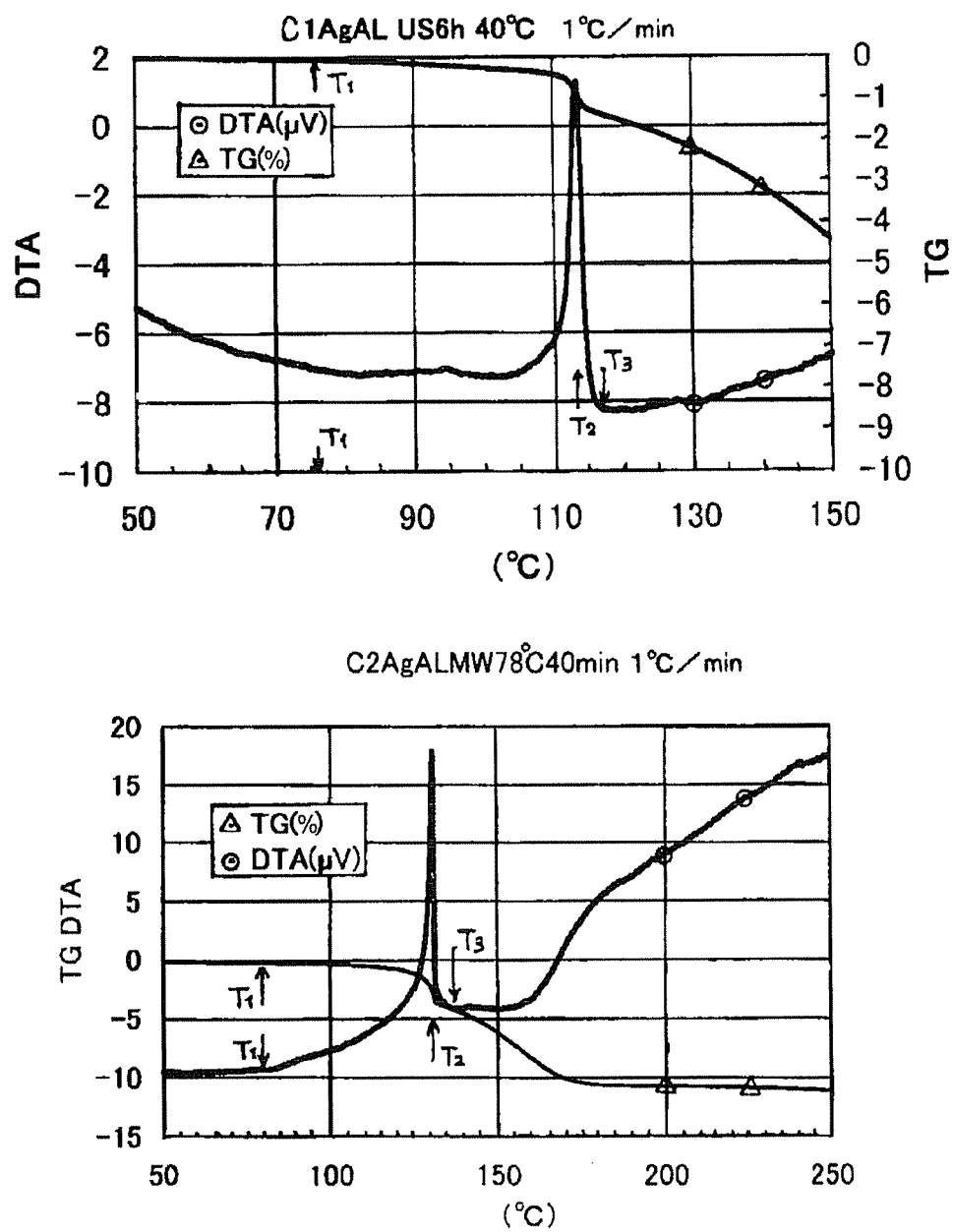
FIG. 31 is a thermal analysis diagram (temperature up rate 1° C./min) of composite silver nanoparticles C1AgAL (PT=40° C.) and C2AgAL (PT=78° C.) of another embodiment.
Figure 32:
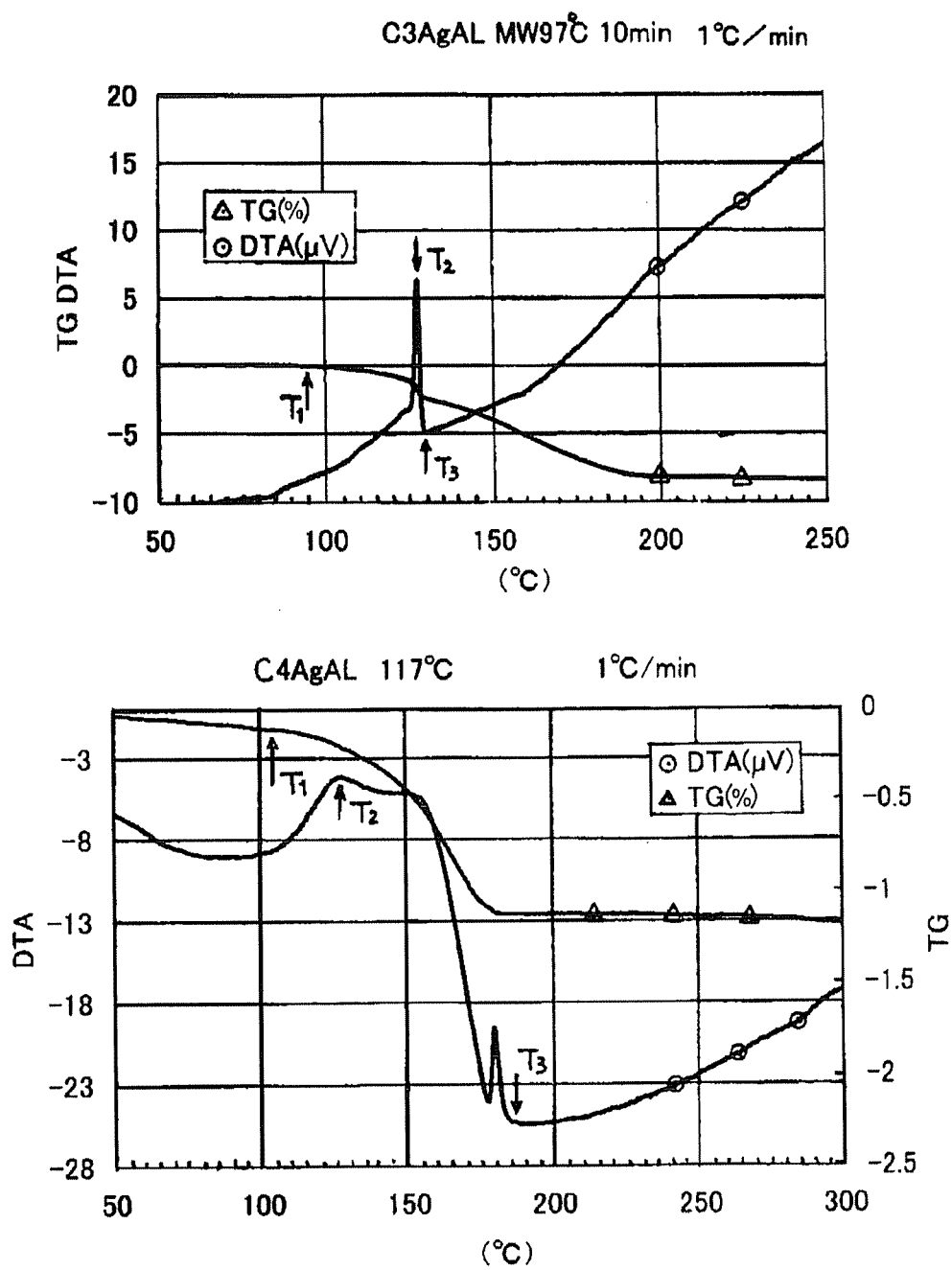
FIG. 32 is a thermal analysis diagram (temperature up rate 1° C./min) of composite silver nanoparticles C3AgAL (PT=97° C.) and C4AgAL (PT=117° C.) of another embodiment.
Figure 33:
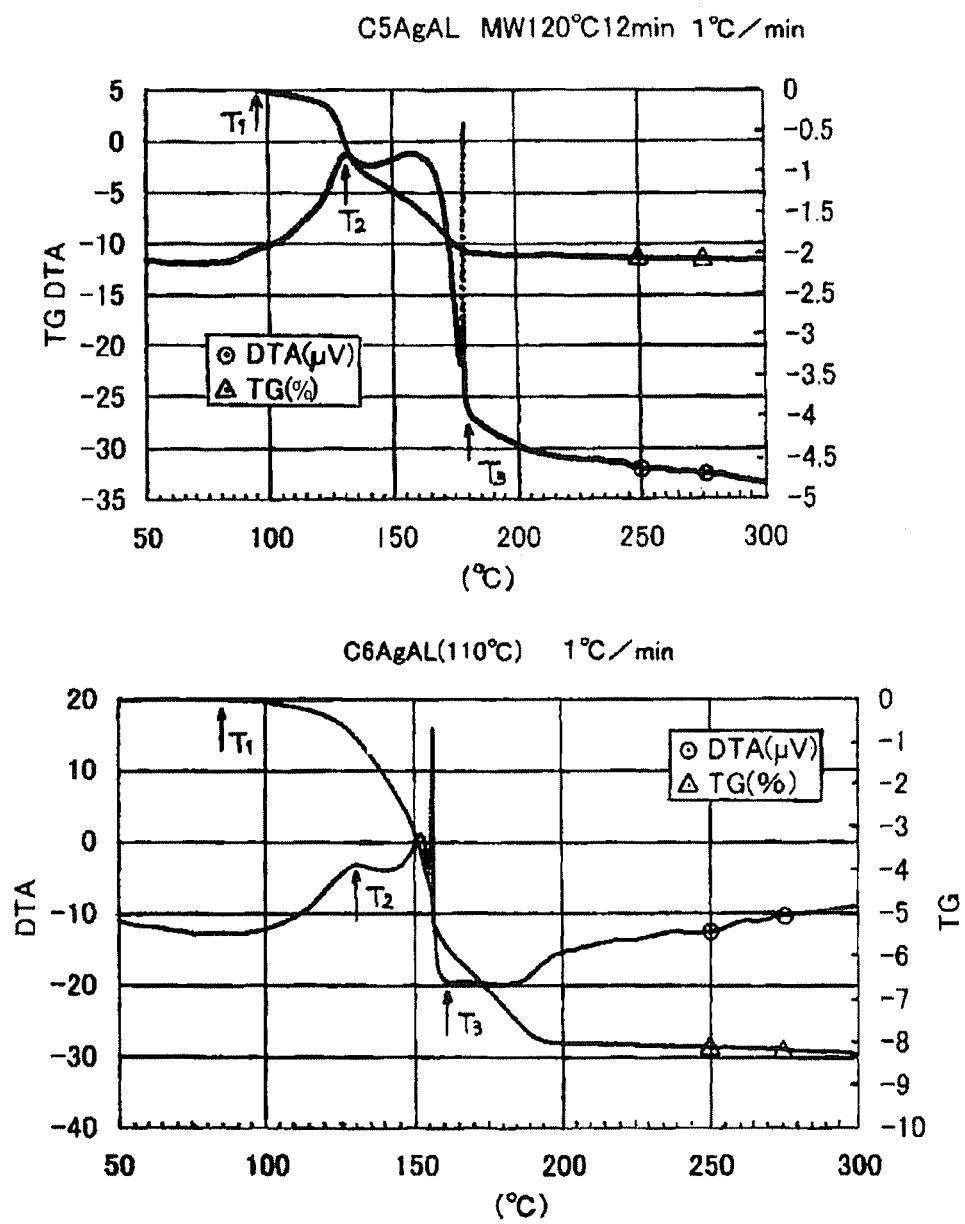
FIG. 33 is a thermal analysis diagram (temperature up rate 1° C./min) of composite silver nanoparticles C5AgAL (PT=120° C.) and C6AgAL (PT=110° C.) of another embodiment.
Figure 34:
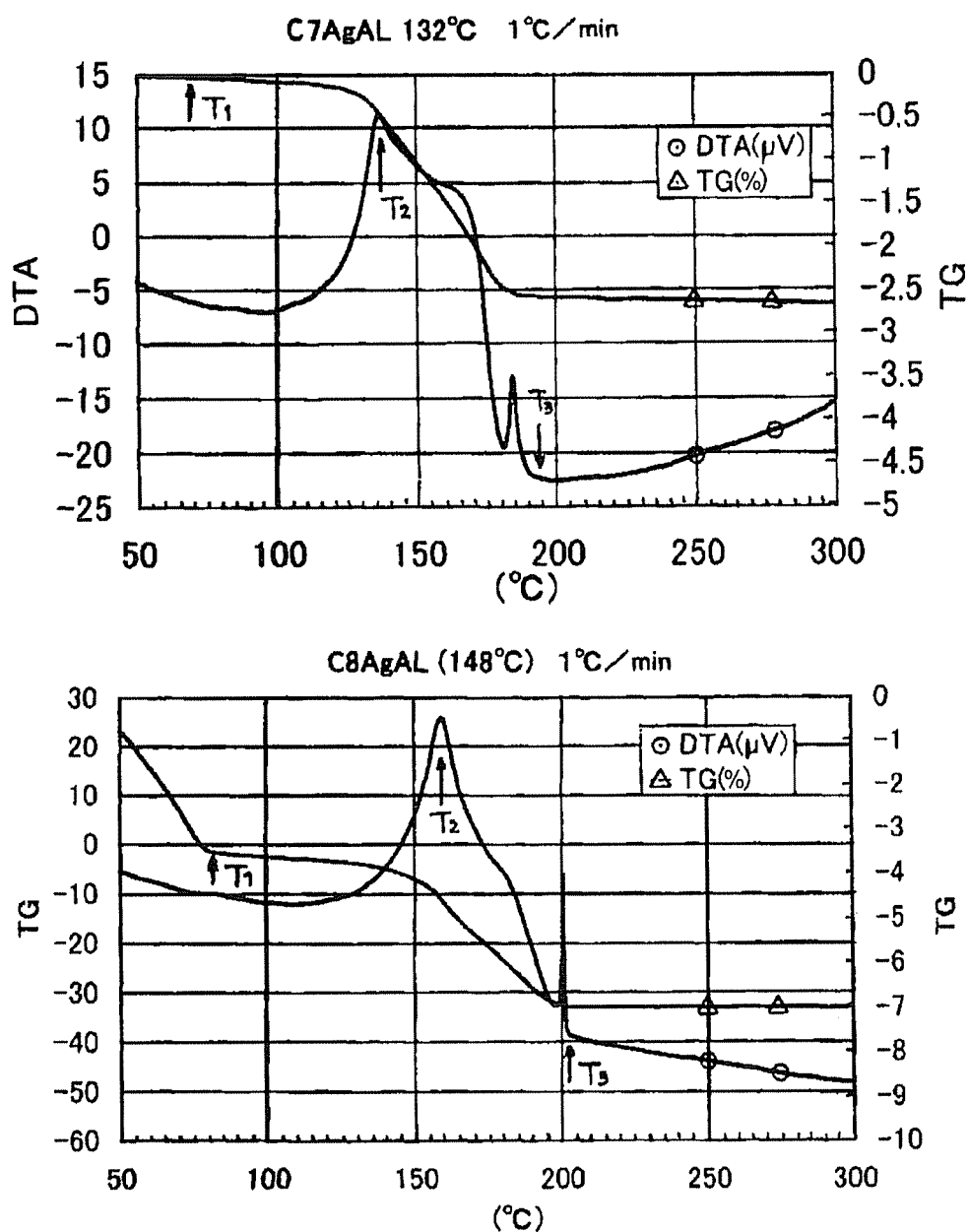
FIG. 34 is a thermal analysis diagram (temperature up rate 1° C./min) of composite silver nanoparticles C7AgAL (PT=132° C.) and C8AgAL (PT=148° C.) of another embodiment.
Figure 35:
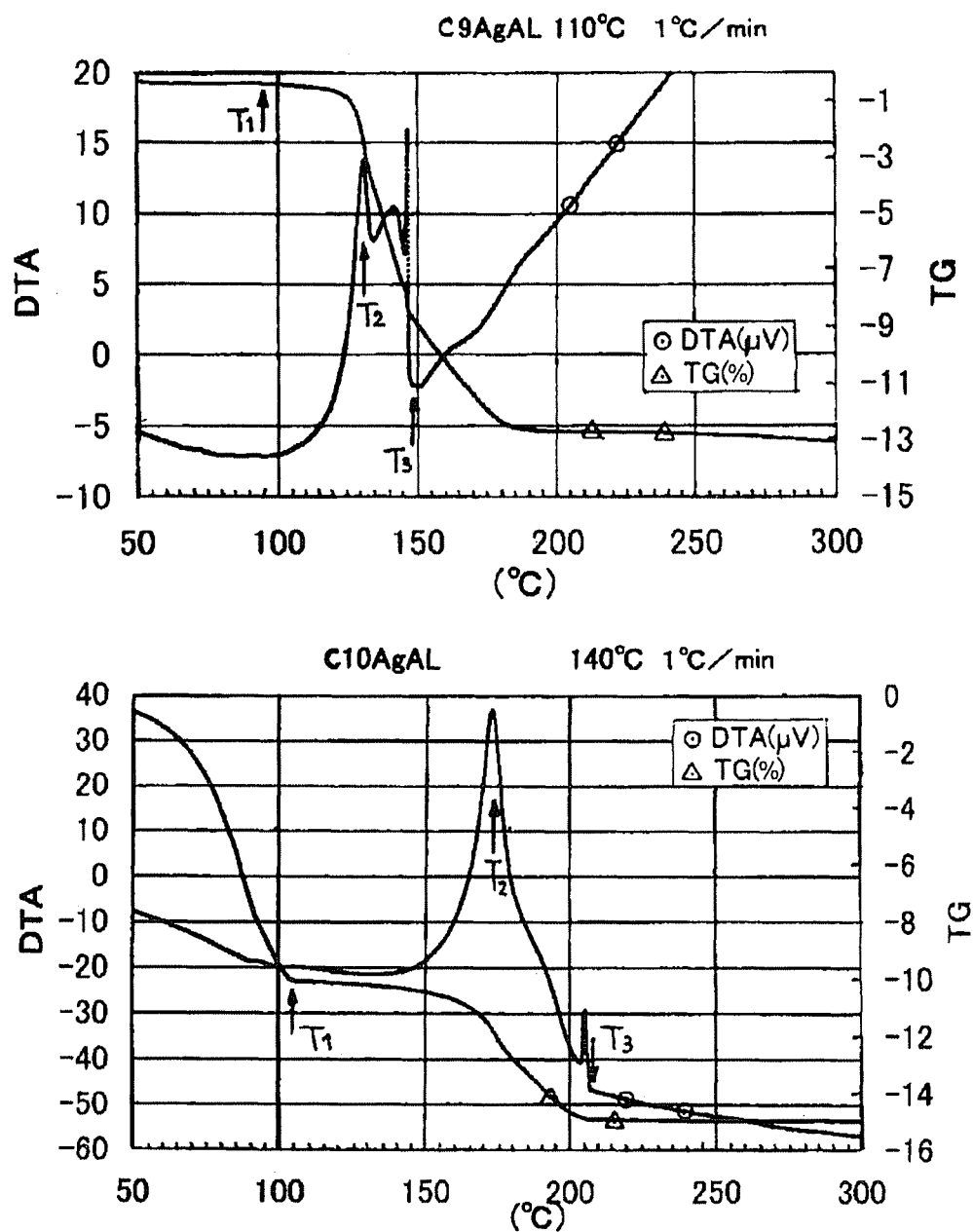
FIG. 35 is a thermal analysis diagram (temperature up rate 1° C./min) of composite silver nanoparticles C9AgAL (PT=110° C.) and C10AgAL (PT=140° C.) of another embodiment.
Figure 36:
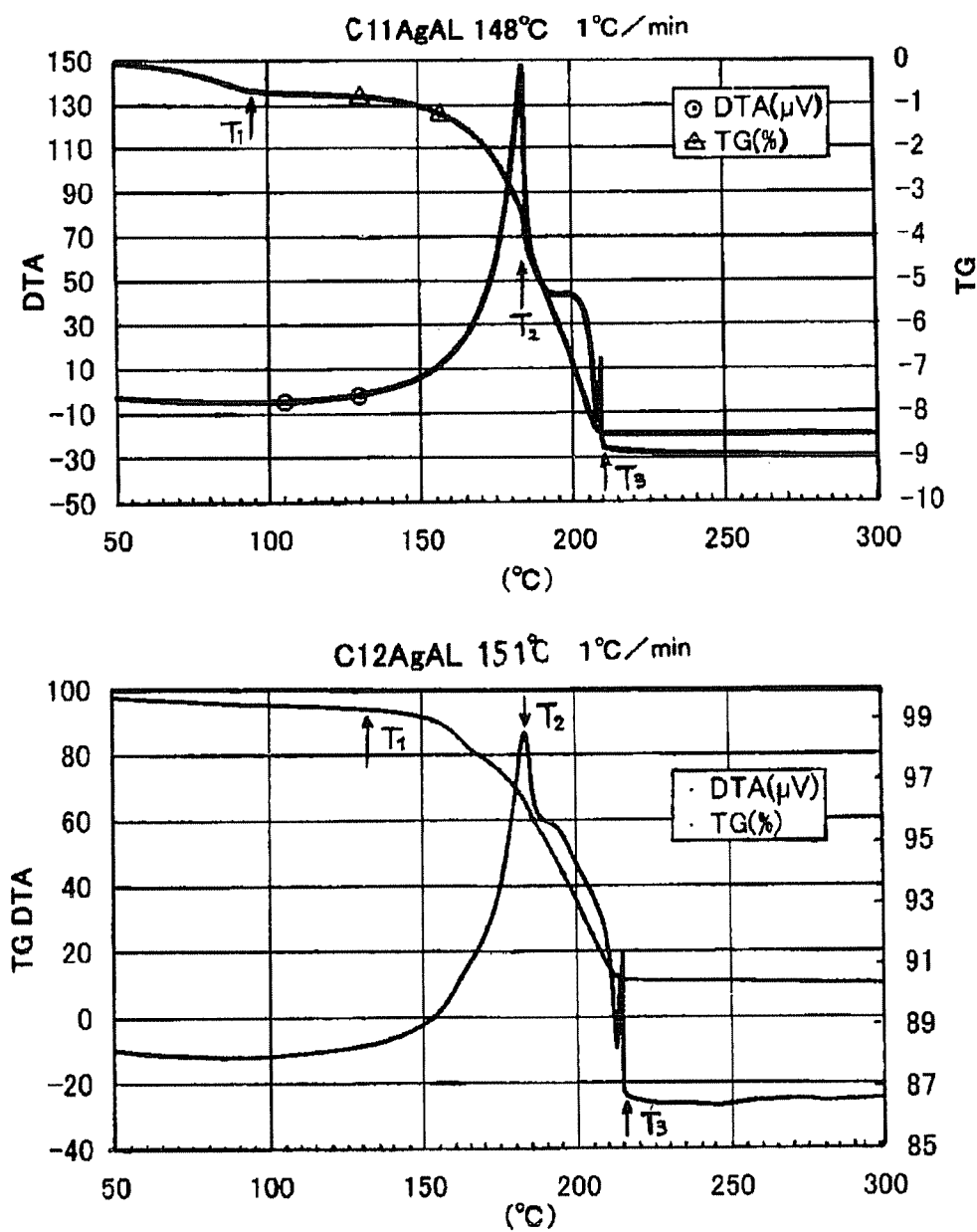
FIG. 36 is a thermal analysis diagram (temperature up rate 1° C./min) of composite silver nanoparticles C11AgAL (PT=148° C.) and C12AgAL (PT=151° C.) of another embodiment.

In C1AgAL-C3AgAL of FIG. 31 and FIG. 32, the DTA peak is the single peak, and in C4AgAL-C12AgAL of FIG. 32-FIG. 36, the DTA peak becomes the double peak. As stated above, when it is thought that the DTA first peak is the decomposition peak that the decomposition occurs rapidly and then the DTA final peak, namely the DTA second peak is the binding energy peak between the silver cores, the comprehension becomes easy. In a fact, there are the DTA first peak and the DTA second peak even in C1AgAL-C3AgAL of FIG. 31 and FIG. 32, but because they come close mutually, it is thought that it is seen as the single peak by overlap.

In DTA of C2AgAL-C12AgAL shown in FIG. 32-FIG. 36, when the temperature is higher than the decomposition start temperature T1, it is found that the organic coating layer of C6AgAL is decomposed and the heat dissipation amount increases definitely. Such a tendency is not seen in DTA of C1AgAL shown in FIG. 32 definitely, but it is thought that this does not appear clearly because of the heat dissipation due to the components aside from the composite silver nanoparticles. However, in C1AgAL-C12AgAL of FIG. 32-FIG. 36, the heat dissipation amount due to decomposition of the organic coating layer shows the peak magnitude at the decomposition temperature T2, and this agrees with TG, too. In the higher temperature side than the decomposition start temperature T1, it is found that the mass decreases by decomposition of the organic coating layer. In addition, at the metalization temperature T3 at which said DTA final peak falls down, the total amount of the organic coating layer is gasified, and it is found that the silverization is completed by the bonding between the silver cores of composite silver nanoparticles.

As shown in C4AgAL of FIG. 32, the big peak magnitude of heat dissipation amount with metalization appears at the DTA first peak temperature T2, and the depression is seen in TG, too. Furthermore, the DTA second peak and the DTA final peak appear in succession, and at the metalization temperature T3 at which this DTA final peak falls down, TG becomes the constant value. It is considered that what TG increases slowly afterwards depends upon decomposition of carbonic acid silver being the impurity. Additionally, In DTA of C4AgAL-C12AgAL shown in FIG. 32-FIG. 36, the DTA first peak temperature T2 and the metalization temperature T3 of the first peak are estimated as the characteristic temperatures.

As shown in FIG. 37, all of the decomposition temperature T2 and the metalization temperature T3 become equal to or less than 200□ in C1AgAL-C7AgAL and C9AgAL. That is to say, as a result that the thermal analysis in atmospheric air was performed for the composite silver nanoparticles of another embodiment with the temperature up rate of VT=1° C./ml, it became clear that the composite silver nanoparticles of which the metalization temperature T3 (° C.) obtained from DTA is less than or equal to 200° C. are generated. Therefore, it is possible to provide the substitute solder material preferable for metalization at the low temperature firing. In addition, in C8AgAL and C10AgAL-C12AgAL, the metalization temperature T3 is in the vicinity of 200° C. or slightly higher than 200° C., so it can be utilized as the substitute solder material. Besides, in C1AgAL-C12AgAL, the decomposition start temperature T1 is included in the range of the 100□ downward side of the decomposition temperature T2.

TABLE 15

Range 2 of Decomposition Start Temperature T1
T2 − 90 < T1 < T2

| Example No | C number | T2 − 90 (° C.) | Decomposition Start Temp. T1 (° C.) | Decomposition Temp. T2 (° C.) |
|---|---|---|---|---|
| Example 1001 | 1 | 24 | 76 | 114 |
| Example 1002 | 2 | 41 | 80 | 131 |
| Example 1003 | 3 | 37 | 94 | 127 |
| Example 1004 | 4 | 36 | 104 | 126 |
| Example 1005 | 5 | 41 | 95 | 131 |
| Example 1006 | 6 | 39 | 85 | 129 |
| Example 1007 | 7 | 47 | 70 | 137 |
| Example 1008 | 8 | 71 | 81 | 161 |
| Example 1009 | 9 | 42 | 94 | 132 |
| Example 1010 | 10 | 84 | 105 | 174 |
| Example 1011 | 11 | 93 | 95 | 183 |
| Example 1012 | 12 | 94 | 133 | 184 |

Table 15 is a relation list among the decomposition start temperature T1, the decomposition temperature T2 and T2−90 in the composite silver nanoparticles of examples 1001-1012. The T2−90 is described to judge the satisfaction of the range of T2−90≦T1≦T2. In said embodiment, it is clear numerically that said range is satisfied.

Figure 38:
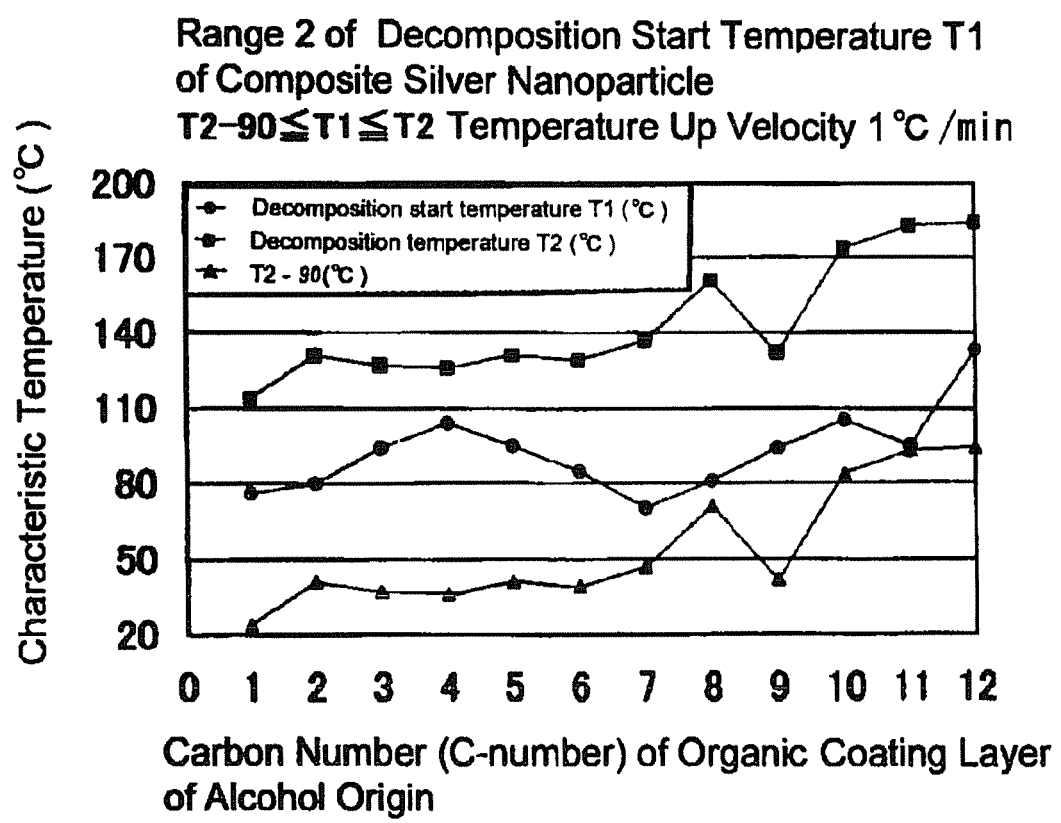
FIG. 38 is a relation diagram showing the range T2−90≦T≦T2 of decomposition start temperature T1 of composite silver nanoparticles CnAgAL (C1-C12) of another embodiment.
Figure 39:
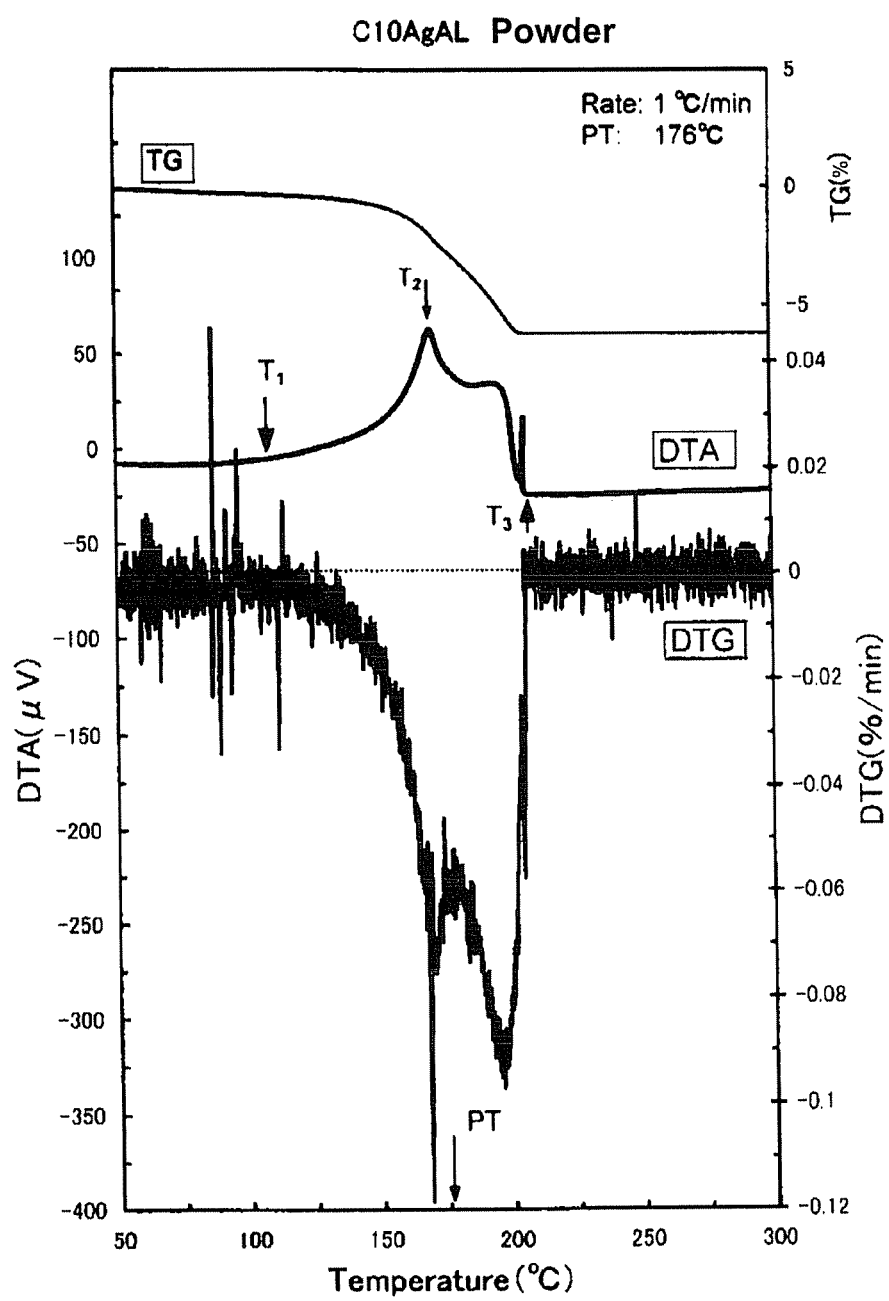
FIG. 39 is a thermal analysis diagram (temperature up rate 1° C./min) of composite silver nanoparticle C10AgAL (PT=176° C.) of other embodiment.
Figure 40:
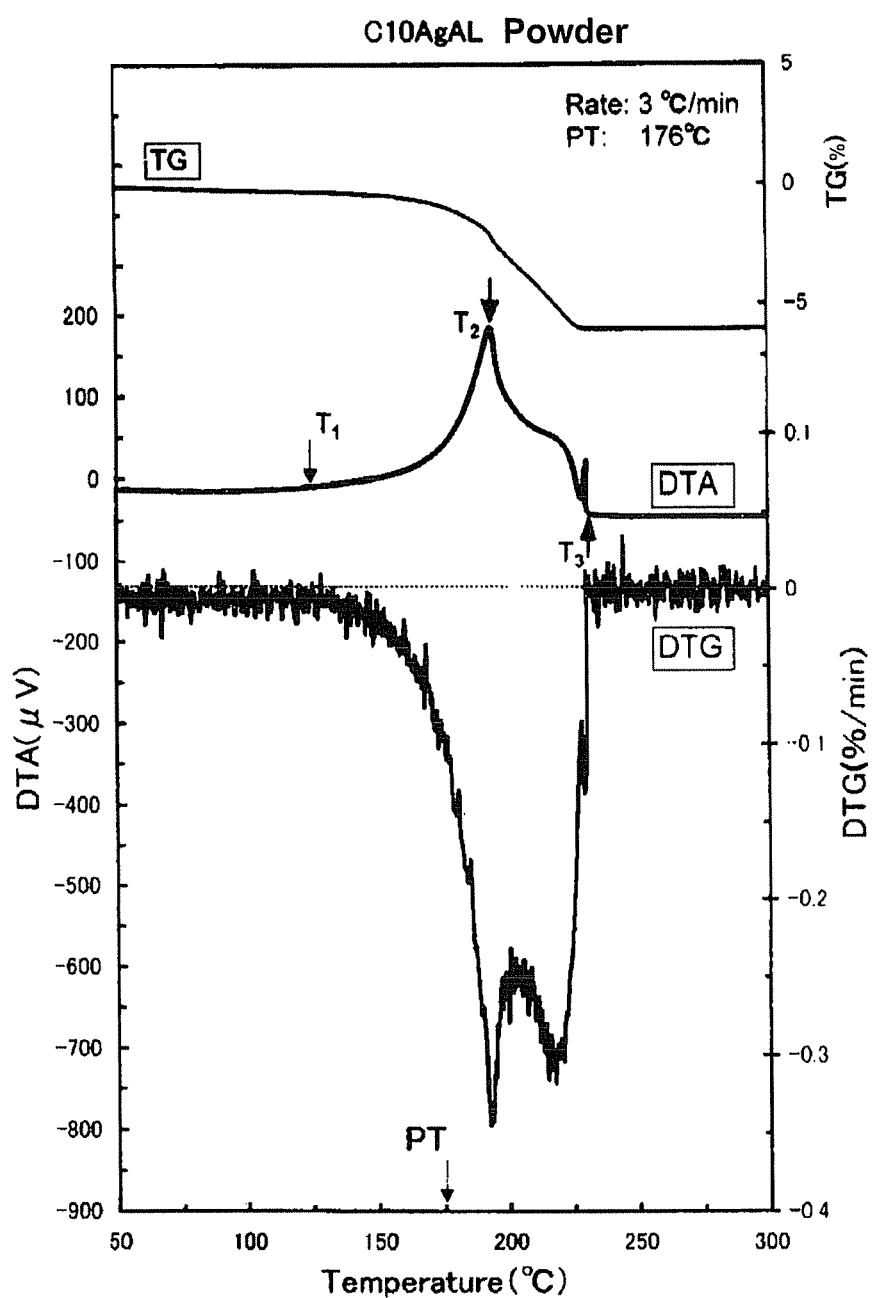
FIG. 40 is a thermal analysis diagram (temperature up rate 3° C./min) of composite silver nanoparticle C10AgAL (PT=176° C.) of other embodiment.
Figure 41:
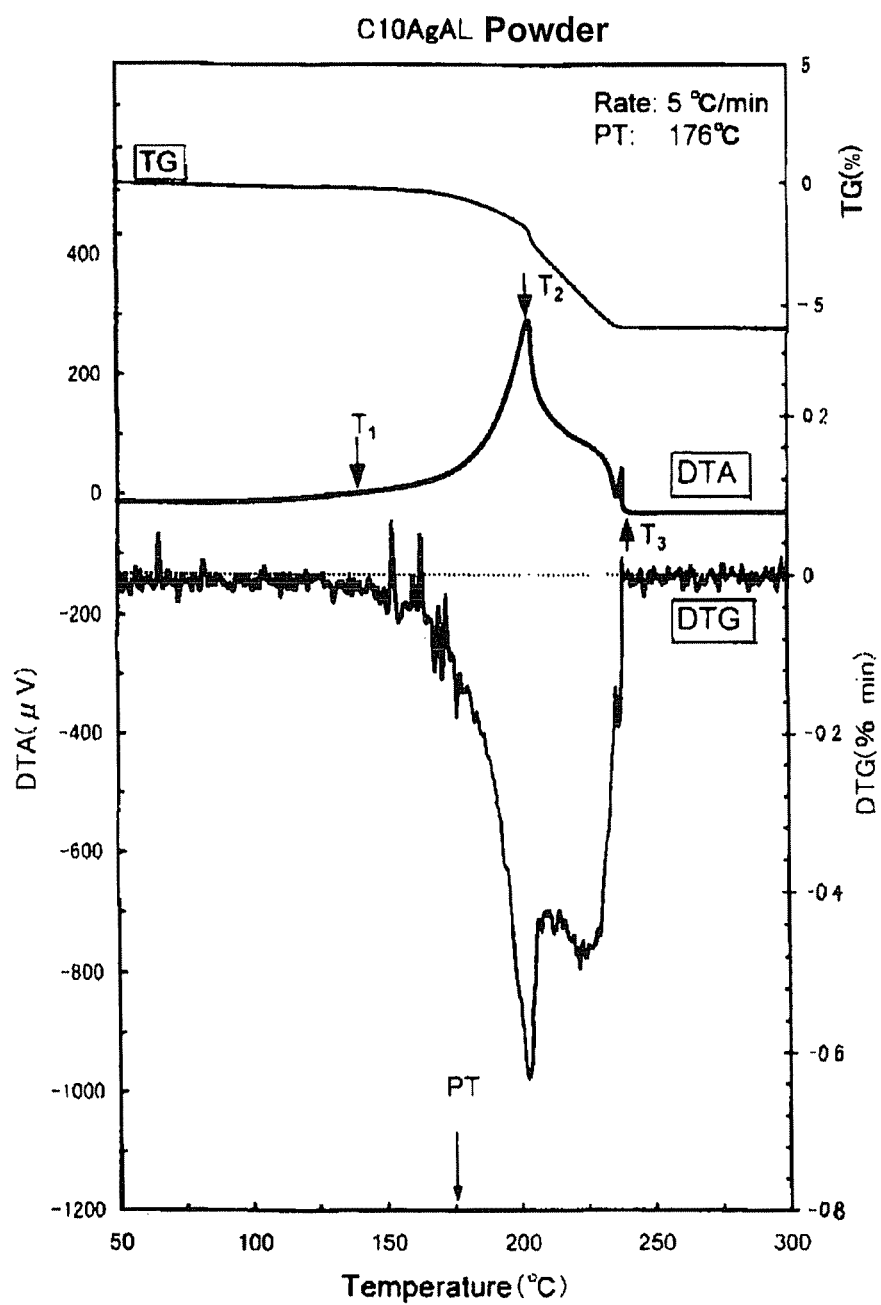
FIG. 41 is a thermal analysis diagram (temperature up rate 5° C./min) of composite silver nanoparticle C10AgAL (PT=176° C.) of other embodiment.
Figure 42:
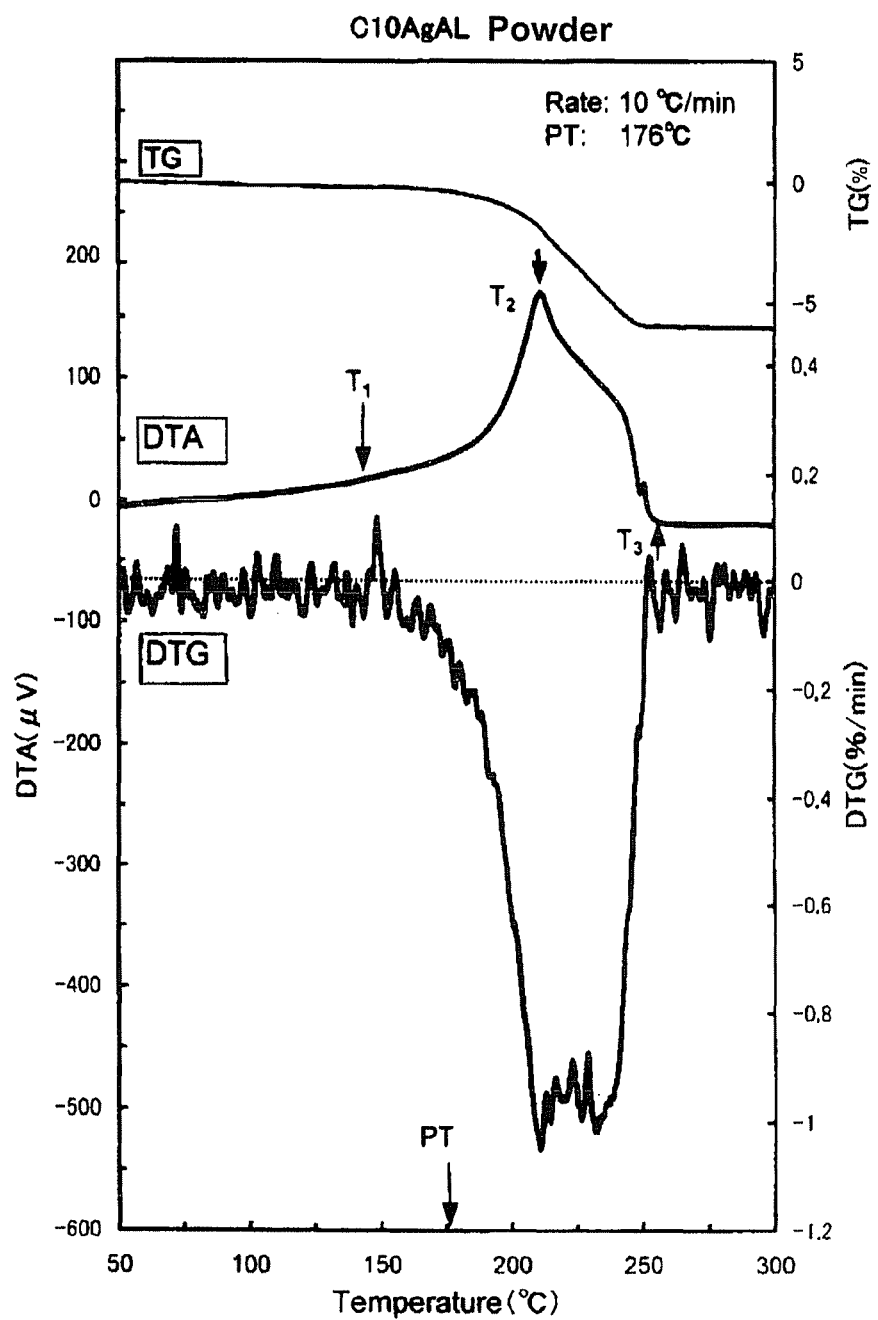
FIG. 42 is a thermal analysis diagram (temperature up rate 10° C./min) of composite silver nanoparticle C10AgAL (PT=176° C.) of other embodiment.
Figure 43:
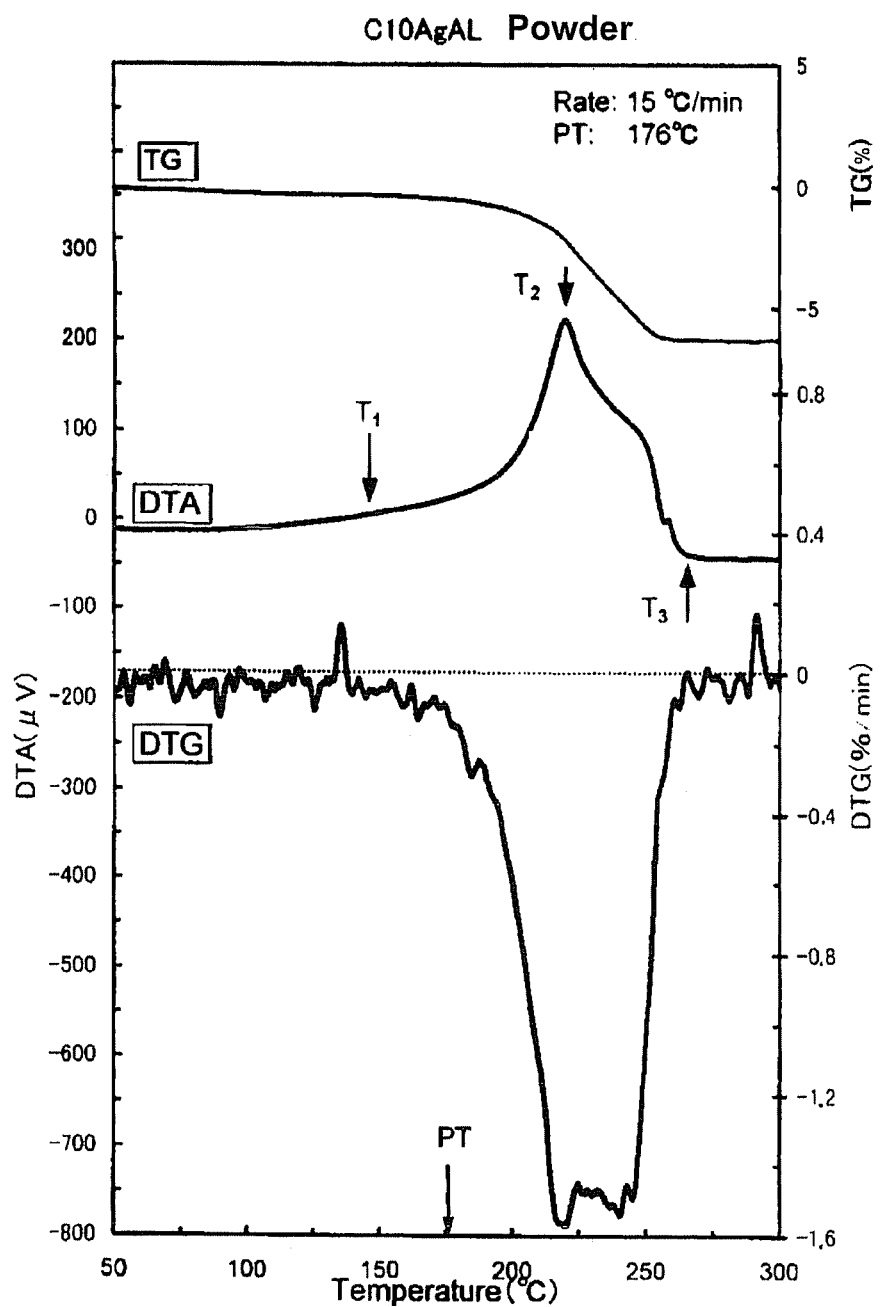
FIG. 43 is a thermal analysis diagram (temperature up rate 15° C./min) of composite silver nanoparticle C10AgAL (PT=176° C.) of other embodiment.
Figure 44:
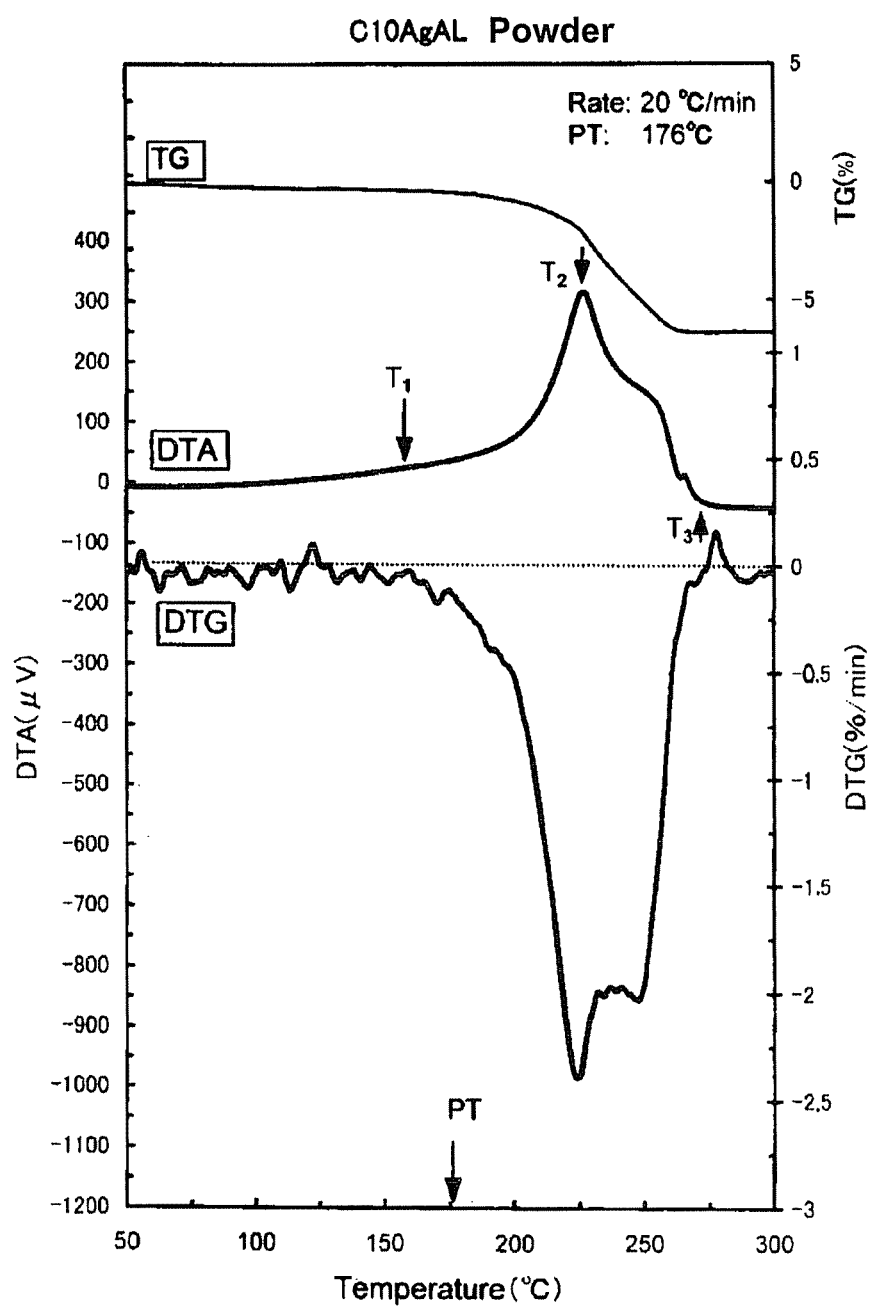
FIG. 44 is a thermal analysis diagram (temperature up rate 20° C./min) of composite silver nanoparticle C10AgAL (PT=176° C.) of other embodiment.
Figure 45:
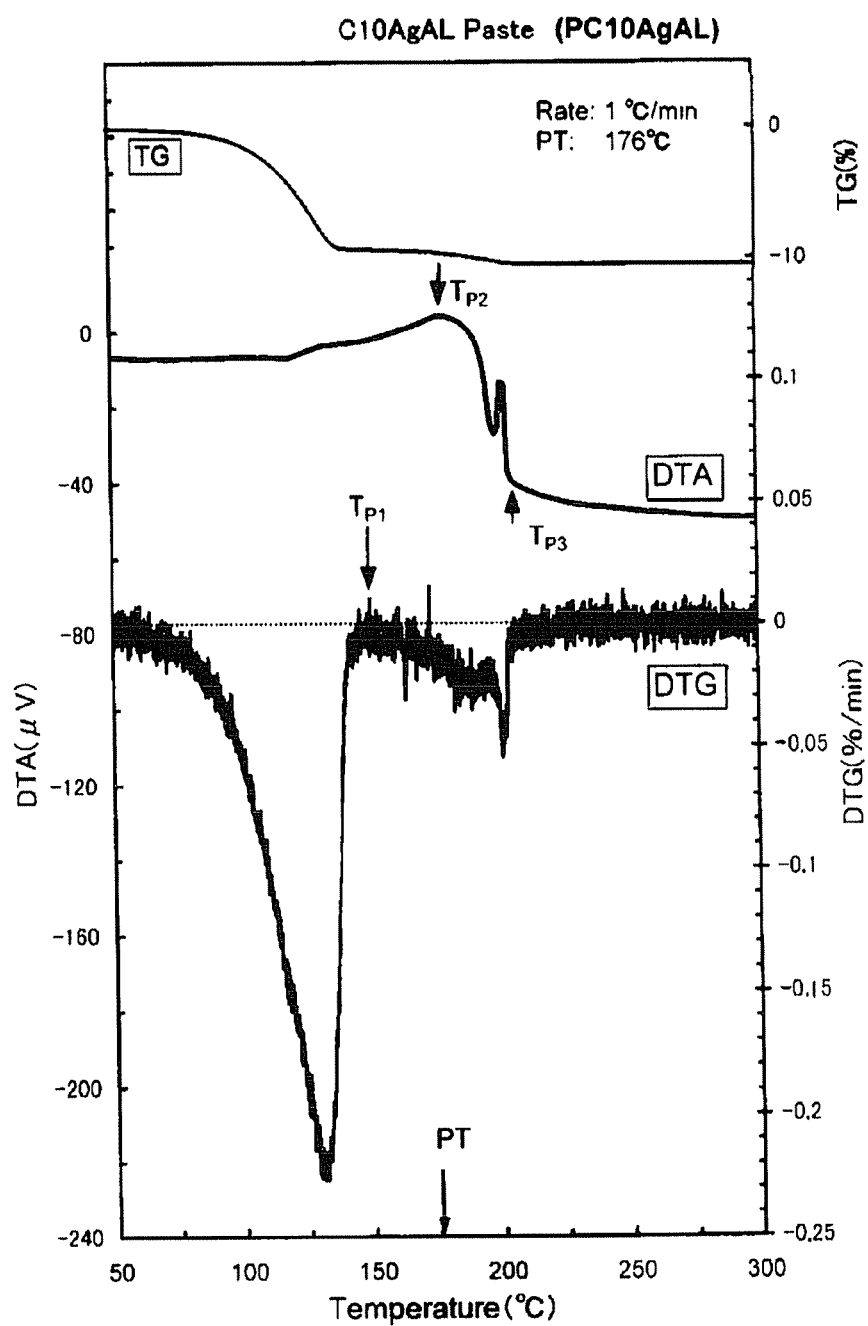
FIG. 45 is a thermal analysis diagram (temperature up rate 1° C./min) of composite silver nanopaste PC10AgAL (PT=176° C.) of other embodiment.
Figure 46:
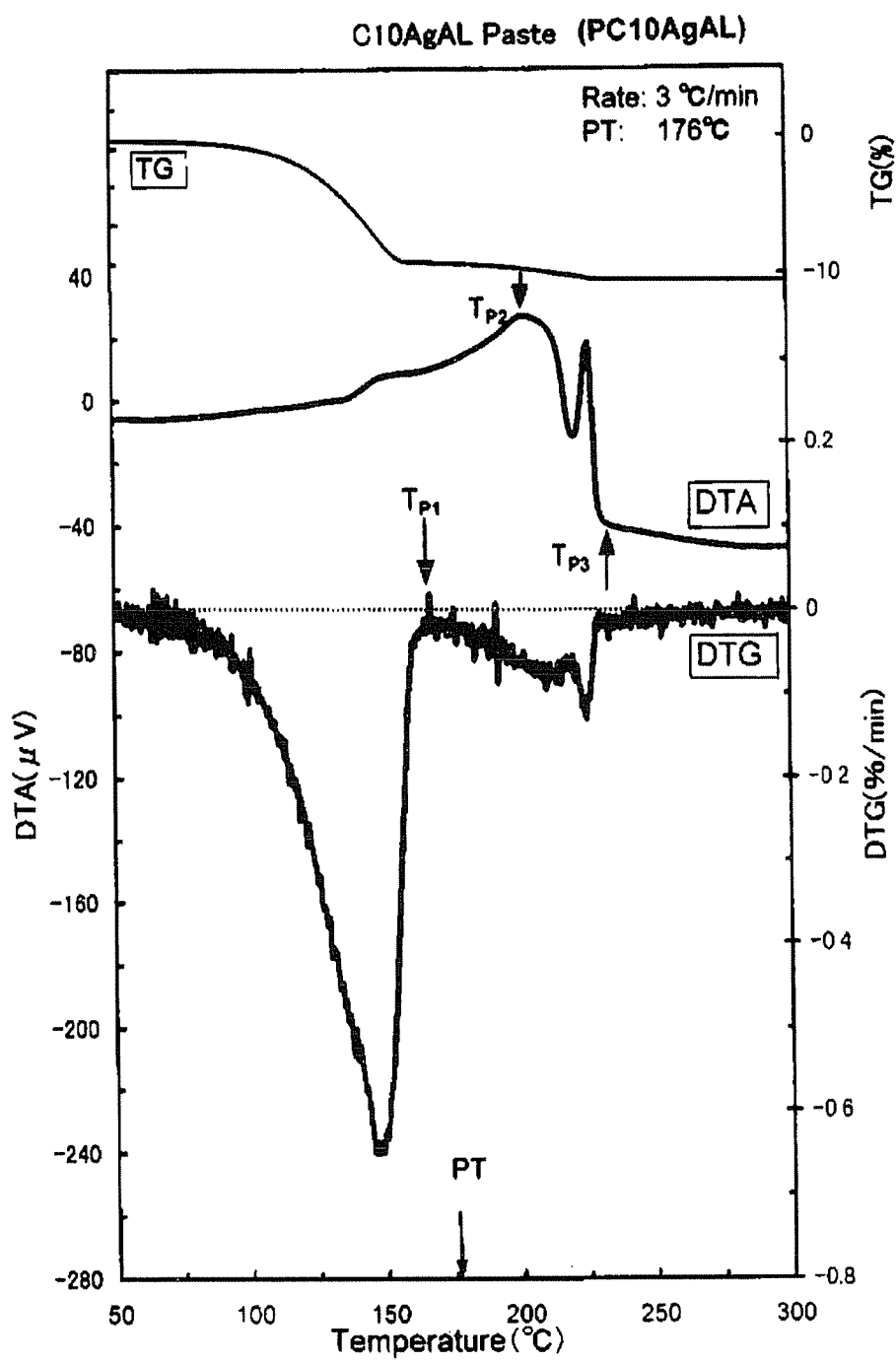
FIG. 46 is a thermal analysis diagram (temperature up rate 3° C./min) of composite silver nanopaste PC10AgAL (PP-176° C.) of other embodiment.
Figure 47:
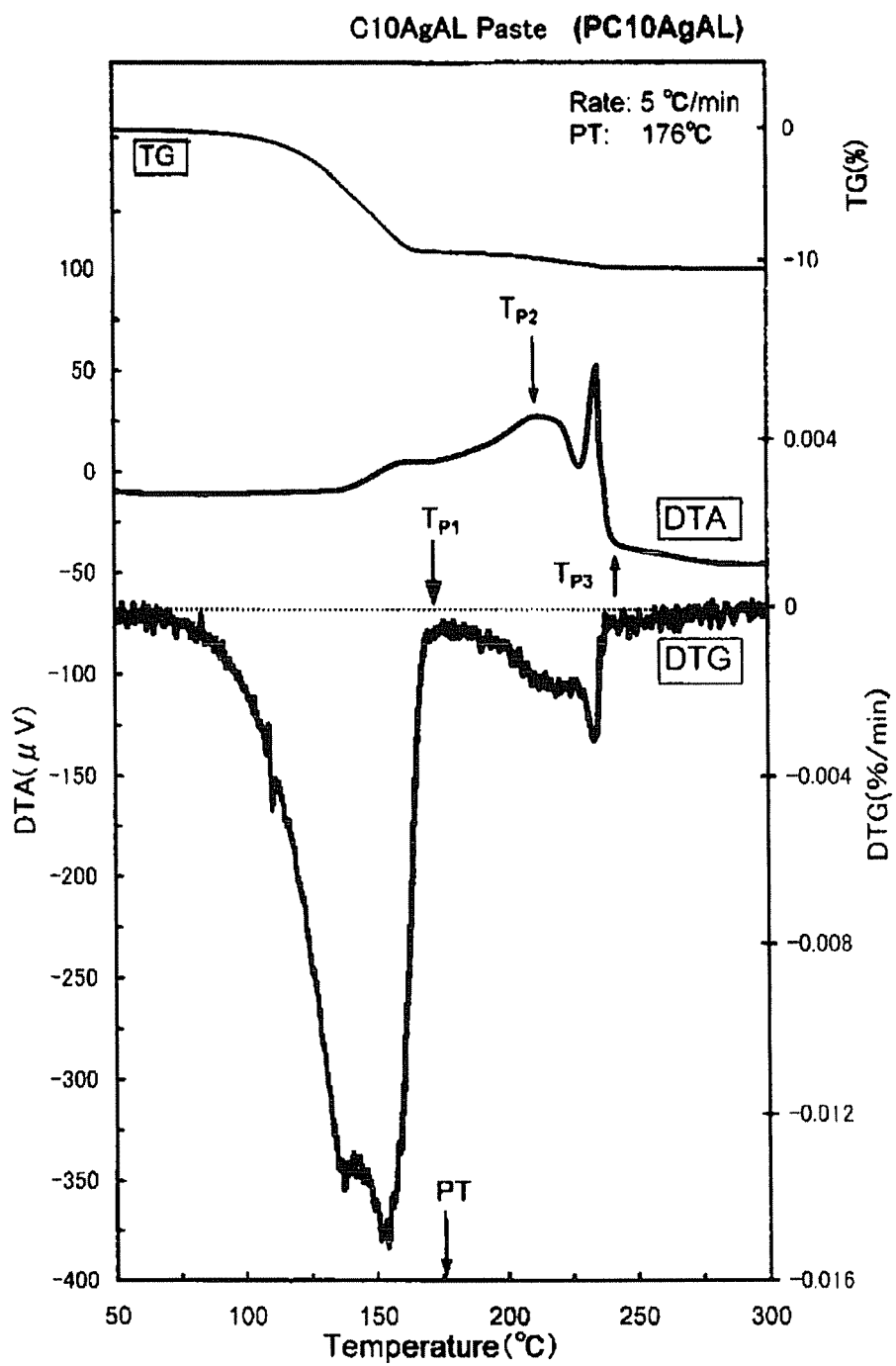
FIG. 47 is a thermal analysis diagram (temperature up rate 5° C./min) of composite silver nanopaste PC10AgAL (PT=176° C.) of other embodiment.
Figure 48:
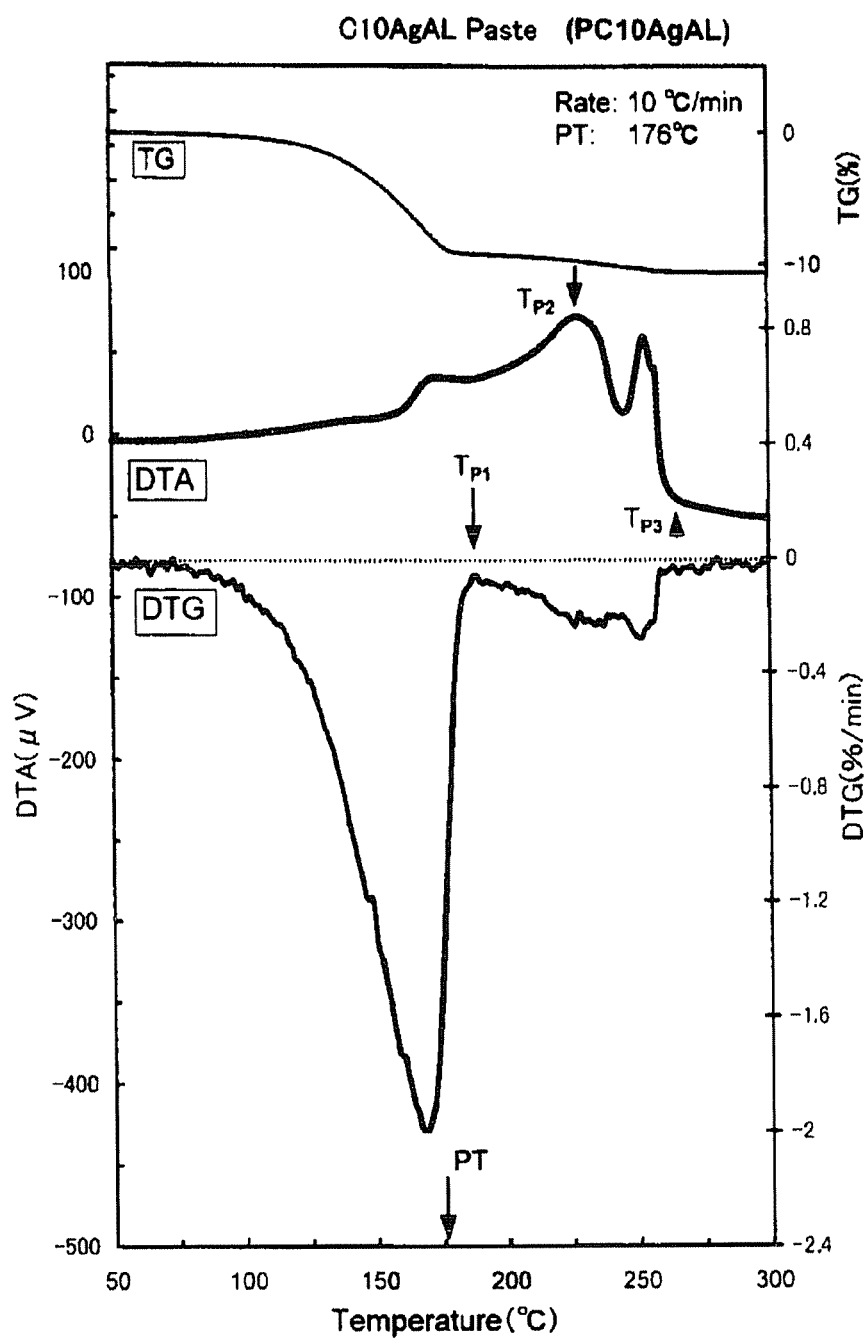
FIG. 48 is a thermal analysis diagram (temperature up rate 10° C./min) of composite silver nanopaste PC10AgAL (PT=176° C.) of other embodiment.
Figure 49:
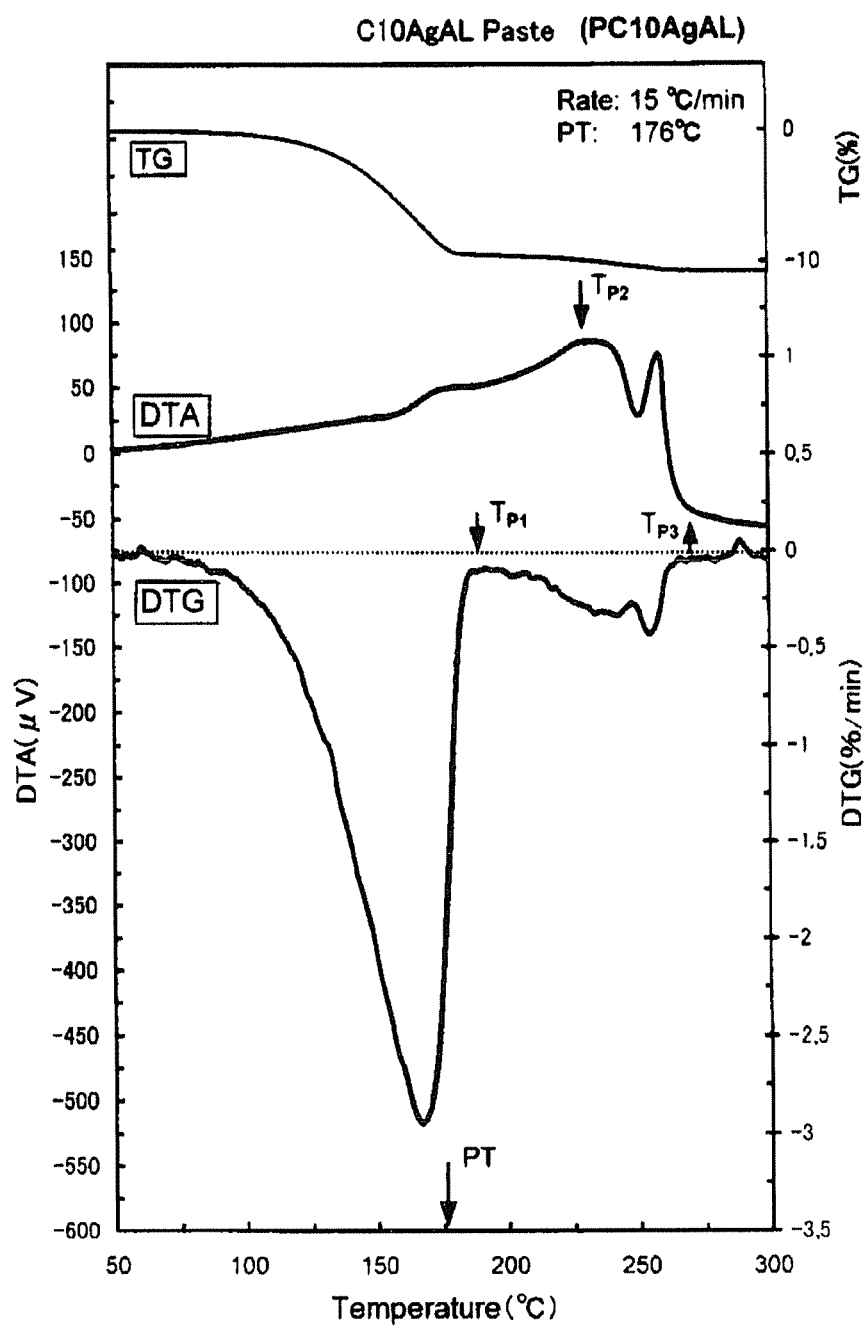
FIG. 49 is a thermal analysis diagram (temperature up rate 15° C./min) of composite silver nanopaste PC10AgAL (PT=176° C.) of other embodiment.
Figure 50:
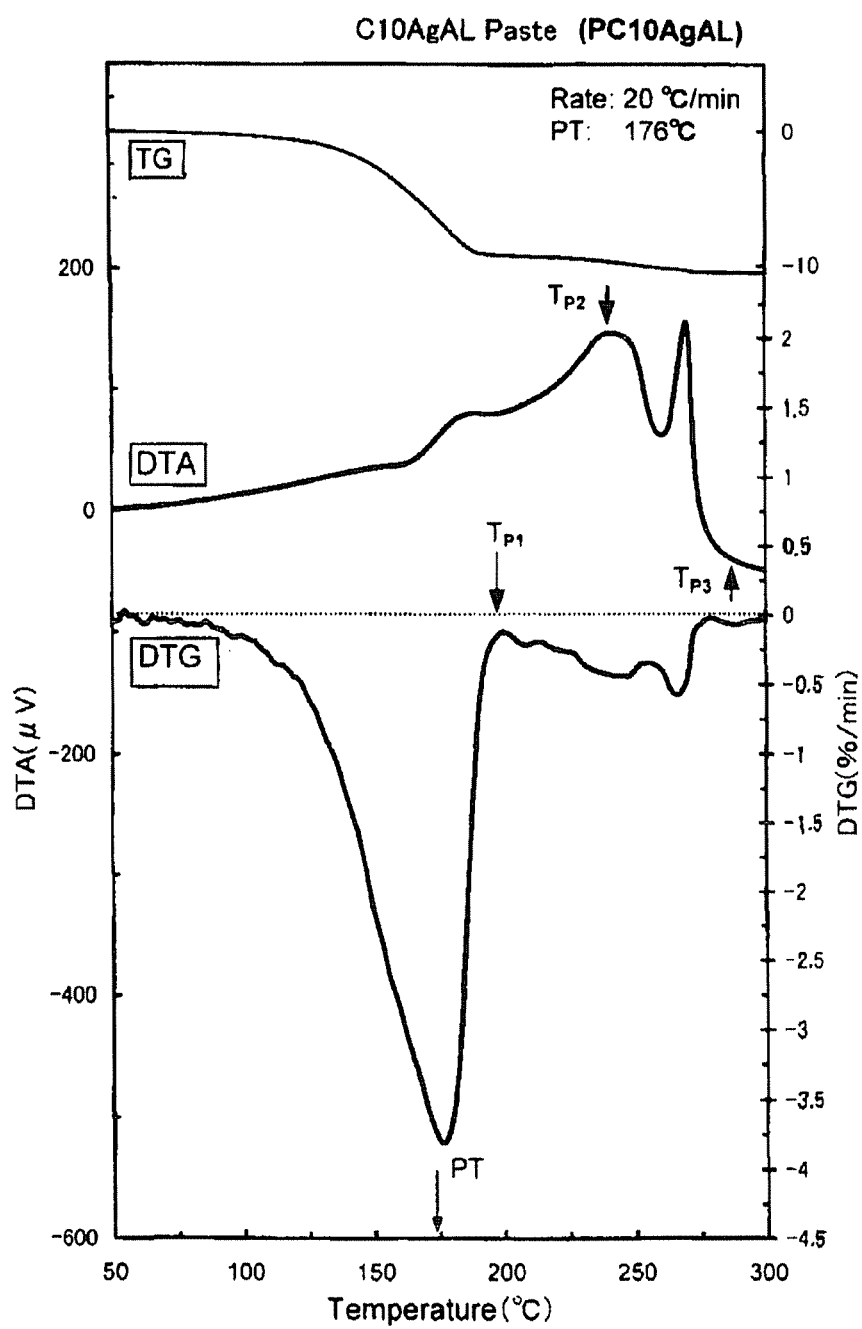
FIG. 50 is a thermal analysis diagram (temperature up rate 20° C./min) of composite silver nanopaste PC10AgAL (PT=176° C.) of other embodiment.

FIG. 38 is a diagram illustrating the data of Table 15 in which the transverse axis and the vertical axis are the C number and the characteristic temperatures, respectively. The characteristic temperatures of the present invention are the generation temperature PT, the decomposition start temperature T1, the decomposition temperature T2 and the metalization temperature T3, but T2−90 is included as the characteristic temperature in FIG. 38, too. The black quadrangle is the decomposition temperature T2, the black triangle is T2−90 and the black circle shows the decomposition start temperature T1. Because all black circles exist between the black triangle and the black quadrangle, it is demonstrated for the second embodiment that the inequality condition of T2−90≦T1≦T2 is held in C1-C12.

FIGS. 39-44 are the thermal analysis diagrams of composite silver nanoparticle C10AgAL being other example, in which the temperature up rate is varied in the range of 1-20° C./min. In FIGS. 39-44, there is plotted the differential thermogravimetry (DTG) estimated from TG along with the measurement results of DTA and TG. In FIGS. 39-44, the temperature up rates VT are set to be VT=1° C./min, 3° C./min, 5° C./min, 10° C./min, 15° C./min and 20° C./min, respectively. In FIGS. 39-44, the decomposition start temperature T1 is the TG decrease start temperature, the decomposition temperature T2 is the DTA first peak temperature, and the metalization temperature T3 is the TG decrease end temperature or the DTA final peak end temperature. From plotting of DTG, the decomposition start temperature T1 is the temperature which varies from decrease of linear TG to decrease of curved TG. This situation is understood. That is to say, in the plotting of DTG, there is shown a tendency that the TG decreasing rate becomes approximately the constant value in the lower temperature side than the decomposition start temperature T1, and the TG decreasing rate increases rapidly when it is beyond the decomposition start temperature T1. There is a little reduction of linear TG, and it is conceivable with a component by evaporation of residue included in compound silver nanoparticle powder becoming a sample of TG. Therefore, TG decrease start temperature estimating the decomposition start temperature T1 can be said to be the TG decrease start temperature of pure composite silver nanoparticles, and it can be said to be valid that the decomposition start temperature T1 is estimated from this TG decrease start temperature.

Furthermore, in DTG plotting of FIG. 39-FIG. 44, there is the dip structure that it becomes the local minimum at the position or its vicinity of the DTA first peak, the DTA second peak and the DTA final peak, and the TG decreasing rate becomes the local maximum. That the TG decreasing rate becomes the local maximum in these dip structures matches with that the heat dissipation amount accompanied with the decomposition of organic material becomes the local maximum, and the good matching is shown. Furthermore, DTG becomes approximately zero when beyond the metalization temperature T3, and it is more definitely shown that the decrease of TG finishes in accompanied with the metalization of the composite silver nanoparticles.

As described above, in FIG. 39-FIG. 44, the temperature up rate VT of composite silver nanoparticle of C10AgAL is changed in the range of 1-20, and the decomposition start temperature T1, the decomposition temperature T2 and the metalization temperature T3 in FIG. 39-FIG. 44 rise with increase of the temperature up rate VT. As the temperature up rate VT increases, the time before arriving at the predetermined temperature becomes short, so that the time integration value of heat quantity added to the composite silver nanoparticles decreases. Because this becomes the main factor, the decomposition start temperature T1, the decomposition temperature T2 and the metalization temperature T3 rise with increase of the temperature up rate VT.

FIG. 45-FIG. 50 are the thermal analysis diagrams of the composite silver nanopaste PC10AgAL (PT=176° C.) of other examples, and the temperature up rate VT is changed in the range of 1-20° C./min. In FIG. 45-FIG. 50, the differential thermogravimetry (DTG) estimated from the TG is plotted along with DTA and TG. In FIG. 45-FIG. 50, the temperature up rates VT are set to be VT=1° C./min, 3° C./min, 5° C./min, 10° C./min, 15° C./min and 20° C./min, respectively. In DTGs of FIG. 45-FIG. 50, the dip structures due to evaporation of the viscosity grant agent included in the composite silver nanopaste are seen in the lower temperature side than the paste decomposition start temperature Tp1. That is to say, because, in the composite silver nanopaste, the solvent and/or the viscosity grant agent are added with the composite silver nanoparticles, before the composite silver nanoparticles are oxidized and decomposed, the desorption and oxidizing decomposition of the solvent and/or the viscosity grant agent go ahead.

Figure 51:
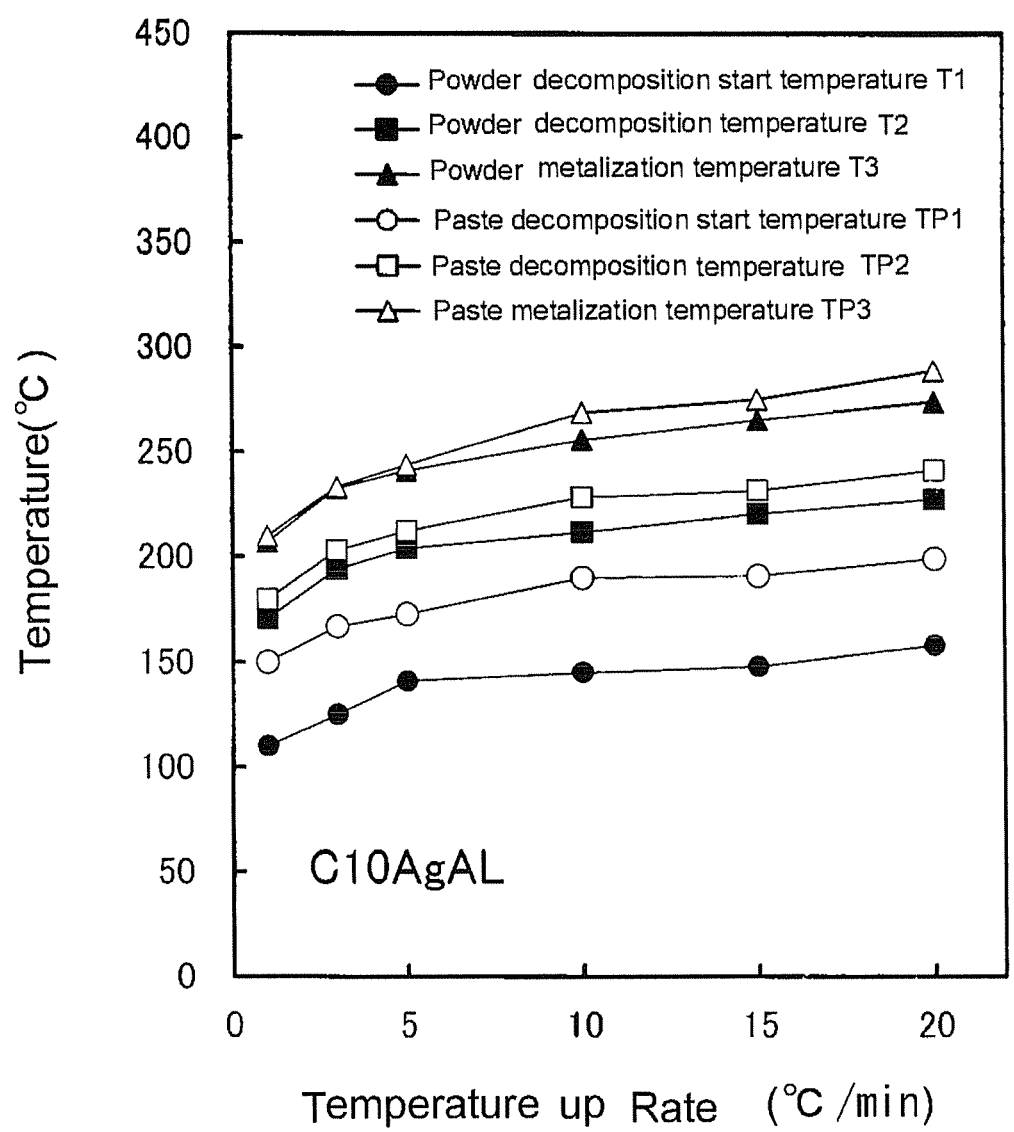
FIG. 51 is a relation diagram between characteristic temperature (T1, T2, T3, Tp1, Tp2, Tp3) and temperature up rate of CnAgAL and PCnAgAL obtained in FIG. 39-FIG. 50.

Therefore, the paste decomposition start temperature Tp1 in FIG. 45-FIG. 50 shows the temperature at which the viscosity grant agent contained in the composite silver nanopaste evaporates and the decrease of TG starts accompanied with the decomposition of said organic coating layer. In FIG. 45-FIG. 50, the plotting of DTG becomes almost zero or the value in the vicinity of zero at the paste decomposition start temperature Tp1, and it gives the second decrease start temperature of DTG. After this paste decomposition start temperature Tp1, the DTA peak appears in DTA curve, and the DTA first peak temperature appearing at first is the paste decomposition temperature Tp2 (° C.). It is considered that the steep final peak appearing at last in DTA peaks is the emission peak of the binding energy by which the remaining naked silver cores bond each other after the organic coating layer is oxidized and decomposed. The point at which this final peak falls down and breaks into the side direction is defined as the paste metalization temperature Tp3 (° C.). These paste temperatures satisfy the inequality of $Tp1 \leq Tp2 \leq Tp3$.

decomposition start temperature T1, the decomposition temperature T2 and the metalization temperature T3 of the composite silver nanoparticle powder and the decomposition start temperature Tp1, the decomposition temperature Tp2 and the metalization temperature Tp3 of the composite silver nanopaste. Furthermore, FIG. 51 is the relation diagram between the temperature up rate and the characteristic temperatures (T1, T2, T3, Tp1, Tp2, Tp3) shown in Table 16 of CnAgAL and PCnAgAL obtained from FIG. 39-FIG. 50. As shown in Table 16 and FIG. 51, when the temperature up rate VT varies only in the range of 1-20 (° C./min), there is seen the tendency that the paste decomposition start temperature Tp1 increases by approximately 50° C., the paste decomposition temperature Tp2 increases by approximately 65° C. and the paste metalization temperature Tp3 increases by approximately 80° C. Therefore, when Tp1, Tp2 and Tp3 are measured while raising the temperature with VT=1 (° C./min) and 20 (° C./min) for the composite silver nanopaste, it is considered that said Tp1, Tp2 and Tp3 increase by about 50° C., about 65° C. and about 80° C., respectively. However, it is needless to say that these temperature increments depend upon the carbon number of the organic coating layer and it is considered that it also depends upon the size of silver core to some extent.

FIG. 52 is the magnitude relation diagram of characteristic temperatures (T1, T2, T3, Tp1, Tp2, Tp3) of CnAgAL and PCnAgAL obtained from FIG. 51. When the thermal analyses in atmospheric air are performed for the composite silver nanoparticles (noted with CnAgAL and n=1-12) and the composite silver nanopastes (noted with PCnAgAL and n=1-12) with the temperature up rate VT=1-20 (° C./min), the relation of $T1(VT) \leq Tp1(VT) \leq T1(VT)+100$ is held between the powder decomposition start temperature T1 and the paste decomposition start temperature Tp1, from FIG. 50. Furthermore, when summarizing the relation between the powder decomposition temperature T2 and the paste decomposition temperature Tp2 and the relation between the powder metalization temperature T3 (° C.) and the paste metalization temperature Tp3 (° C.), it was found that the inequalities of (P1)-(P3) shown in FIG. 52 are approximately satisfied in the range of the temperature up rate VT=1-20 (° C./min). By means of these inequalities, when the characteristic temperatures T1, T2 and T3 of the composite silver nanoparticle are measured, it became possible to estimate the characteristic temperatures Tp1, Tp2 and Tp3 of the composite silver nanopaste.

TABLE 16

Temperature Up Rate Dependency in Thermal Analysis of C10AgAl Powder

| Temperature Up Rate [° C./min] | Powder Decomposition Start Temperature $T_1$[° C.] | Paste Decomposition Start Temperature $T_{P1}$[° C.] | Powder Decomposition Temperature $T_2$[° C.] | Paste Decomposition Temperature $T_{P2}$[° C.] | Powder Metalization Temperature $T_3$[° C.] | Paste Metalization Temperature $T_{P3}$[° C.] |
|---|---|---|---|---|---|---|
| 1 | 110 | 150 | 171 | 180 | 207 | 210 |
| 3 | 125 | 167 | 194 | 203 | 233 | 233 |
| 5 | 141 | 173 | 204 | 212 | 241 | 244 |
| 10 | 145 | 190 | 212 | 228 | 256 | 269 |
| 15 | 148 | 191 | 221 | 232 | 265 | 275 |
| 20 | 158 | 199 | 227 | 241 | 274 | 289 |

In Table 16, there are described the characteristic temperatures estimated from FIG. 39-FIG. 50 composed of the Even if it says, there is not that the present invention includes example, a design change to transform in various ways in the limit that does not deviate from technical idea of the present invention rather than a thing limited to the embodiment and deformation example in the technical scope.

INDUSTRIAL APPLICABILITY

According to the present invention, there is provided the composite silver nanoparticles that the DTA peak temperature T2 is equal to or less than 200° C., the organic coating layer is composed of one or more members selected from alcohol residue, alcohol derivative and alcohol molecule, and the size of silver core is 1-20 nm. In addition, the TG decrease start temperature T1 of said composite silver nanoparticle exists in the range of T2−90≦T1≦T2. It is possible to generate said composite silver nanoparticles by lowering the generation temperature less than 160° C., more preferably less than 140° C., and the DTA peak temperature T2, the TG decrease start temperature T1 and the generation temperature PT have the relation linking mutually. Because the metalization temperature T3 is higher by several degrees than DTA peak temperature T2 and the DTA peak temperature T2 is equal to or less than 200° C., the metalization temperature T3 becomes equal to or less than about 200° C., too. Therefore, by generating the composite silver nanoparticles at low temperature, the metalization is achieved in equal to or less than about 200° C. Because the melting point of conventional Pb—Sn solder is 183° C., the composite silver nanoparticles of the present invention can be used as the substitute solder of lead-free and it can be utilized as the silver film formation material. Since the generation temperature is equal to or less than 160° C., the cost of manufacturing apparatus and manufacturing facility can be largely reduced, too. Therefore, the composite silver nanoparticles of the present invention can be applied to various applications in electron materials such as printed wiring•electroconductivity material, magnetic materials such as magnetic recording media•electromagnetic wave absorber•electromagnetic wave resonator, structural materials such as far infrared material•composite film formation material, ceramics-metallic materials such as sintering aids•coating material, and medical care materials. Furthermore, according to the present invention, the cheap production method and the production apparatus of the composite silver nanoparticles can be provided.

The invention claimed is:

1. A production method of composite silver nanoparticle comprising the steps of:
    arranging at least an alcohol solvent selected from alcohols with a carbon number of 1 to 12 composed of methanol, ethanol, propanol, buthanol, pentanol, hexanol, heptanol, octhanol, nonanol, decanol, undecanol and dodecanol,
    preparing an alcohol solution by mixing a silver salt into said alcohol solvent, added more excessively than the mol number of said silver salt so as to become an excess alcohol solution,
    heating said excess alcohol solution in a reaction chamber at a generation temperature PT generating an aldehyde for a generation time,
    forming a silver core through reducing of said silver salt by said alcohol solvent and/or said aldehyde, and
    forming a composite silver nanoparticle having an organic coating layer originated from said alcohol solvent around said silver core.

2. The production method of composite silver nanoparticle according to claim 1, wherein said silver salt is dispersed or dissolved in said alcohol solvent.

3. The production method of composite silver nanoparticle according to claim 1, wherein a metalization temperature T3(° C.) obtained from differential thermal analysis (DTA) is equal to or less than 200(° C.) when a thermal analysis in atmosphere is performed for said composite silver nanoparticle with a temperature up rate VT=1(° C./min).

4. The production method of composite silver nanoparticle according to claim 3, wherein said generation temperature PT(t) is less than said metalization temperature T3(° C.).

5. The production method of composite silver nanoparticle according to claim 1, wherein the generation reaction is stopped by cooling of said alcohol solution after said generation time.

6. The production method of composite silver nanoparticle according to claim 1, wherein said silver salt is micronized till the particle diameter reaches a range of 10 nm to 1000 nm.

7. The production method of composite silver nanoparticle according to claim 1, wherein a mole ratio of said alcohol solvent to said silver salt is arranged in a range of 5 to 100 in said excess alcohol solution.

* * * * *